United States Patent
Nishijima et al.

(10) Patent No.: US 7,394,755 B2
(45) Date of Patent: Jul. 1, 2008

(54) SEMI-FIXED CIRCUIT

(75) Inventors: Seiichi Nishijima, Kawasaki (JP);
Katsuhiro Yoda, Kawasaki (JP);
Daisuke Fujita, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 807 days.

(21) Appl. No.: 10/859,534

(22) Filed: Jun. 3, 2004

(65) Prior Publication Data

US 2005/0094804 A1    May 5, 2005

(30) Foreign Application Priority Data

Sep. 22, 2003 (JP) .............................. 2003-330313

(51) Int. Cl.
*H04J 13/00* (2006.01)
(52) U.S. Cl. ................ 370/210; 370/254; 375/341; 375/354; 455/418
(58) Field of Classification Search ................ 370/210, 370/254; 455/418; 375/341, 354
See application file for complete search history.

(56) References Cited

U.S. PATENT DOCUMENTS 4,117,541 A * 9/1978 Ali .............................. 708/320
6,687,315 B2 * 2/2004 Keevill et al. ............... 375/341

FOREIGN PATENT DOCUMENTS

| JP | 63067628 A | 3/1988 |
| JP | 63204919 A | 8/1988 |
| JP | 04292018 A | 10/1992 |

* cited by examiner

*Primary Examiner*—Blane Jackson
(74) *Attorney, Agent, or Firm*—Arent Fox LLP.

(57) ABSTRACT

A semi-fixed circuit has a plurality of flip flops connectable in series, a first selector and a second selector, and is capable of operations of a plurality of kinds of scrambler and the like. The first selector selects any one of an exclusive OR signal of an input signal and a first feedback signal, the first feedback signal and the input signal, and outputting the result to a first flip flop. The second selector is capable of selecting an exclusive OR signal of an output signal of a second flip flop and a second feedback signal, an output signal of the second flip flop and the second feedback signal, and outputting the result to the first selector as the first feedback signal.

3 Claims, 40 Drawing Sheets

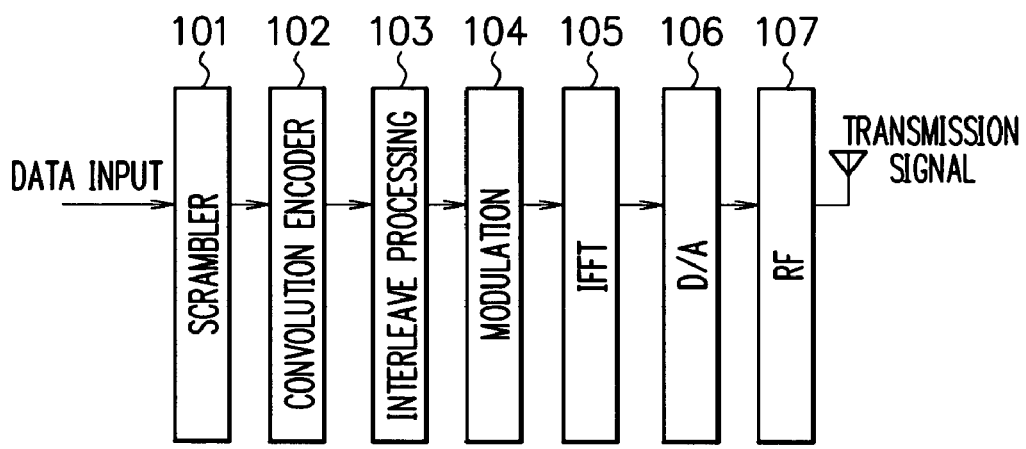
F I G. 1A
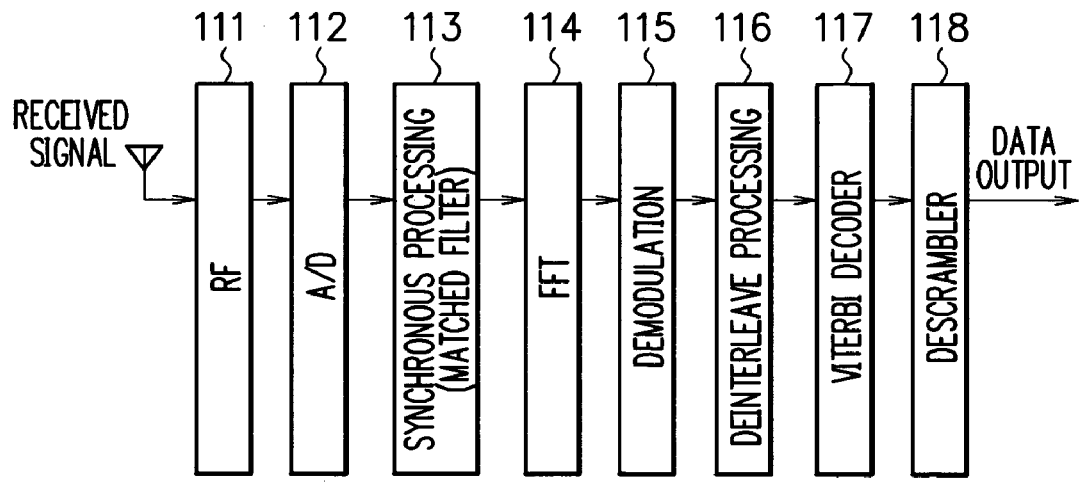
F I G. 1B

F I G. 7
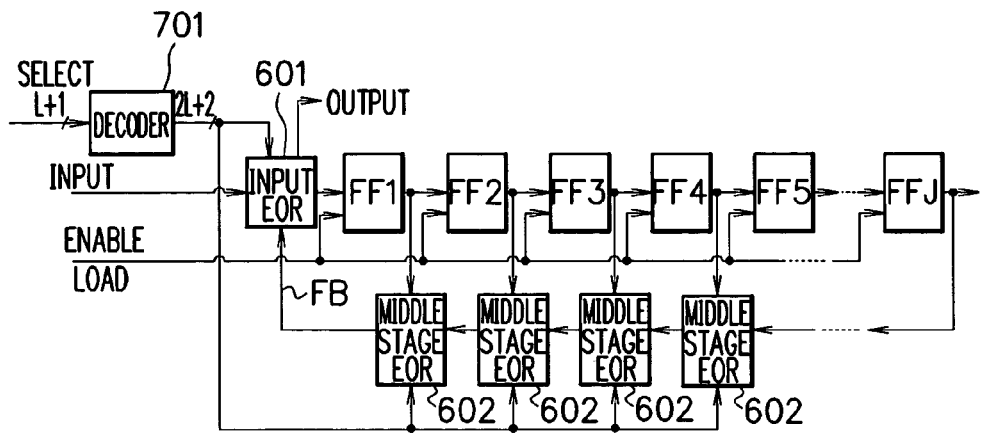
F I G. 8
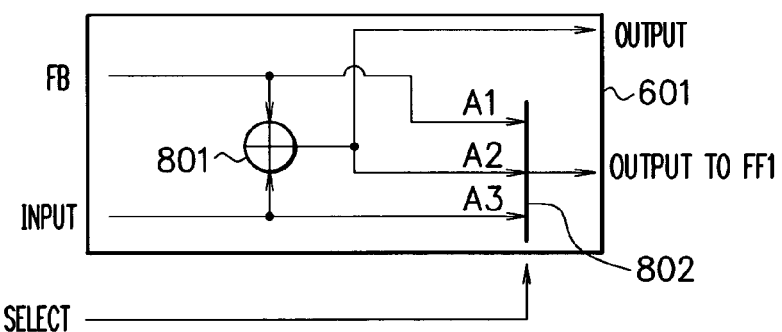
F I G. 9
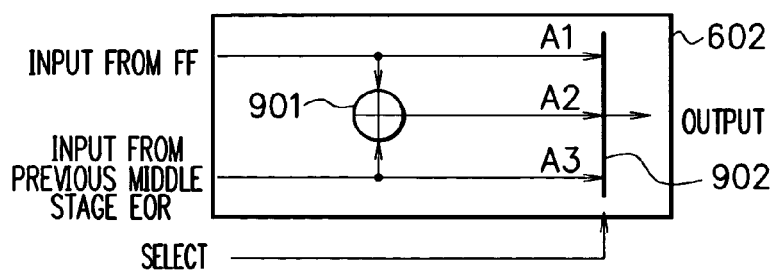

F I G. 10
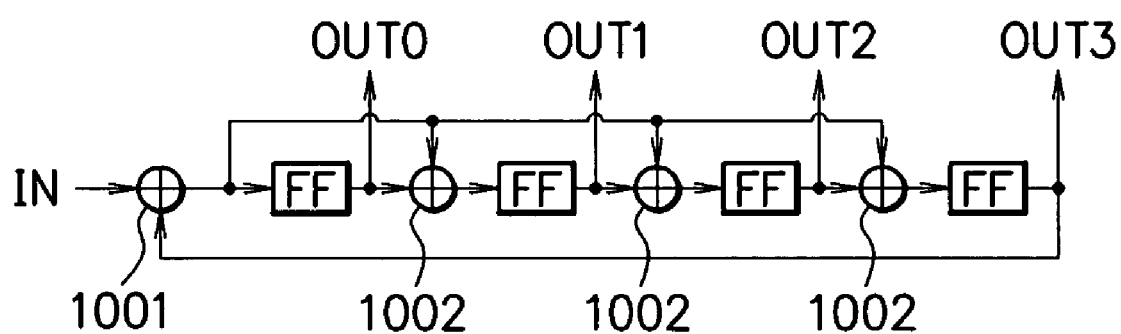

F I G. 12
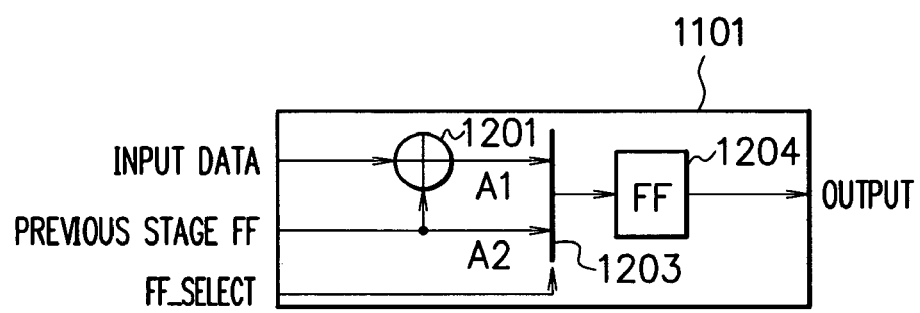
F I G. 13
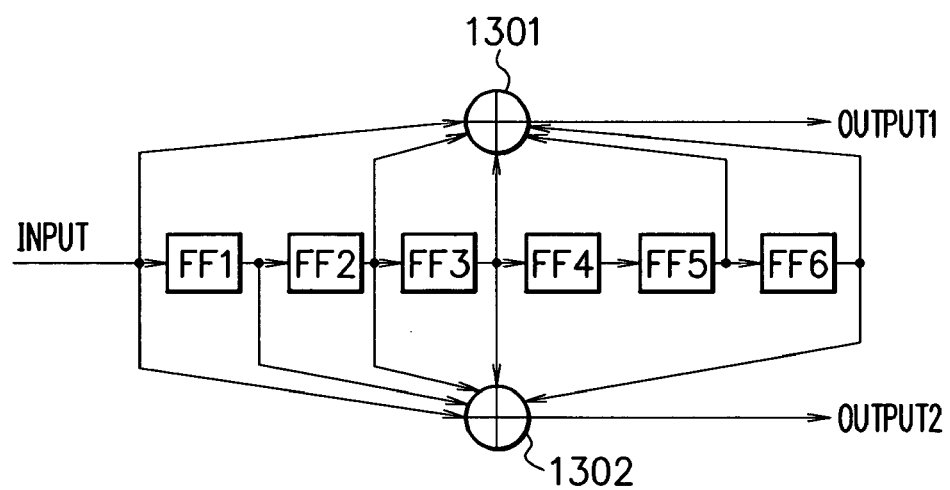

F I G. 15
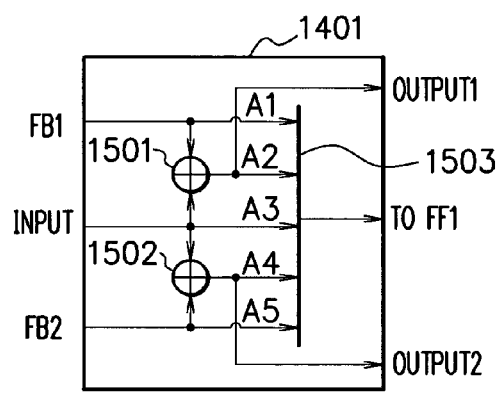
F I G. 16
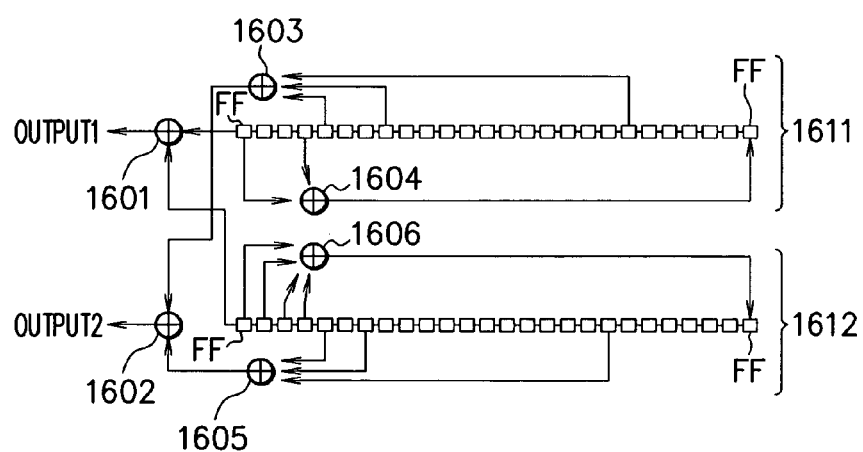

F I G. 18
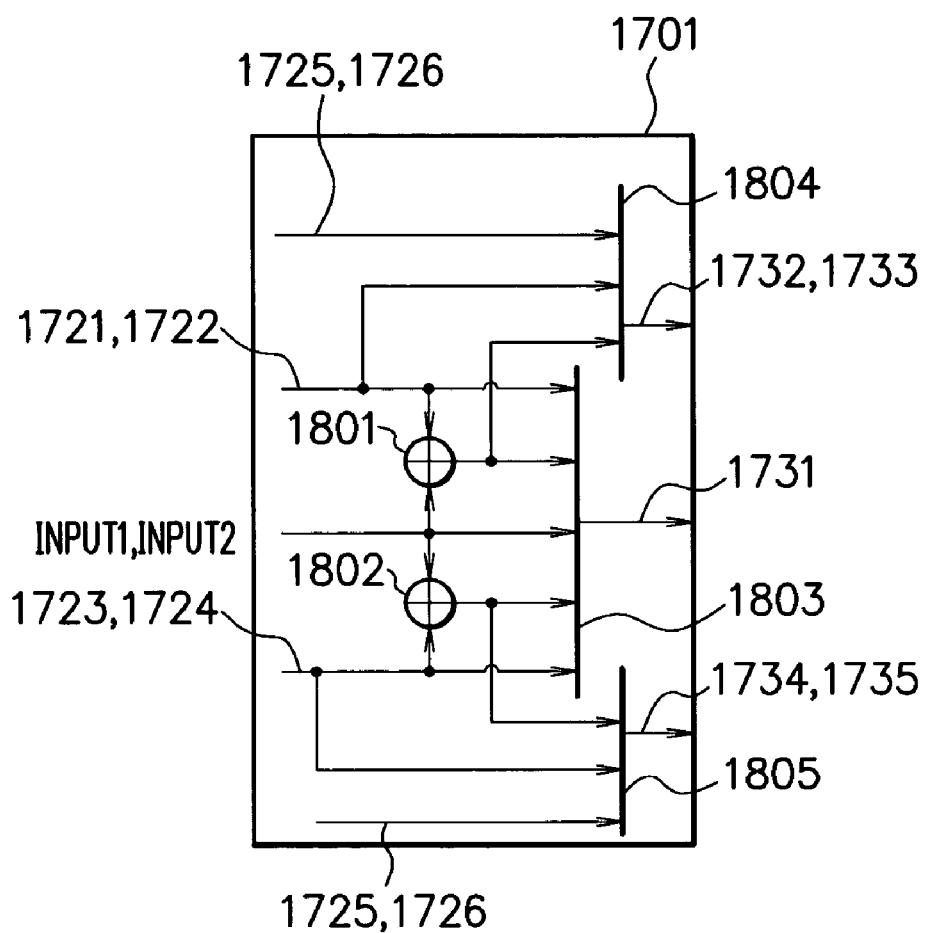

F I G. 20A
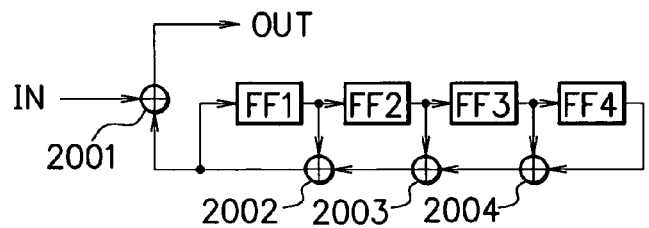
F I G. 20B
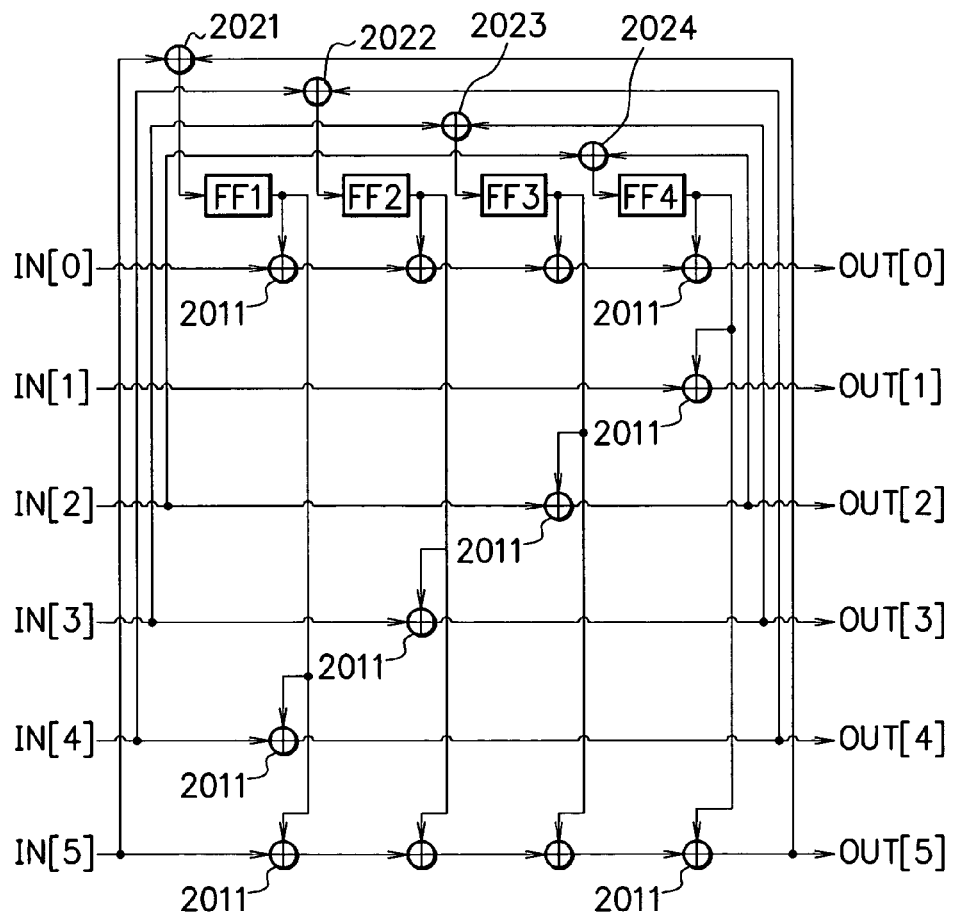

F I G. 22A
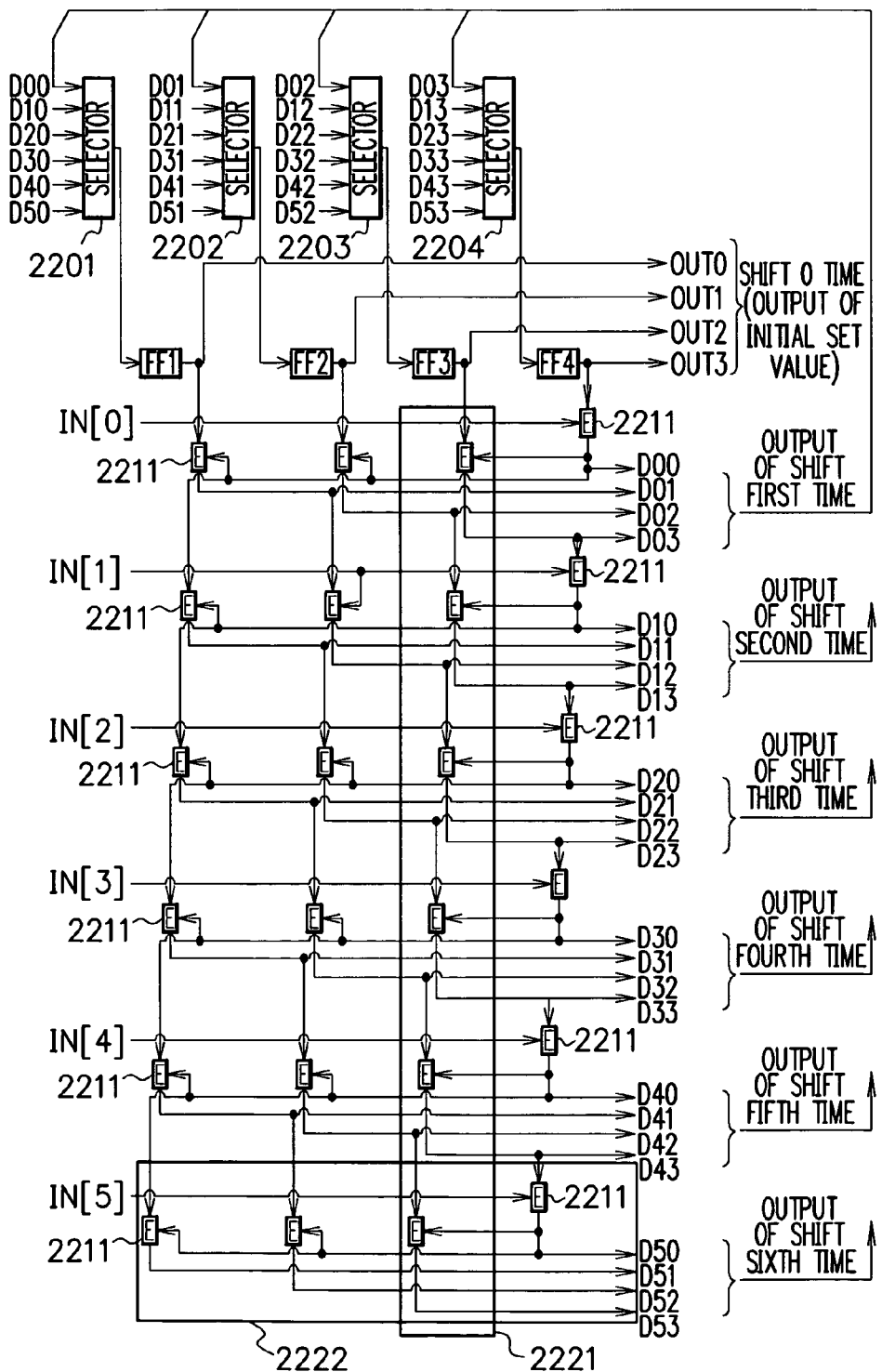

F I G. 33
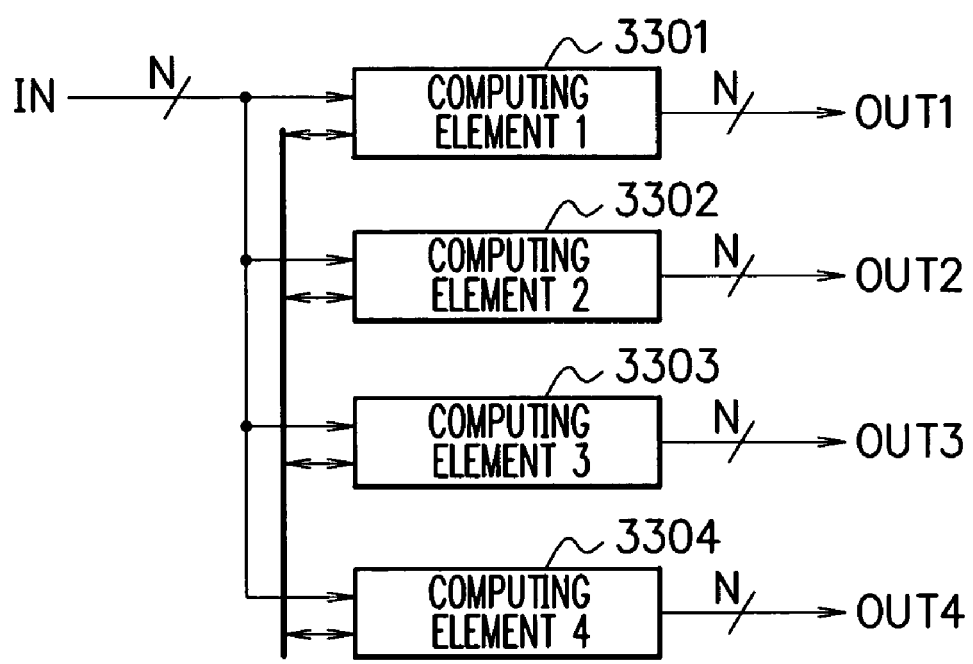

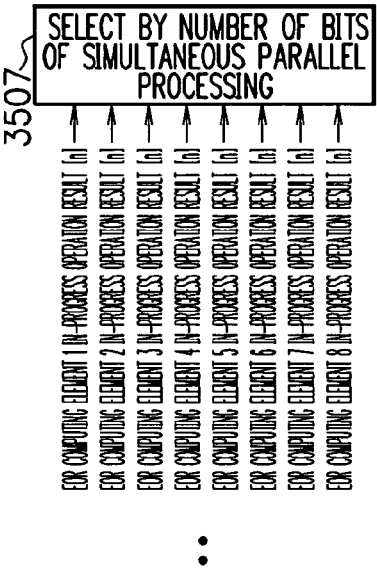
FIG. 36A
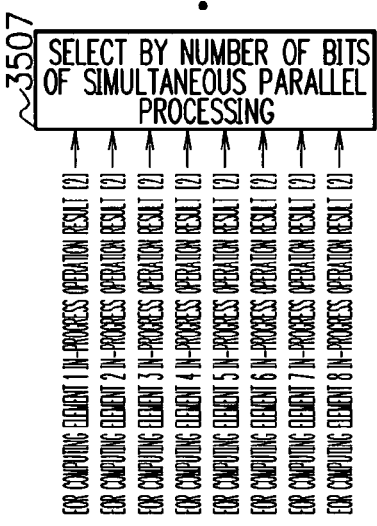
FIG. 36B
FIG. 36C
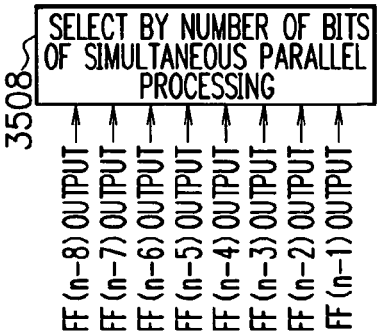
FIG. 36D
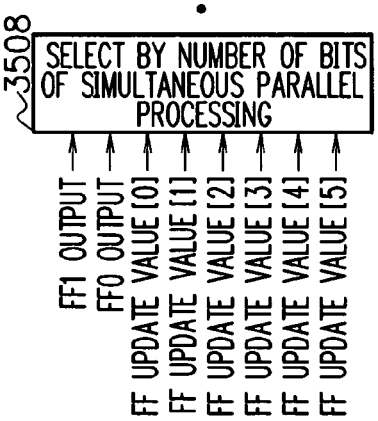
FIG. 36E
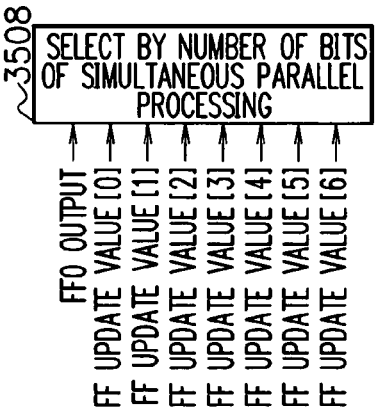
FIG. 36F F I G. 40
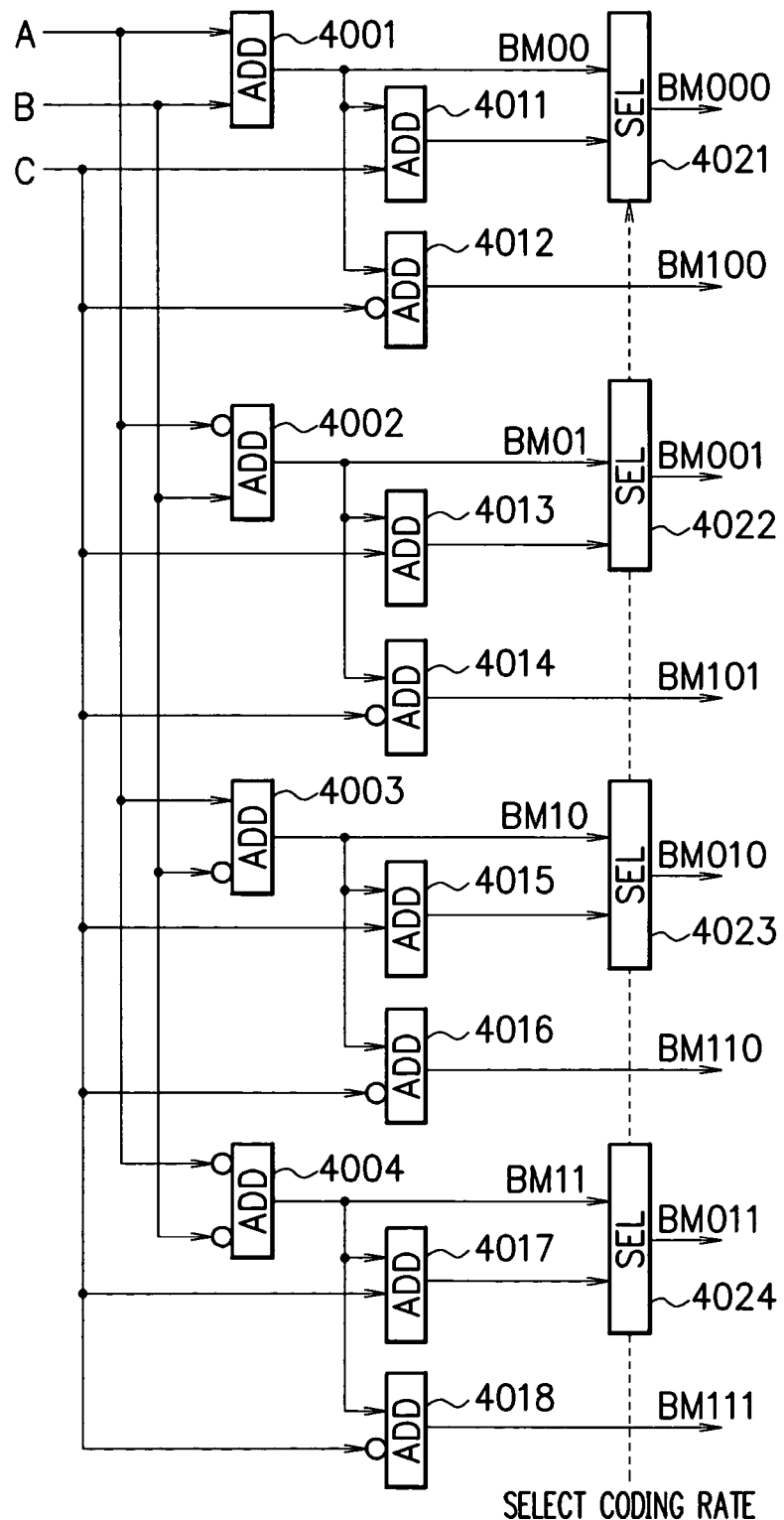

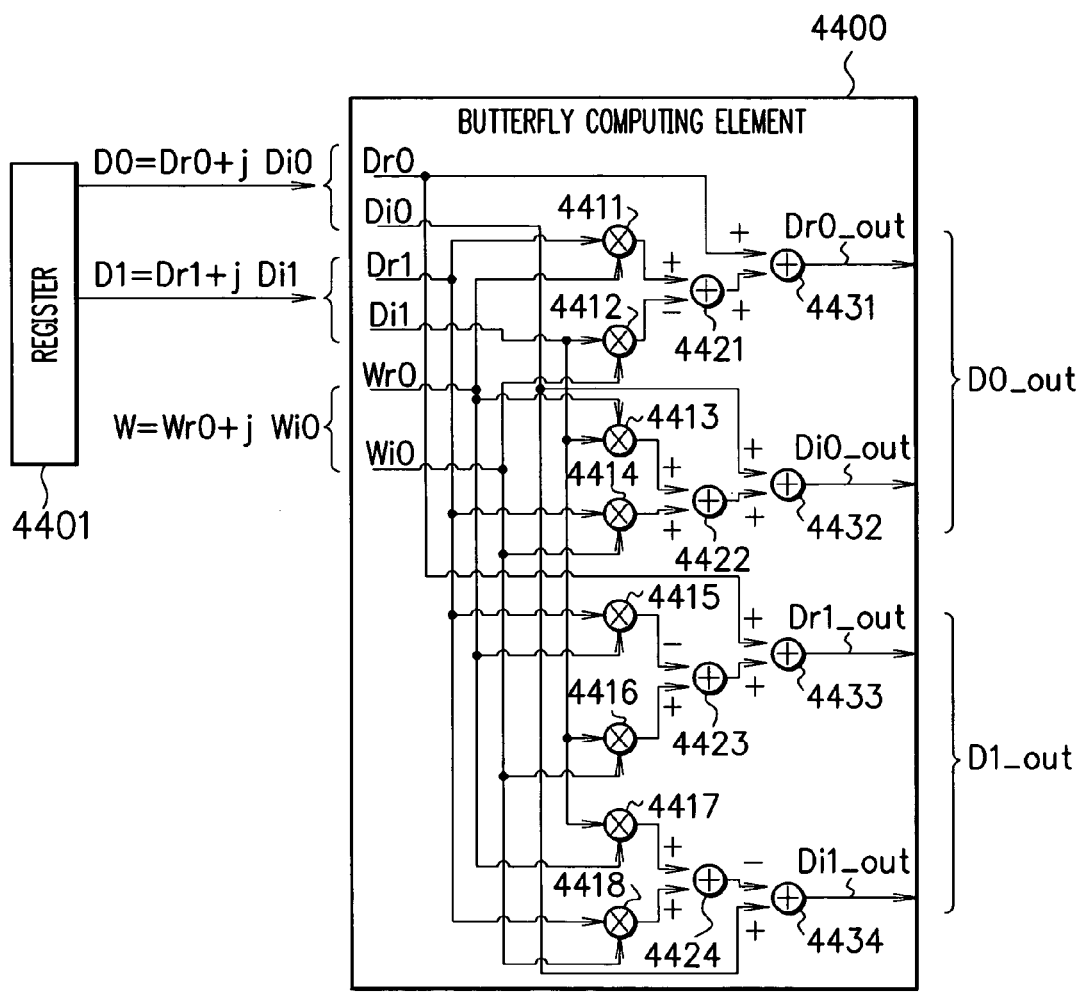
F I G. 44

F I G. 45
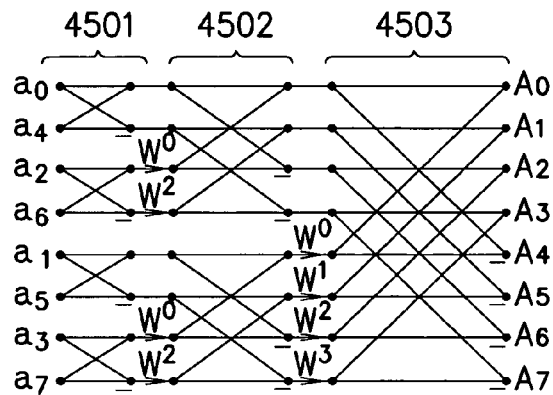
F I G. 46
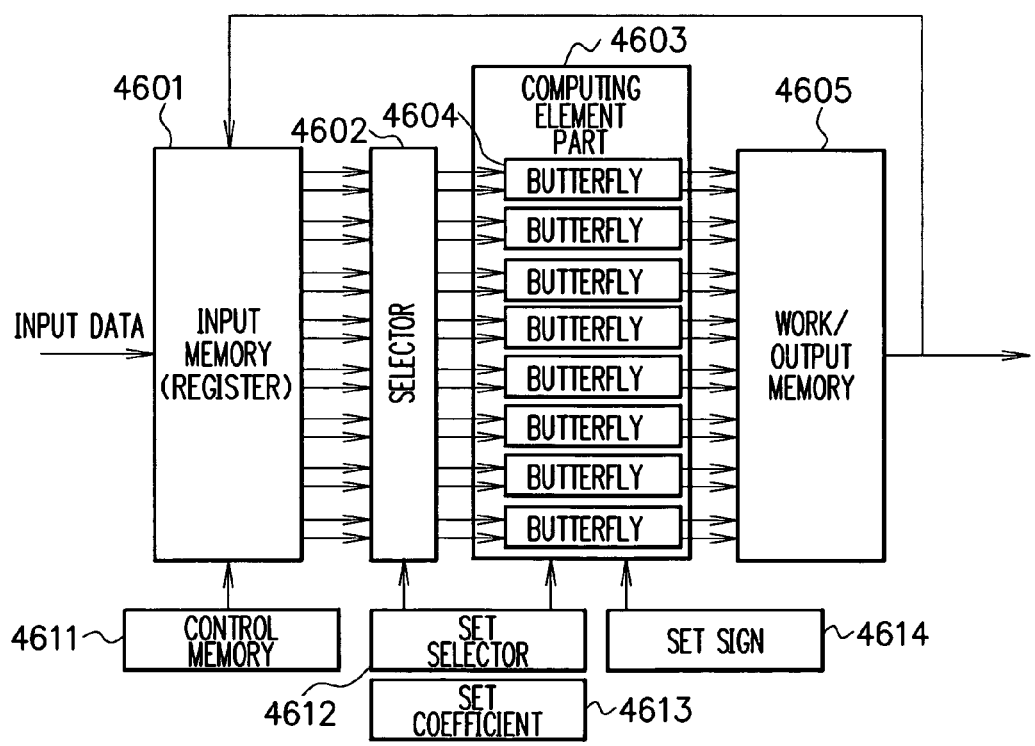

F I G. 47
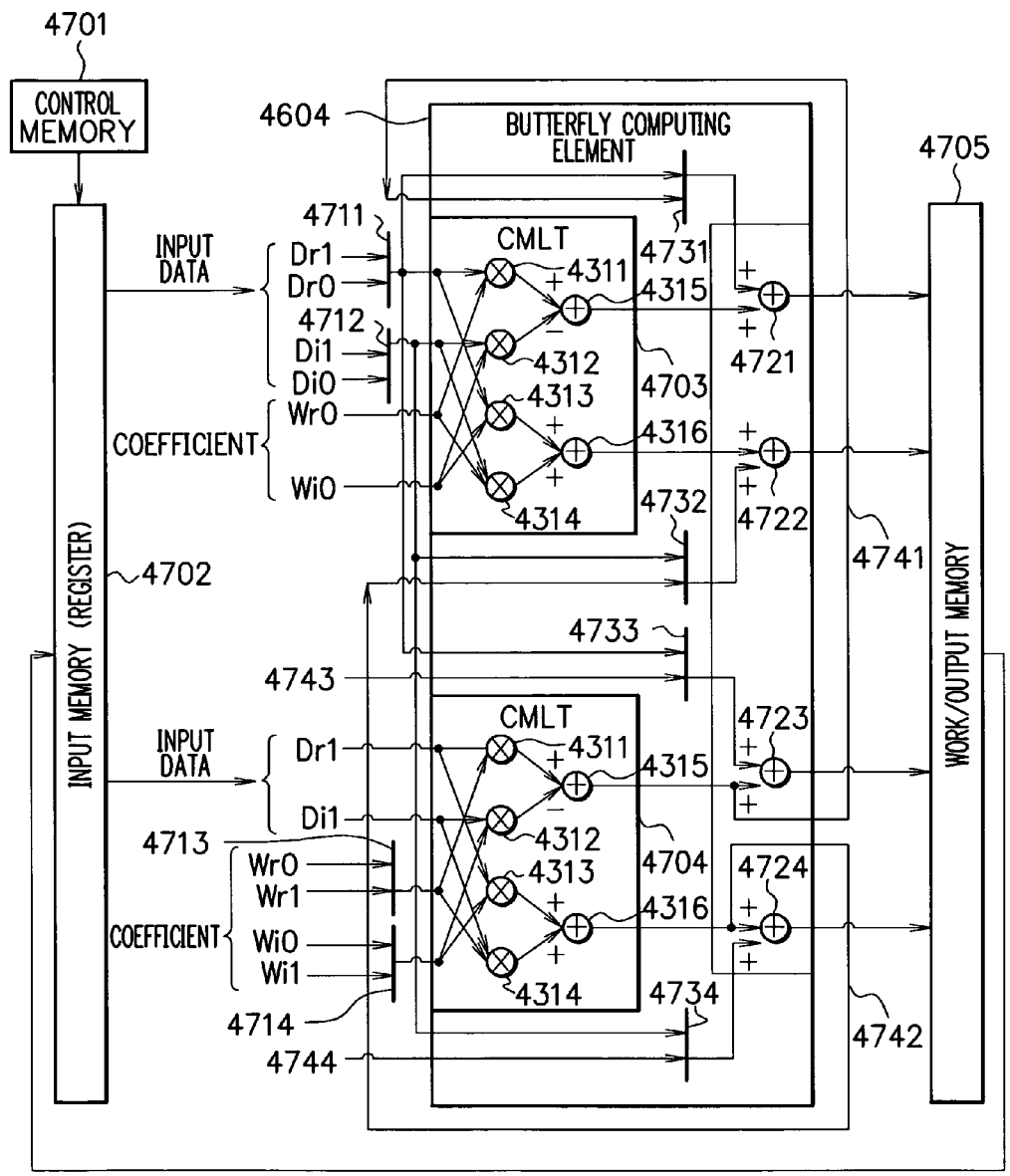

F I G. 49
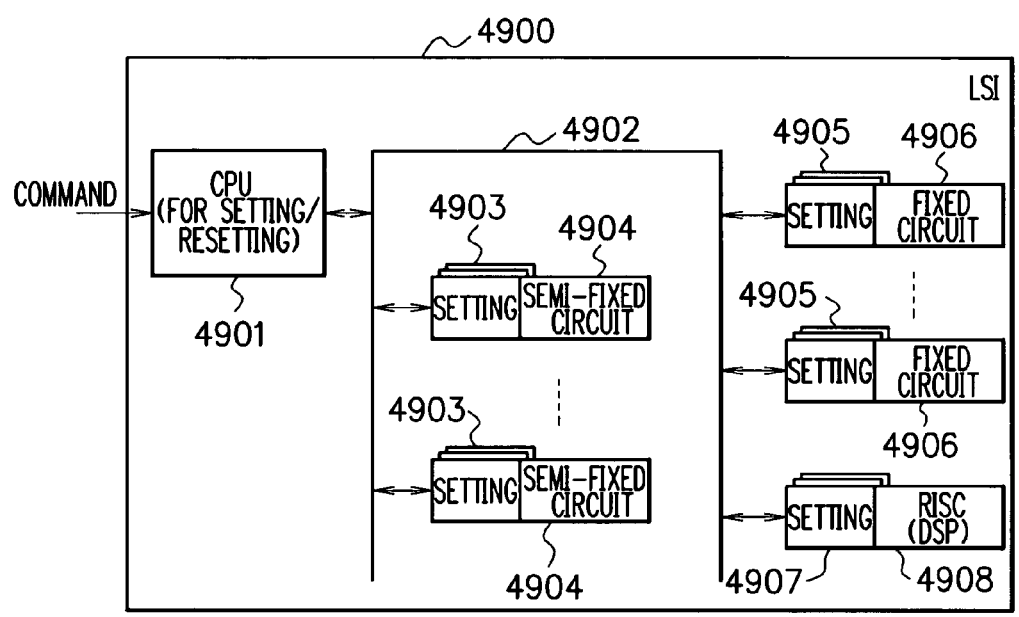

US 7,394,755 B2

SEMI-FIXED CIRCUIT

CROSS-REFERENCE TO RELATED APPLICATIONS

This application is based upon and claims the benefit of priority from the prior Japanese Patent Application No. 2003-330313, filed on Sep. 22, 2003, the entire contents of which are incorporated herein by reference.

BACKGROUND OF THE INVENTION

1. Field of the Invention

The present invention relates to a semi-fixed circuit, and particularly relates to a semi-fixed circuit capable of a plurality of kinds of circuit operations.

2. Description of the Related Art

As data processing required in many communication standards, for example, the mobile communication standard W-CDMA, and wireless LAN standards IEEE802.11a and IEEE802.11b, a quasi-random code generator by a scrambler, a convolution coder (convolution encoder), an error detecting type CRC (Cyclic Redundancy check) circuit, and a linear feedback shift register is conventionally used. Fast Fourier transform (FFT) constituted of a Viterbi decoder, a matched filter, and butterfly computation executing complex multiplication and complex addition is used.

In the following Patent Documents 1 and 2, a pseudo-random number generating circuit using a linear feedback shift register is described. In the following Patent Document 3, a variable CRC generating circuit is described.

[Patent Document 1] Japanese Patent Application Laid-open No. 63-67628.

[Patent Document 2] Japanese Patent Application Laid-open No. 63-204919.

[Patent Document 3] Japanese Patent Application Laid-open No. 4-292018.

A scrambler, a convolution encoder and the like are constituted of separate fixed circuits, since their processing contents differ. Even the same scramblers are constituted of separate fixed circuits when they are the scramblers with different standards. It reduces the efficiency of using hardware resources to construct all of them by separate fixed circuits.

SUMMARY OF THE INVENTION

An object of the present invention is to provide a semi-fixed circuit capable of realizing circuits having different functions such as a scrambler and a convolution encoder with one circuit.

Another object of the present invention is to provide a semi-fixed circuit capable of realizing a plurality of kinds of circuits, which are the circuits having the same functions such as scramblers, with one circuit.

According to one aspect of the present invention, there is provided a semi-fixed circuit capable of operations of a plurality of kinds of scramblers or descramblers, and comprising a plurality of flip flops connectable in series, a first selector capable of selecting any one signal out of at least an exclusive OR signal of an input signal and a first feedback signal, the first feedback signal and the input signal and outputting the signal to a first flip flop out of the plurality of flip flops, and a second selector capable of selecting any one signal out of at least an exclusive OR signal of an output signal of a second flip flop out of the plurality of flip flops and a second feedback signal, the output signal of the second flip flop, and the second feedback signal and outputting the signal to the first selector as the first feedback signal.

According to another aspect of the present invention, there is provided a semi-fixed circuit capable of simultaneous processing of a plurality of bits of a plurality of kinds of CRC (Cycle Redundancy Check) circuits, and comprising a plurality of flip flops, a first exclusive OR circuit selectively computing an exclusive OR based on a first input bit signal and output signals of said plurality of flip flops to output an output signal corresponding to a shift of first time, and a second exclusive OR circuit selectively computing an exclusive OR based on a second input bit signal and the output signal corresponding to the shift of the first time to output an output signal corresponding to a shift of second time.

According to still another aspect of the present invention, there is provided a semi-fixed circuit capable of simultaneous processing of a plurality of bits of a plurality of kinds of scramblers or descramblers and comprising a plurality of flip flops, a first exclusive OR circuit selectively computing an exclusive OR based on a fist input bit signal and output signals of the plurality of flip flops to output an output signal corresponding to a shift of first time, and a second exclusive OR circuit selectively computing an exclusive OR based on a second input bit signal and the output signals of said plurality of flip flops to output an output signal corresponding to a shift of second time.

According to still another aspect of the present invention, there is provided a semi-fixed circuit capable of viterbi-decoding of coded data convolutedly coded at a plurality of kinds of coding rates, and comprising a branch metric computation circuit for computing a plurality of branch metrics for viterbi-decoding the coded data convolutedly coded and selecting and outputting a branch metric corresponding to a coding rate, and a path metric computation circuit for selecting a necessary branch metric from the plurality of branch metrics and computing a path metric.

According to still another aspect of the present invention, there is provided a semi-fixed circuit capable of operations of a matched filter and a butterfly computation circuit, and comprising a shift register, a plurality of multipliers for performing multiplication, a plurality of adders for performing addition, and a connection circuit for controlling connection of the shift register, the plurality of multipliers and the plurality of adders, wherein the operations of the matched filter and the butterfly computation circuit are possible in accordance with the connection of the connection circuit.

BRIEF DESCRIPTION OF THE DRAWINGS

FIG. 1A is a diagram showing a constitution example of a transmitter of the wireless LAN standard IEEE802.11a, and FIG. 1B is a diagram showing a constitution example of a receiver of the wireless LAN standard IEEE802.11a;

FIG. 3 is a diagram showing a constitution example of a scrambler of the wireless LAN standard IEEE802.11a;

FIG. 7 is a diagram showing a constitution example of a semi-fixed circuit according to a second embodiment;

FIG. 8 is a diagram showing a constitution example of an input EOR circuit;

FIG. 9 is a diagram showing a constitution example of a middle stage EOR circuit;

FIG. 10 is a diagram showing a constitution example of a CRC circuit;

FIG. 12 is a diagram showing a constitution example of a flip flop circuit;

FIG. 13 is a diagram showing a constitution example of a convolution encoder of a coding rate of 1/2 of the IEEE802.11a;

FIG. 15 is a diagram showing a constitution example of an input EOR circuit;

FIG. 16 is a diagram showing a constitution example of a linear feedback shift register (LFSR) of the W-CDMA standard;

FIG. 18 is a diagram showing a constitution example of an input EOR circuit;

FIGS. 20A and 20B are diagrams showing constitution examples of a second type of scrambler or descrambler;

FIGS. 22A and 22B are diagrams showing constitution examples of a semi-fixed circuit according to a sixth embodiment of the present invention;

FIG. 33 is a diagram showing a constitution example of a semi-fixed circuit according to an eighth embodiment of the present invention;

FIGS. 36A to 36F are diagrams showing constitution examples of the input selectors;

FIG. 40 is a diagram showing a constitution example of a branch metric computing element part;

FIG. 44 is a diagram showing a constitution example of a butterfly computing element;

FIG. 45 is a diagram showing a constitution example of a fast Fourier transform (FFT) circuit;

FIG. 46 is a diagram showing a constitution example of a semi-fixed circuit capable of selectively realizing the matched filter and butterfly computation;

FIG. 47 is a diagram showing a constitution example of a butterfly computing element;

FIG. 49 is a diagram showing an entire constitution example of an LSI including a semi-fixed circuit according to an eleventh embodiment of the present invention.

DETAILED DESCRIPTION OF THE PREFERRED EMBODIMENTS

First Embodiment

Figure 2A:
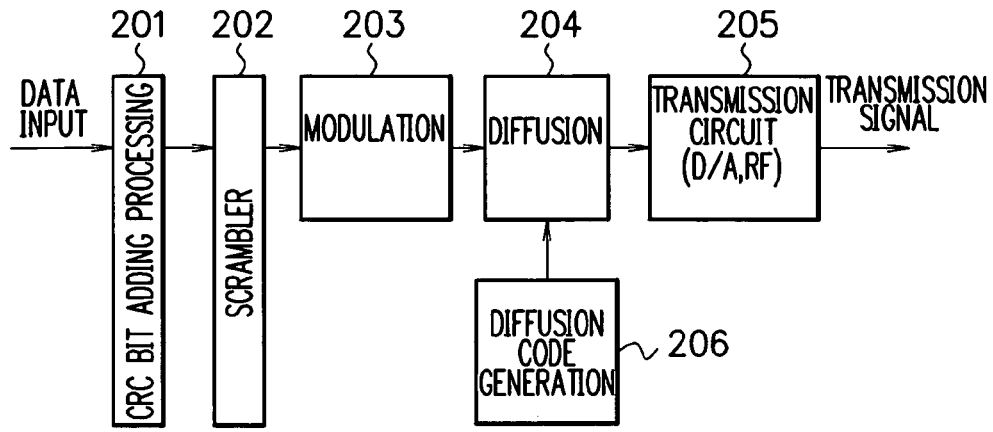
FIG. 2A is a diagram showing a constitution example of a transmitter of the wireless LAN standard IEEE802.11b.

FIG. 1A shows a constitution example of a transmitter of the wireless LAN standard IEEE802.11a. Input data is transmitted by radio as a transmission signal via a scrambler 101, a convolution encoder 102, an interleave processing circuit 103, a modulation circuit 104, an inverse FFT circuit 105, a D/A conversion circuit 106 and an RF circuit 107 in sequence. The scrambler 101 performs scramble processing to prevent electric power from concentrating on a specific frequency as a result that the same bits are inputted. The convolution encoder 102 performs redundancy coding for error correction (Viterbi decode). The interleave processing circuit 103 previously sorts transmit bits in accordance with the rule since the Viterbi decode has characteristics of being weak in a burst (continuous) error at the time of transmission and strong in a random error. The modulation circuit 104 performs modulation based on inputted data. The inverse FFT circuit 105 performs inverse fast Fourier transformation of the modulated data. The D/A conversion circuit 106 converts a signal into an analogue form from a digital form. The RF circuit 107 converts the signal into a signal in a radio frequency.

FIG. 1B shows a constitution example of a receiver of the wireless LAN standard IEEE802.11a. A signal received by radio is outputted as data via an RF circuit 111, an A/D conversion circuit 112, a synchronous processing circuit 113, an FFT circuit 114, a demodulator circuit 115, a deinterleave processing circuit 116, a Viterbi decoder 117 and a descrambler 118 in sequence. The RF circuit 111 converts a signal in a radio frequency into a signal in a predetermined frequency. The A/D conversion circuit 112 converts a signal into the digital form from the analogue form. The synchronous processing circuit 113 includes a matched filter, and detects a starting (synchronizing) point as a leading position of a frame. The FFT circuit 114 performs fast Fourier transform. The demodulation circuit 115 performs demodulation in timing synchronism with the modulation signal. The deinterleave processing circuit 116 returns the bit sequence to the arrangement before interleaving. The viterbi decoder 117 decodes the transmit bits from the convolutedly encoded redundant bits. The descrambler 118 returns the scrambled data to the original state.

FIG. 2A shows a constitution example of a transmitter of the wireless LAN standard IEEE802.11b. Inputted data is transmitted as a transmission signal by radio via a CRC bit adding processing circuit 201, a scrambler 202, a modulation circuit 203, a diffusion circuit 204 and a transmission circuit 205 in sequence. A diffusion code generating circuit 206 generates a diffusion code and outputs it to the diffusion circuit 204. The CRC bit adding processing circuit 201 adds a CRC bit for determining an error of data. The CRC bit is determined based on the data. Then, the transmitter regards the transmission data as a polynominal expression, and adds a residual obtained when dividing the polynominal expression by a generated polynominal expression previously determined, to the transmission data as a code for checking. The receiver divides the received data by the generated polynominal expression and determines the presence or absence of an error in accordance with whether it is divisible or not. The diffusion circuit 204 performs spectrum diffusion of the modulation signal. The transmission circuit 205 includes a D/A conversion circuit and the RF circuit.

Figure 2B:
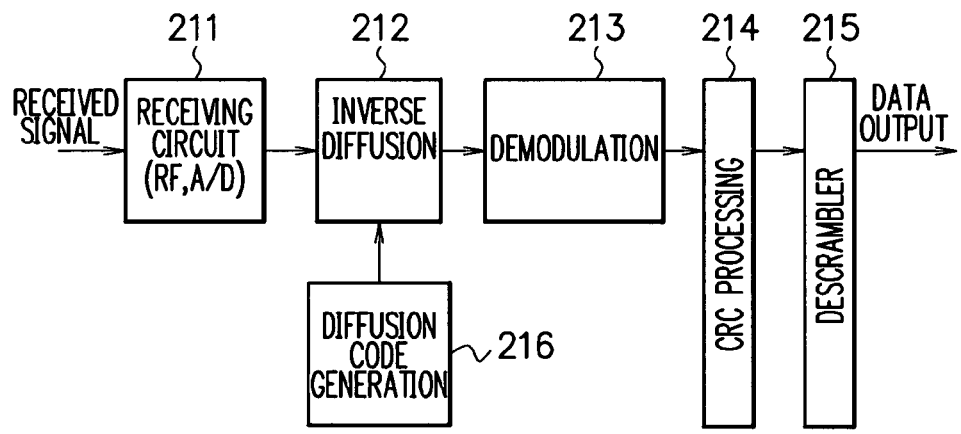
FIG. 2B is a diagram showing a constitution example of a receiver of the wireless LAN standard IEEE802.11b.

FIG. 2B shows a constitution example of a receiver of the wireless LAN standard IEEE802.11b. A signal received by radio is outputted as data via a receiving circuit 211, an inverse diffusion circuit 212, a demodulation circuit 213, a CRC processing circuit 214 and a descrambler 215 in sequence. A diffusion code generating circuit 216 generates a diffusion code and outputs it to the inverse diffusion circuit 212. The receiving circuit 211 includes the RF circuit and the A/C conversion circuit. The inverse diffusing circuit 212 multiplies the received signal by the same code as the diffusion code, whereby the received signal is inversely diffused, and the signal before diffusion is restored. The CRC processing circuit 214 calculates the CRC bit and checks the presence or the absence of an error.

Figure 3:
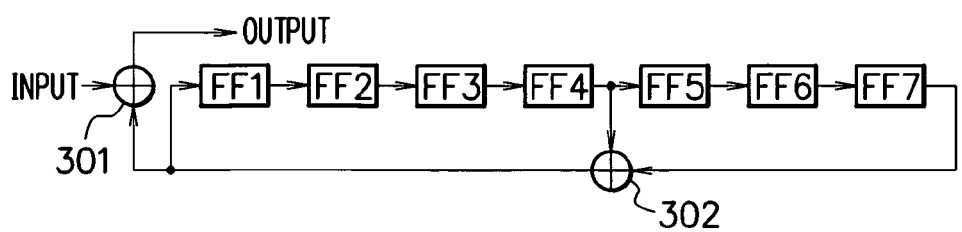

FIG. 3 shows a constitution example of the scrambler 101 (FIG. 1A) of the wireless LAN standard IEEE802.11a. For example, seven flip flops FF1 to FF7 are connected in series. An exclusive OR (hereinafter, called EOR) circuit 302 performs EOR computation of the output signals of the flip flops FF4 and FF7 and outputs the result. The flip flop FF1 receives the output signal of the EOR circuit 302. An EOR circuit 301 performs EOR computation of an input signal INPUT and the output signal of the EOR circuit 302, and outputs the result as an output signal OUTPUT. The descrambler 118 in FIG. 1B has the same constitution as the scrambler in FIG. 3. This is because the same codes can be outputted as the output signal OUTPUT if the initial values are the same and synchronized with each other. There is no correlation between internal states of the flip flops and the input signal INPUT.

Figure 4:
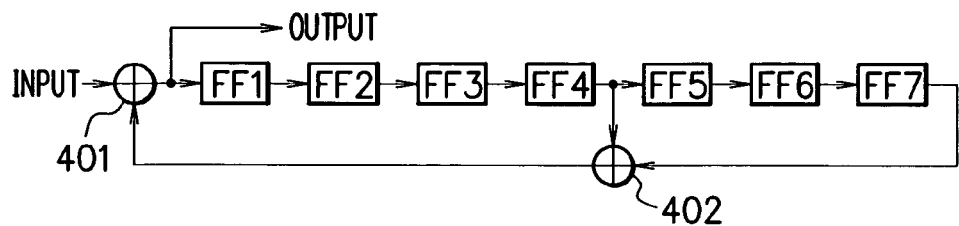
FIG. 4 is a diagram showing a constitution example of a scrambler of the wireless LAN standard IEEE802.11b.

FIG. 4 shows a constitution example of the scrambler 202 (FIG. 2A) of the wireless LAN standard IEEE802/11b. For example, seven flip flops FF1 to FF7 are connected in series. An EOR circuit 402 performs EOR computation of the output signals of the flip flops FF4 and FF7 and outputs the result. An EOR circuit 401 performs EOR computation of the input signal INPUT and the output signal of the EOR circuit 402, outputs the result as the output signal OUTPUT, and outputs the result to the flip flop FF1.

Figure 5:
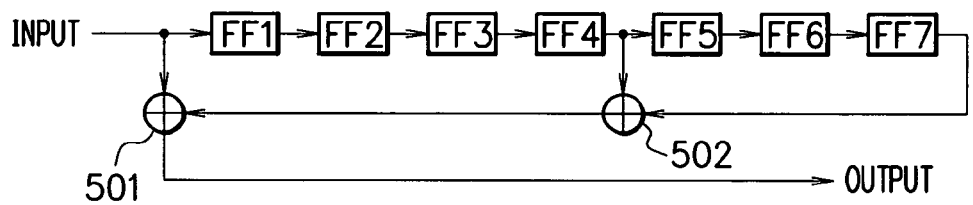
FIG. 5 is a diagram showing a constitution example of a descrambler of the wireless LAN standard IEEE802.11b.

FIG. 5 shows a constitution example of the descrambler 215 (FIG. 2B) of the wireless LAN standard IEEE802.11b. For example, seven flip flops FF1 to FF7 are connected in series. A flip flop FF1 receives the input signal INPUT. An EOR circuit 502 performs EOR computation of the output signals of the flip flops FF4 and FF7 and outputs the result. An EOR circuit 501 performs EOR computation of the input signal INPUT and the output signal of the EOR circuit 502, and outputs the result as the output signal OUTPUT.

In the IEEE802.11b, the constitutions of the scrambler in FIG. 4 and the descrambler in FIG. 5 differ. The numbers of flip flops of both of them are seven and the same. The scrambler in FIG. 4 outputs a different output signal (code) OUTPUT when the bit string of the input signal INPUT differs even if the initial value of the flip flop is the same. There is the correlation between the input signal INPUT and the internal states of the flip flops. In order to reconstitute the input signal INPUT of the scrambler of the transmitter in the descrambler of the receiver, the internal states of the flip flops of the scrambler of the transmitter are also reproduced in the receiver (descrambler), and then, the EOR of the flip flop output of the receiver (descrambler) and the output signal OUTPUT (the input signal INPUT of the descrambler in FIG. 5) of the transmitter (scrambler) is obtained. It is the descrambler in FIG. 5 that realizes this. In FIG. 5, the internal states of the flip flops of the scrambler in FIG. 4 are reproduced by inputting the input signal INPUT into the flip flop FF1 as it is.

Figure 6:
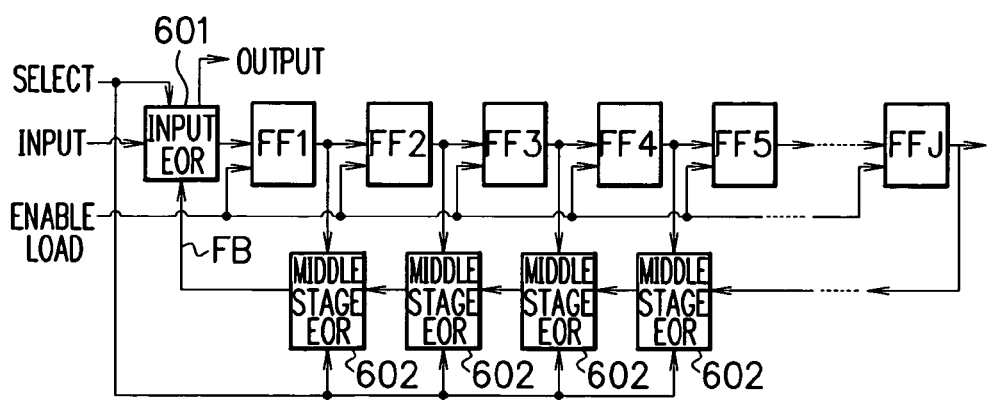
FIG. 6 is a diagram showing a constitution example of a semi-fixed circuit according to a first embodiment of the present invention.

FIG. 6 shows a constitution example of a semi-fixed circuit according to the first embodiment of the present invention. This semi-fixed circuit is capable of operations of the scrambler (descrambler) of the wireless LAN standard IEEE802.11a in FIG. 3, the scrambler of the wireless LAN standard LEEE802.11b in FIG. 4, and the descrambler of the wireless LAN standard IEEE802.11b in FIG. 5.

J pieces of Flip flops FF1 to FFJ are connected in series. Middle stage EOR circuits 602 are connected to connection lines between the respective flip flops. As shown in FIG. 9, the middle stage EOR circuit 602 receives an output signal A1 of the flip flop and an output signal (feedback signal) A3 of the previous adjacent middle stage EOR circuit 602. An EOR circuit 901 performs EOR computation of the signals A1 and A3 and outputs the result as a signal A2. A selector 902 alternatively selects the signal A1, A2 or A3 in accordance with a selection signal SELECT, and outputs the result to the subsequent adjacent middle stage EOR circuit 602. For example, in each of the middle stage EOR circuits 602 corresponding to the EOR circuit 302 in FIG. 3, the EOR circuit 402 in FIG. 4 and the EOR circuit 502 in FIG. 5, the selector 902 selects the signal A2 and outputs it. In the middle stage EOR circuit 602 connected to the final stage flip flop FF7, the selector 902 selects the signal A1 and outputs it. In each of the other middle stage EOR circuits 602, the selector 902 selects the feedback signal A3 and outputs it.

An output signal (feedback signal) FB of the middle stage EOR circuit 602 connected to between the flip flops FF1 and FF2 is inputted into an input EOR circuit 601. As shown in FIG. 8, the input EOR circuit 601 receives the feedback signal FB and the input signal INPUT. An EOR circuit 801 performs EOR computation of the feedback signal FB and the input signal INPUT, and outputs the signal A2. When the feedback signal FB is set as the signal A1, and the input signal INPUT is set as the signal A3, a selector 802 alternatively selects the signal A1, A2 or A3 in accordance with the selection signal SELECT, and outputs the result to the flip flop FF1. The signal A2 becomes the output signal OUTPUT. In the case of FIG. 3, the selector 802 selects the signal A1. In the case of FIG. 4, the selector 802 selects the signal A2. In the case of FIG. 5, the selector 802 selects the signal A3.

In FIG. 6, an enable signal ENABLE is a signal to control whether the flip flops FF1 to FFJ are brought into an enable state or not. For example, only the flip flops FF1 to FF7 are in the enable state. An initial value signal LOAD is a signal for setting initial values at the flip flops FF1 to FFJ. As described above, by controlling the selection state of the input EOR circuit 601 and the middle stage EOR circuit 602 in accordance with the selection signal SELECT, the scramblers and the descrambler in FIG. 3 to FIG. 5 can be alternatively selected and operated.

The scrambler in the fixed circuit has the structure of the hardware dependent on such parameters as shift register length, a tap position inputted into the EOR circuit, and the number of taps inputted into the EOR circuit, and has the problem that if these parameters change, hardware has to be prepared apart from this. According to the semi-fixed circuit of this embodiment, by providing the input EOR circuit 601 and the middle stage EOR circuit 602, the operations of various kinds of scramblers and descramblers including three scramblers or descramblers of FIG. 3 to FIG. 5 are made possible with one semi-fixed circuit.

Second Embodiment

FIG. 7 shows a constitution example of a semi-fixed circuit according to a second embodiment of the present invention. This semi-fixed circuit is made by adding a decoder 701 to the semi-fixed circuit in FIG. 6. The decoder 701 outputs a signal of 2L+2 bits based on the selection signal SELECT of L+1 bits, and controls selection states of L pieces of middle stage EOR circuits 602 and one input EOR circuit 601.

In order to control L pieces of middle stage EOR circuits 602 and one input EOR circuit 601, the selection signal SELECT of 2L+2 bits is originally necessary, but the selection signal SELECT can be made L+1 bits by utilizing the fact that as a result of grouping the flip flops and the middle stage EOR circuits 602 to be used and the flip flops and the middle EOR circuits 602 not to be used out of all the number of patterns and subtracting the combination patterns of setting in the group not to be used from all the numbers of patterns, there are (2 raised to $(L-1)^{th}$ power)×3 possible patterns.

As described above, the decoder 701 decodes the input signal SELECT of a small number of bits and outputs an output signal of a large number of bits, and selects the middle stage EOR circuit 602 and the input EOR circuit 601. By using the decoder 701, the amount of selection signal can be reduced.

Third Embodiment

FIG. 10 shows a constitution example of CRC circuits in the CRC bit adding processing circuit 201 (FIG. 2A) and the CRC processing circuit 214 (FIG. 2B). An EOR circuit 1001 computes EOR of the input signal IN and a feedback signal from a flip flop FF of a final stage, and outputs the result to a flip flop of an initial stage. For example, four flip flops FF are connected in series via EOR circuits 1002. Each of the EOR circuits 1002 computes EOR of the output signal of the EOR circuit 1001 and an output signal of the flip flop FF of the previous stage, and outputs the result to the flip flop FF of the subsequent stage. The output signals of the respective flip flops FF become output signals OUT0, OUT1, OUT2 and OUT3.

As for the CRC circuit in FIG. 10, the example with four taps, in which the EOR circuits are interposed between all the flip flops is explained for simplification, but in the constitution of the actual CRC circuit, the number of taps are, for example, 16 in the IEEE802.11b, and the EOR circuits 1002 are interposed between the flip flops FF at irregular intervals.

Figure 11:
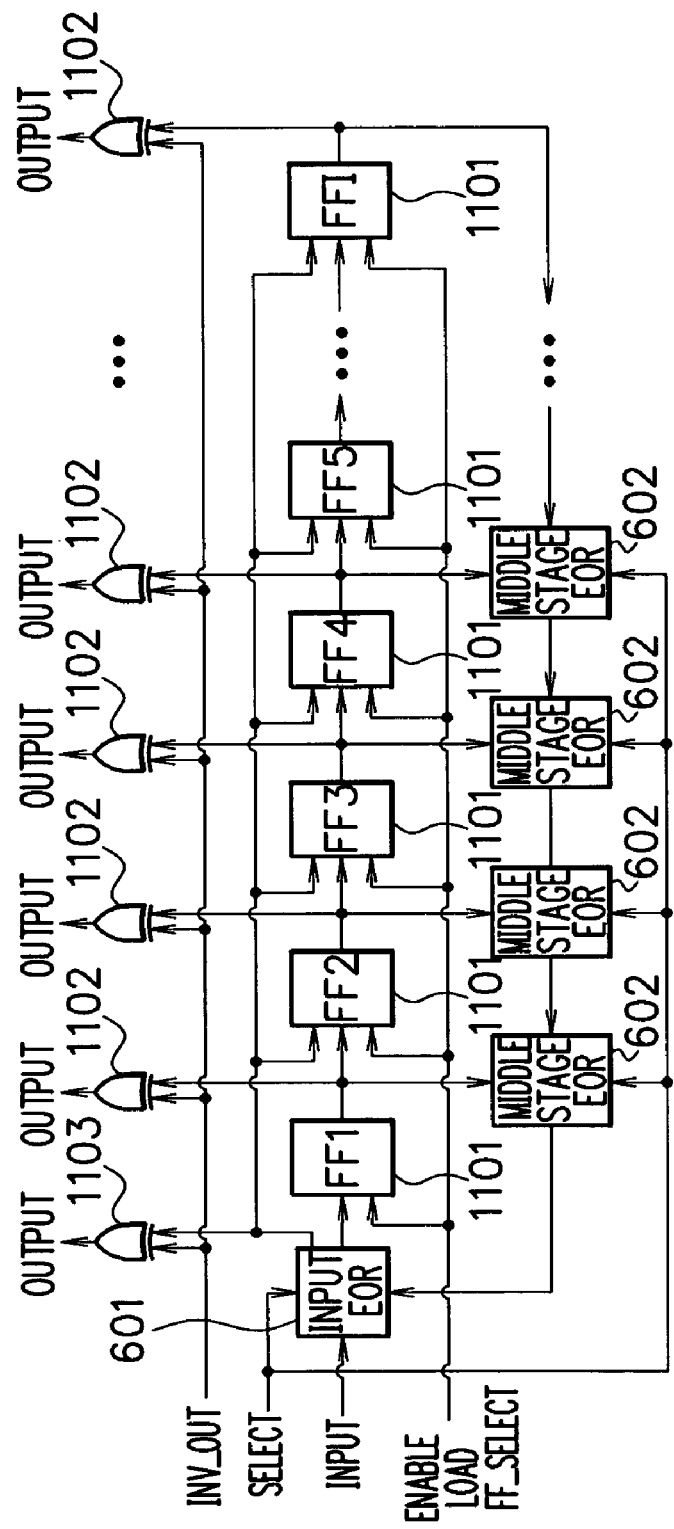
FIG. 11 is a diagram showing a constitution example of a semi-fixed circuit according to a third embodiment of the present invention.

FIG. 11 shows a constitution example of a semi-fixed circuit according to the third embodiment of the present invention. This semi-fixed circuit is a circuit made by adding the function of the CRC circuit in FIG. 10 to the semi-fixed circuit of the first embodiment (FIG. 6). Since the semi-fixed circuit of this embodiment is basically the same as the semi-fixed circuit of the first embodiment, only the point differing from the first embodiment will be explained. 16 is the basis of the number of taps I corresponding to the number of flip flop circuits 1101.

A plurality of flip flop circuits 1101 each have a constitution in FIG. 12 unlike FIG. 6. An EOR circuit 1201 computes EOR of input data from the input EOR circuit 601 and the output signal A2 of the flip flop of the previous stage, and outputs the signal A1. A selector 1203 selects the signal A1 or A2 in accordance with a selection signal FF_SELECT, and outputs the result to a flip flop 1204. The flip flop 1204 receives an output signal of the selector 1203 and outputs the signal.

In order to realize the CRC circuit in FIG. 10, the selector 1203 selects the signal A1 and outputs the signal A1. In order to realize the circuit in FIG. 6, the selector 1203 selects the signal A2 and outputs the signal.

In the CRC circuit in FIG. 10, there is the case where output signals OUT0 to OUT3 are outputted as they are, and the case where the outputs of them are inverted and outputted. Therefore, in FIG. 11, EOR circuits 1102 and 1103 are added. When the inverted signal INV_OUT is 1, the inverted output is performed, and when it is 0, non-inverted output is performed. The EOR circuit 1103 computes EOR of the output signal of the input EOR circuit 601 and the inverted signal INV_OUT, and outputs the result. Each of a plurality of EOR circuits 1102 operates EOR of the output signal of each of the flip flops 1101 and inverted signal INV_OUOT, and outputs the result.

The CRC circuit and the like of the fixed circuit have the structure of the hardware dependent on parameters, and have the problem that when the parameters change, hardware has to be prepared apart from this. According to this embodiment, a scrambler of an optional constitution and a CRC circuit of an optional constitution can be realized with one semi-fixed circuit.

Fourth Embodiment

FIG. 13 shows a constitution example of the convolution encoder 102 of a coding rate of 1/2 (FIG. 1A) of the IEEE802.11a. For example, six flip flops FF1 to FF6 are connected in series. The input signal INPUT is inputted into the flip flop FF1 of the initial stage. An EOR circuit 1301 computes EOR of the input signal INPUT and the output signals of the flip flops FF2, FF3, FF5 and FF6, and outputs an output signal OUTPUT1. An EOR circuit 1302 computes EOR of the input signal INPUT and output signals of the flip flops FF1, FF2, FF3 and FF6, and outputs an output signal OUTPUT2.

Figure 14:
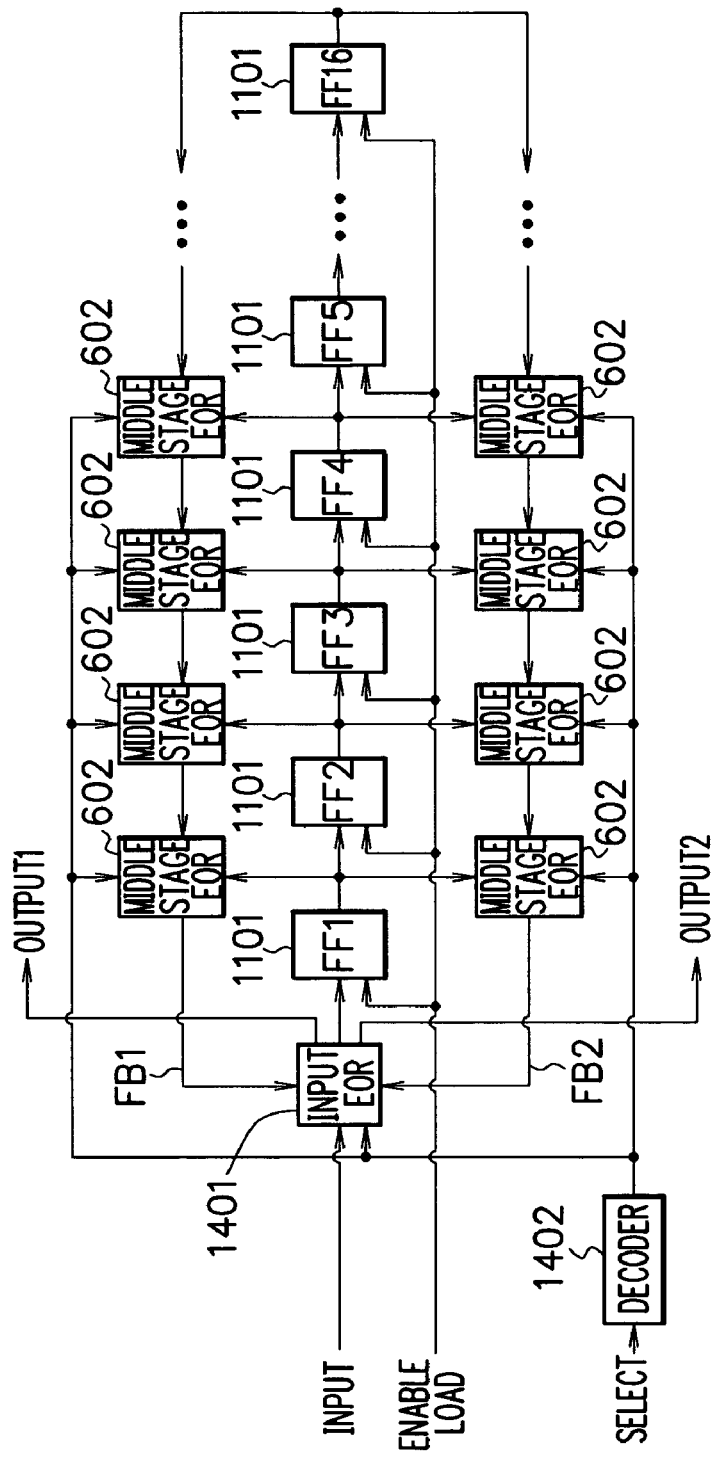
FIG. 14 is a diagram showing a constitution example of a semi-fixed circuit according to a fourth embodiment of the present invention.

FIG. 14 shows a constitution example of a semi-fixed circuit according to a fourth embodiment of the present invention. The semi-fixed circuit is the circuit made by adding the function of the convolution encoder in FIG. 13 to the semi-fixed circuit of the third embodiment (FIG. 11). The semi-fixed circuit of this embodiment is basically the same as the semi-fixed circuit of the third embodiment, and only the point differing from the third embodiment will be explained.

In the third embodiment, the middle stage EOR circuits 602 are provided only at the lower stage of the flip flops 1101, but in the fourth embodiment, the middle stage EOR circuits 602 are also provided at the upper stage as well as at the lower stage from the flip flops 1101. The middle stage EOR circuits 602 at the upper stage correspond to the EOR circuit 1301 in FIG. 13. The middle EOR circuits 602 at the lower stage correspond to the EOR circuit 1302 in FIG. 13.

An input EOR circuit 1401 is provided instead of the input EOR circuit 601 in FIG. 11, and has a constitution in FIG. 15. The input signal INPUT, a feedback signal FB1 from the middle EOR circuit 602 at the upper stage, and a feedback signal FB2 from the middle stage EOR circuit 602 at the lower stage are inputted into the input EOR circuit 1401. The feedback signal FB1 is inputted into a selector 1503 as the signal A1, the input signal INPUT is inputted into the selector 1503 as the signal A3, and the feedback signal FB2 is inputted into the selector 1503 as a signal A5.

An EOR circuit 1501 computes EOR of the feedback signal FB1 and the input signal INPUT, and outputs the signal A2. The signal A2 is outputted as the output signal OUTPUT 1. An EOR circuit 1502 computes EOR of the feedback signal FB2 and the input signal INPUT, and outputs a signal A4. The signal A4 is outputted as the output signal OUTPUT2. A decoder 1402 in FIG. 14 decodes the selection signal SELECT as the decoder 701 in FIG. 7 and outputs a selection signal. The selector 1503 alternatively selects a signal from the signals A1 to A5 in accordance with the output signal of the decoder 1402, and outputs the result to the flip flop FF1 of the initial stage. In order to realize the convolution decoder in FIG. 13, the selector 1503 selects the signal A3 and outputs it.

The convolution encoder and the like of the fixed circuit have the structure of hardware dependent on parameters, and has the problem that when these parameters change, hardware has to be prepared apart from this. According to this embodiment, a scrambler of an optional constitution, a CRC circuit of an optional constitution and a convolution encoder of an optional constitution can be realized with one semi-fixed circuit.

Fifth Embodiment

FIG. 16 shows a constitution example of a linear feedback shift register (LFSR) of the W-CDMA standard. The linear feedback shift register is used for a diffusion code generating circuit of the W-CDMA standard. The position of the diffusion code generating circuit of the W-CDMA standard is the same as in the diffusion code generating circuits 206 and 216 of the IEEE802.11b in FIGS. 2A and 2B. The linear feedback shift register does not take in the input data, but performs shift operation of bit arithmetic processing with repeatability based on a value initially set at the flip flop.

The linear feedback shift register (hereinafter, called LFSR) has a first circuit 1611 and a second circuit 1612. First, the first circuit 1611 will be explained. A plurality of flip flops FF are connected in series. An EOR circuit 1604 computes EOR of signals of the flip flop FF of a final stage (left end) and the other flip flops FF, and feeds back and inputs the result to the flip flop FF of an initial stage (right end). An EOR circuit 1603 computes EOR of the signals of the three flip flops FF and outputs the result.

Next, the second circuit 1612 will be explained. A plurality of flip flops FF are connected in series. An EOR circuit 1606 computes EOR of the signals of four flip flops FF, and feeds back and inputs the result to the flip flop FF of an initial stage (right end). An EOR circuit 1605 computes EOR of signals of three flip flops FF and outputs the result.

An EOR circuit 1601 computes EOR of the output signals of the flip flops at the final stages of the first circuit 1611 and the second circuit 1612, and outputs the output signal OUTPUT1. The EOR circuit 1602 computes EOR of the output signals of the EOR circuits 1603 and 1605, and outputs the output signal OUTPUT2.

Figure 17:
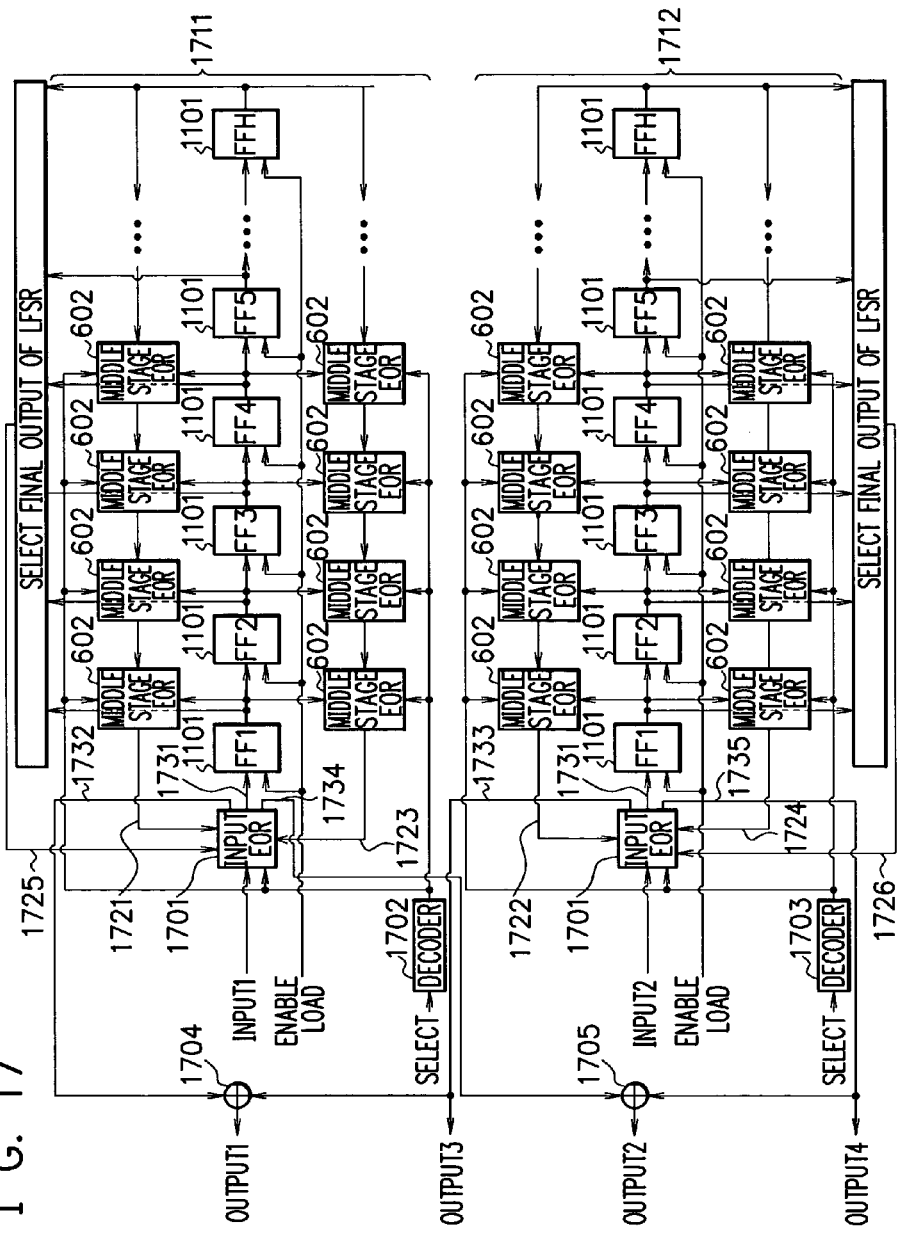
FIG. 17 is a diagram showing a constitution example of a semi-fixed circuit according to a fifth embodiment of the present invention.

FIG. 17 shows a constitution example of a semi-fixed circuit according to a fifth embodiment of the present invention. The semi-fixed circuit is a circuit made by adding the function of LFSR in FIG. 16 to the semi-fixed circuit of the fourth embodiment (FIG. 14). Only the point in which the semi-fixed circuit of this embodiment differs from he fourth embodiment will be explained.

The semi-fixed circuit of this embodiment has a first circuit 1711 and a second circuit 1712. The first circuit 1711 and the second circuit 1712 correspond to the first circuit 1611 and the second circuit 1612 in FIG. 16, respectively, and each of the circuits corresponds to the circuit in FIG. 14.

An input EOR circuit 1701 is provided instead of the input EOR circuit 1401 in FIG. 14, and has a constitution in FIG. 18. Input signals 1725 and 1726 are the signals obtained by selecting outputs of the flip flops 1101 at the final stages in accordance with the number of stages of the LFSR constituted this time from the outputs of the optional flip flops 1101. Input signals 1721 and 1722 are output signals of the middle stage EOR circuits 602 at the upper stages. The input signals INPUT1 and INPUT2 are not used in the LFSR in FIG. 16, and they correspond to the input signal INPUT in the above-described fourth embodiment. Input signals 1723 and 1724 are output signals of the middle stage EOR circuits 602 at the lower stages.

An EOR circuit 1801 computes EOR of the signals 1721 and 1722 and the input signals INPUT1 and INPUT2, and outputs the result. An EOR circuit 1802 computes EOR of the signals 1723 and 1724 and the input signals INPUPT1 and INPUT2, and outputs the result.

In FIG. 17, a decoder 1702 decodes a selection signal SELECT and outputs a selection signal, and controls the selection states of the input EOR circuit 1701 and the middle stage EOR circuits 602 of the first circuit 1711. A decoder 1703 decodes the selection signal SELECT and outputs a selection signal, and controls the selection states of the input EOR circuit 1701 and the middle stage EOR circuits 602 of the second circuit 1712.

In FIG. 18, a selector 1804 alternatively selects a signal from the signals 1725 and 1726, the signals 1721 and 1722, and an output signal of the EOR circuit 1801 in accordance with the selection signal, and outputs output signals 1732 and 1733. A selector 1805 alternatively selects a signal from the signals 1725 and 1726, the signals 1723 and 1724, and an output signal of the EOR circuit 1802 in accordance with the selection signal, and outputs output signals 1734 and 1735. A selector 1803 alternatively selects a signal from the signals 1721 and 1722, the output signal of the EOR circuit 1801, the input signals INPUT1 and INPUT2, the output signal of the EOR circuit 1802, and the signals 1723 and 1724, and outputs an output signal 1731 to the flip flop FF1 at the initial stage.

In FIG. 17, an EOR circuit 1704 computes EOR of the signals 1732 and 1733, and outputs the output signal OUTPUT1. An EOR circuit 1705 computes EOR of the signals 1734 and 1735, and outputs the output signal OUTPUT2. The signal 1733 is outputted as the output signal OUTPUT3, and the signal 1735 is outputted as the output signal OUTPUT4.

In order to realize the LFSR in FIG. 16, the selector 1804 selects and outputs the input signal 1725, the selector 1803 selects and outputs the input signal 1721, and the selector 1805 selects and outputs the input signal 1723, in the input EOR circuit 1701 of the first circuit 1711. In the input EOR circuit 1701 of the second circuit 1712, the selector 1804 selects and outputs the input signal 1726, the selector 1803 selects and outputs the input signal 1722, and the selector 1805 selects and outputs the input signal 1724.

The LFSR and the like of the semi-fixed circuit have the structure of hardware dependent on parameters, and has the problem that when these parameters change, hardware has to be prepared apart from this. According to this embodiment, a scrambler of an optional constitution, a CRC circuit of an optional constitution, a convolution encoder of an optional constitution, and an LFSR of an optional constitution can be realized with one semi-fixed circuit.

Sixth Embodiment

Figure 22B:
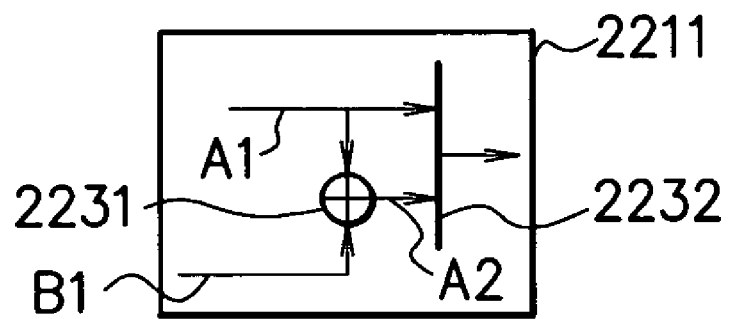

FIG. 22A shows a constitution example of a semi-fixed circuit according to a sixth embodiment of the present invention. This semi-fixed circuit can selectively realize a plurality of kinds of CRC circuits such as the CRC circuit in FIG. 10, and performs foresight processing of an amount of several shifts at one time by simultaneously inputting a plurality of bits instead of inputting one bit at a time by shifting it as shown in FIG. 10.

For example, input signals IN[0] to IN[5] are inputted by 6 bits in parallel. Output signals of selectors 2201 to 2204 are inputted into the flip flops FF1 to FF4. Output signals OUT0 to OUT3 of the flip flops FF1 to FF4 are initial set values corresponding to a shift of zero time. A plurality of E circuits 2211 each have a constitution in FIG. 22B, and each receive the signal A1 and a signal B1. An EOR circuit 2231 computes EOR of the signals A1 and B1, and outputs the signal A2. A selector 2232 selects and outputs the signal A1 or signal A2.

Data D00, D01, D02 and D03 are output signals corresponding to a shift of first time. Data D10, D11, D12 and D13 are output signals corresponding to a shift of second time. Data D20, D21, D22 and D23 are output signals corresponding to a shift of third time. Data D30, D31, D32 and D33 are output signals corresponding to a shift of fourth time. Data D40, D41, D42 and D43 are output signals corresponding to a shift of fifth time. Data D50, D51, D52 and D53 are output signals corresponding to a shift of sixth time.

The selector 2201 alternatively selects data from the data D00, D10, D20, D30, D40 and D50 and outputs the data to the flip flop FF1. The selector 2202 alternatively selects data from the data D01, D11, D21, D31, D41 and D51 and outputs the data to the flip flop FF2. The selector 2203 alternatively selects data from the data D02, D12, D22, D32, D42 and D52 and outputs the data to the flip flop FF3. The selector 2204 alternatively selects data from the data D03, D13, D23, D33, D43 and D53 and outputs the data to the flip flop FF4.

The semi-fixed circuit can select parallel inputs of one bit to six bits. For example, when parallel input signals IN[0] to IN[5] of six bits are inputted, the selectors 2201 to 2204 select the data D50, D51, D52 and D53. When parallel input signals IN[0] to IN[4] of five bits are inputted, the selectors 2201 to 2204 select the data D40, D41, D42 and D43.

By providing the E circuit 2211, it becomes possible to realize the CRC circuit in which the EOR circuits 1002 in FIG. 10 are interposed at irregular intervals. In the E circuit 2211, the signal A2 is selected when the EOR circuit is interposed, and when the EOR circuit is not interposed, the signal A1 is selected.

Here, the maximum number of foresight shifts which can be outputted at one time is constituted to be 6. In this case, six bits from IN[0] to IN[5] are simultaneously inputted at one time. Then, the output signals OUT0 to OUT3 at the time of initial setting of the flip flops FF1 to FF4 are obtained. At the same time, an output Dtb of the number of shifts 1 to 6 is obtained. t expresses (shift times −1) and b expresses a digit position of a bit. In this case, the four selectors 2201 to 2204 select the sixth input from the top. Namely, D50, D51, D52 and D53 in order from left. In doing so, the output from the number of shifts 7 to 12 is obtained by inputting the subsequent six bits. If five bits are inputted at one time as input, a circuit 2222 is not used. Namely, considering that the circuit 2222 does not exist, an operation of taking the input data of five bits at a time is performed. In order to do this, the selectors 2201 to 2204 select the fifth input data from the top and input the next five-bit input signals.

In this embodiment, in order to respond to the constitution in which the EOR circuit 1002 at the rightmost end in FIG. 10 is not interposed, the signal A1 is selected in the setting of all the E circuits 2211 of the circuit 2221 in FIG. 22A.

The constitution in FIG. 22A is obtained from the relationship between the number of shifts t−1 obtained from FIG. 10 and t, as shown in the following expression. In this case, "x" means EOR. {OUT0[t], OUT1[t], OUT2[t], OUT3[t]}= {OUT3[t−1]xIN[t−1], OUT3[t−1]xIN[t−1]xOUT0[t−1], OUT3[t−1]xIN[t−1]xOUT1[t−1], UT3[t−1]xIN[t−1]xOUT2[t−1]}

The CRC circuit in FIG. 10 is serial processing in which when one bit is inputted, one bit is outputted. In this embodiment, a plurality of CRC computations can be performed at one time by providing the circuits for performing a plurality of times of shift processing in advance instead of repeating a one-bit shift.

Seventh Embodiment

Figure 19A:
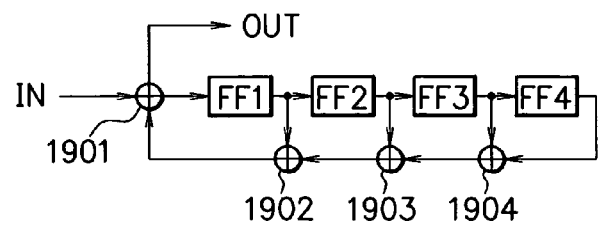
FIGS. 19A and 19B are diagrams showing constitution examples of a first type of scrambler or descrambler.

FIG. 19A is a constitution example of a first type of scrambler (including a descrambler. The same shall apply hereinafter.). An EOR circuit 1901 computes EOR of the input signal IN and the output signal of an EOR circuit 1902, and outputs the output signal OUT. For example, four flip flops FF1 to FF4 are connected in series. The output signal of the EOR circuit 1901 is inputted into the flip flop FF1. An EOR circuit 1904 computes EOR of the output signals of the flip flops FF3 and FF4, and outputs the result. An EOR circuit 1903 computes EOR of the output signal of the EOR circuit 1904 and the output signal of the flip flop FF2, and outputs the result. The EOR circuit 1902 computes EOR of the output signal of the EOR circuit 1903 and the output signal of the flip flop FF1, and outputs the result to the EOR circuit 1901.

Figure 19B:
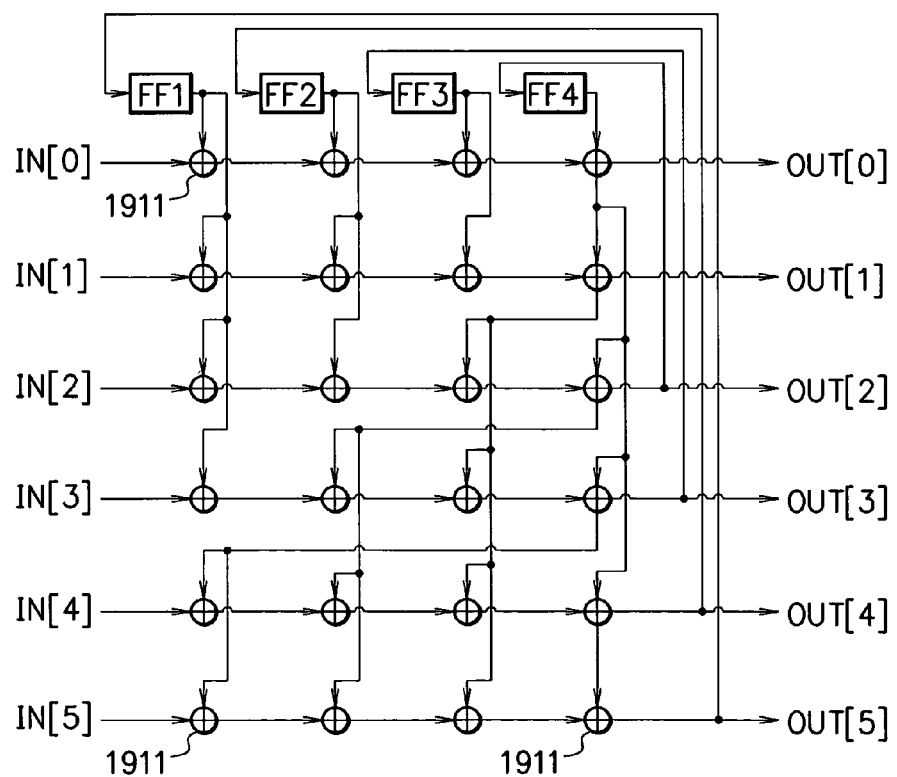

FIG. 19B shows a constitution example of a scrambler capable of simultaneously receiving a plurality of input bits of the scrambler in FIG. 19A and performing foresight processing of several shifts at one time. For example, input signals IN[0] to IN[5] of six bits are inputted in parallel. The EOR circuit 1911 performs EOR computation and outputs the result. The respective output signals OUT[2] to OUT[5] are fed back to and inputted into the flip flops FF1 to FF4. The output signals OUT[0] to OUT[5] are signals corresponding to the first to the sixth shifts, respectively.

FIG. 20A is a constitution example of a second type of scrambler. An EOR circuit 2001 computes EOR of the input signal IN and an output signal of an EOR circuit 2002, and outputs the output signal OUT. For example, four flip flops FF1 to FF4 are connected in series. The output signal of the EOR circuit 2002 is inputted into the flip flop FF1. An EOR circuit 2004 computes EOR of the output signals of the flip flops FF3 and FF4 and outputs the result. An EOR circuit 2003 computes EOR of the output signal of the EOR circuit 2004 and the output signal of the flip flop FF2 and outputs the result. The EOR circuit 2002 computes EOR of the output signal of the EOR circuit 2003 and the output signal of the flip flop FF1, and outputs the result to the EOR circuit 2001 and the flip flop FF1.

FIG. 20B shows a constitution example of a scrambler capable of simultaneously receiving a plurality of input bits of the scrambler in FIG. 20A and performing foresight processing of several shifts at one time. For example, input signals IN[0] to IN[5] of six bits are inputted in parallel. An EOR circuit 2011 performs EOR computation and outputs the result. An EOR circuit 2021 computes EOR of the input signal IN[5] and the output signal OUT[5], and outputs the result to the flip flop FF1. An EOR circuit 2022 computes EOR of the input signal IN[4] and the output signal OUT[4], and outputs the result to the flip flop FF2. An EOR circuit 2023 computes EOR of the input signal IN[3] and the output signal OUT[3], and outputs the result to the flip flop FF3. An EOR circuit 2024 computes EOR of the input signal IN[2] and the output signal OUT[2], and outputs the result to the flip flop FF4. The output signals OUT[0] to OUT[5] are output signals corresponding to the first to the sixth shifts, respectively.

Figure 21A:
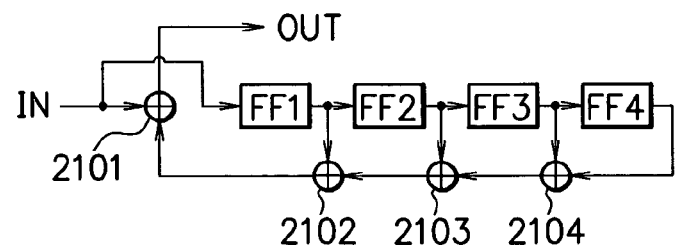
FIGS. 21A and 21B are diagrams showing constitution examples of a third type of scrambler or descrambler.

FIG. 21A is a constitution example of a third type of scrambler. An EOR circuit 2101 computes EOR of the input signal IN and an output signal of the EOR circuit 2102, and outputs the output signal OUT. For example, four flip flops FF1 to FF4 are connected in series. The input signal IN is inputted into the flip flop FF1. An EOR circuit 2104 computes EOR of the output signals of the flip flops FF3 and FF4, and outputs the result. An EOR circuit 2103 computes EOR of the output signal of the EOR circuit 2104 and the output signal of the flip flop FF2, and outputs the result. The EOR circuit 2102 computes the output signal of the EOR circuit 2103 and the output signal of the flip flop FF1, and outputs the result to the EOR circuit 2101.

Figure 21B:
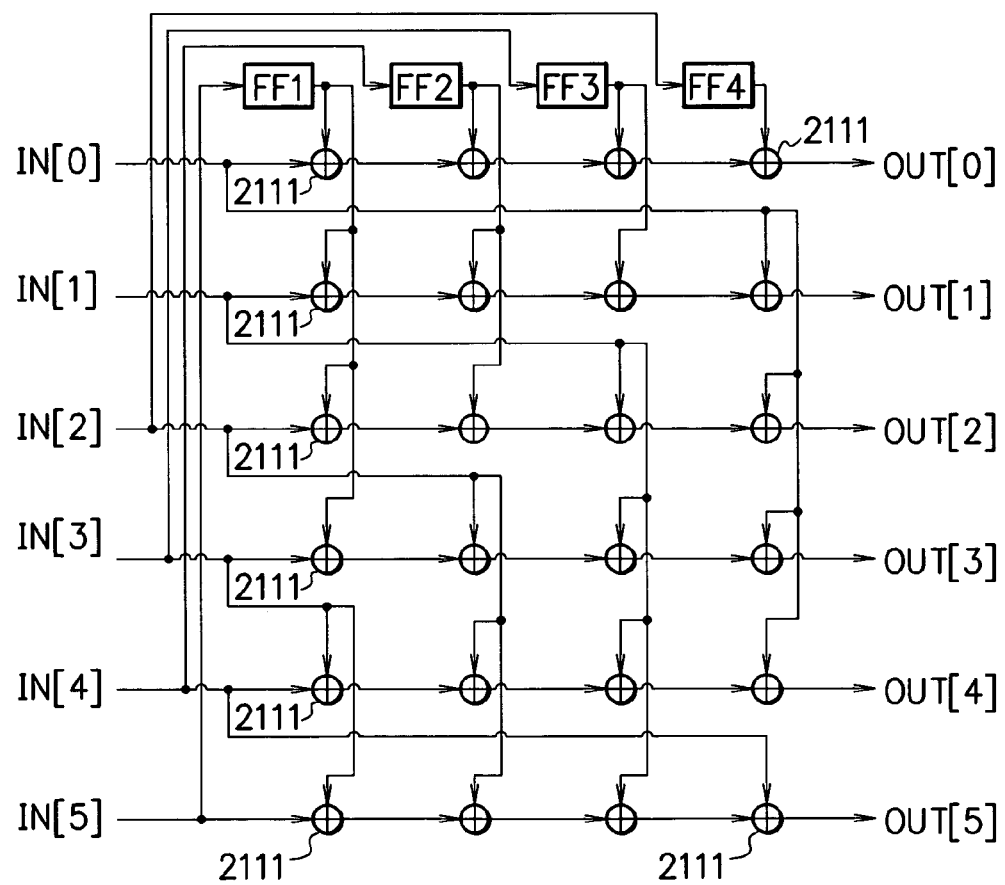

FIG. 21B shows a constitution example of a scrambler capable of simultaneously receiving a plurality of input bits of the scrambler in FIG. 21A and performing foresight processing of several shifts at one time. For example, input signals IN[0] to IN[5] of 6 bits are inputted in parallel. An EOR circuit 2111 performs EOR computation and outputs the result. The input signals IN[5] to IN[2] are inputted into the flip flops FF1 to FF4, respectively. The output signals OUT[0] to OUT[5] are output signals corresponding to the first to the sixth shifts.

Figure 23:
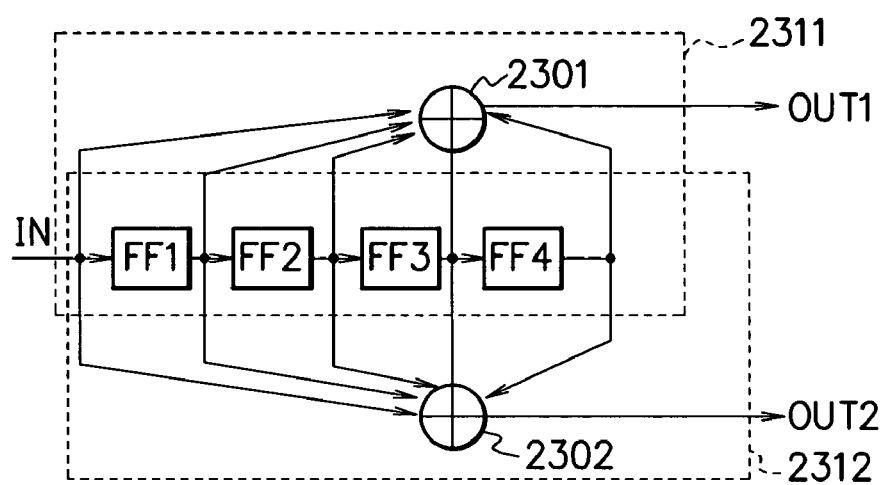
FIG. 23 is a diagram showing a constitution example of a convolution encoder of a coding rate of 1/2.

FIG. 23 shows a constitution example of the convolution encoder of a coding rate of 1/2. For example, four flip flops FF1 to FF4 are connected in series. The input signal IN is inputted into the flip flop FF1 of the initial stage. An EOR circuit 2301 computes EOR of the input signal INPUT and the output signals of the flip flops FF1 to FF4, and outputs an output signal OUT1. An EOR circuit 2302 computes EOR of the input signal INPUT, and the output signals of the flip flops FF1 to FF4, and outputs an output signal OUT2. The operation of the convolution encoder is to perform shift-in by one bit of input data and output 2 bits.

Figure 24:
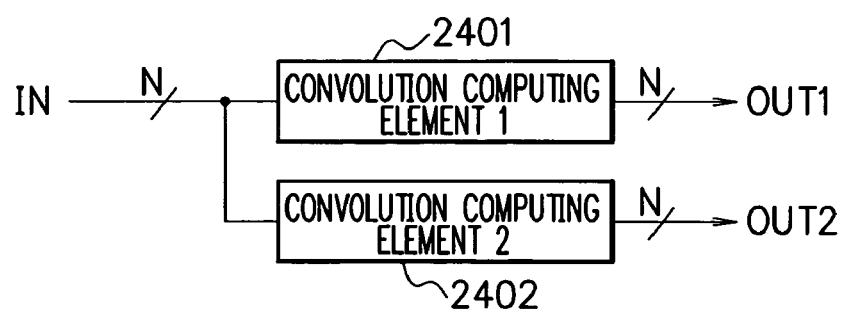
FIG. 24 is a diagram showing a constitution example of a semi-fixed circuit of a convolution encoder capable of simultaneous processing of N bits per one shift.

FIG. 24 shows a constitution example of a semi-fixed circuit of a convolution encoder capable of simultaneous processing of N bits per one shift of the convolution encoder in FIG. 23. A first convolution computing element 2401 corresponds to a computing element 2311 in FIG. 23, and receives an input signal of N bits and outputs the output signal OUT1 of N bits. The computing element 2311 includes the flip flops FF1 to FF4 and the EOR circuit 2301. A second convolution computing element 2402 corresponds to a computing element 2312, and receives the input signal of N bits and outputs the output signal OUT2 of N bits. The computing element 2312 includes the flip flops FF1 to FF4 and the EOR circuit 2302. The semi-fixed circuit in FIG. 24 can selectively realize the scramblers in FIG. 19B, FIG. 20B and FIG. 21B.

Figure 25:
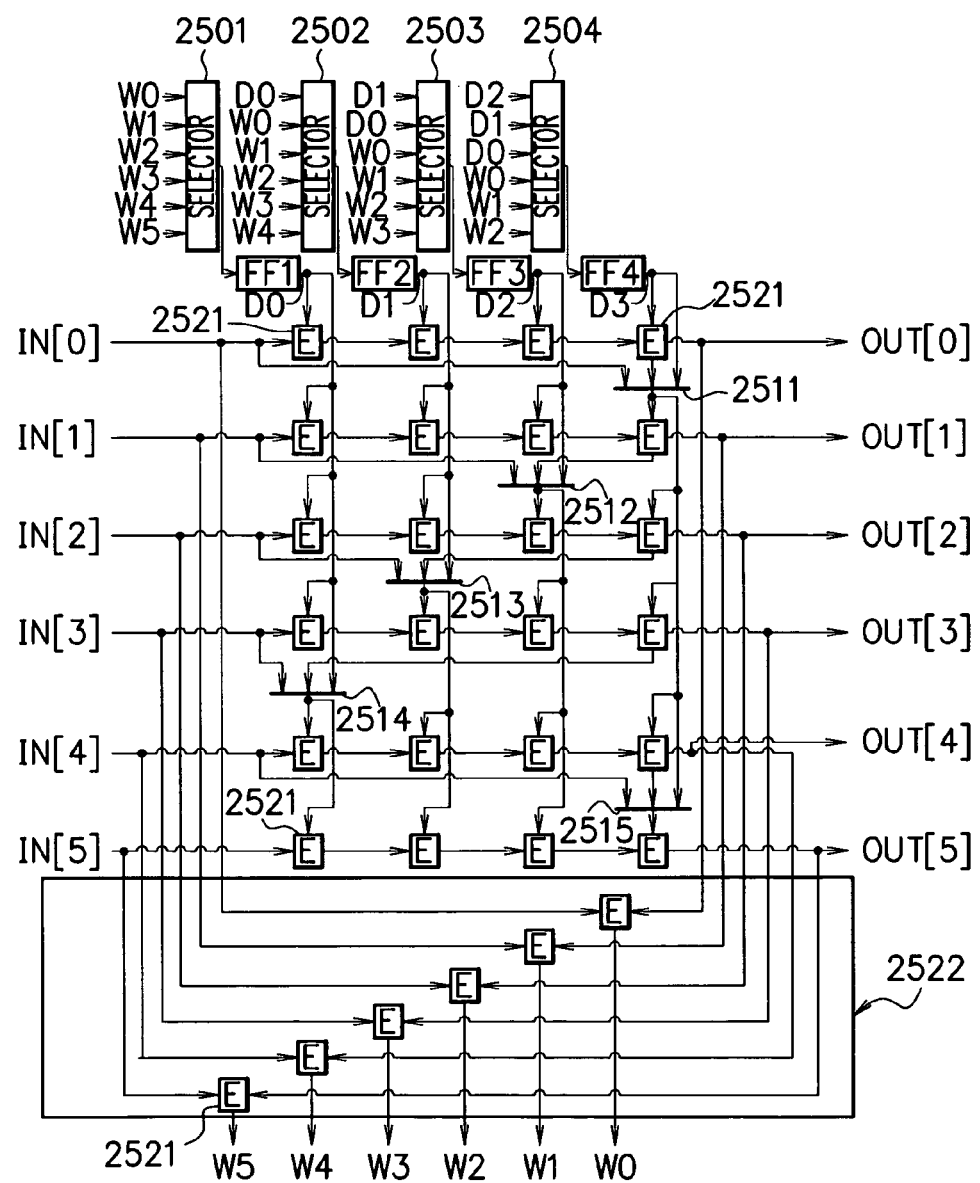
FIG. 25 is a diagram showing a constitution example of a computing element in FIG. 24.

FIG. 25 shows the same constitutional example of the computing elements 2401 and 2402 in FIG. 24, which simultaneously receives a plurality of bits and performs foresight processing of several shifts at one time. For example, the input signals IN[0] to IN[5] of six bits are inputted in parallel. The output signals of respective selectors 2501 to 2504 are inputted into the flip flops FF1 to FF4, respectively, and the flip flops FF1 to FF4 output signals D0 to D3. An E circuit 2521 has the constitution of FIG. 22B. The output signals OUT[0] to OUT[5] are output signals corresponding to the first to the sixth shifts, respectively. Signals W0 to W5 are outputted in a feedback circuit 2522.

The selector 2501 alternatively selects the signal W0, W1, W2, W3, W4 or W5 and outputs the result to the flip flop FF1. The selector 2502 alternatively selects the signal D0, W0, W1, W2, W3 or W4, and outputs the result to the flip flop FF2. The selector 2503 alternatively selects the signal D1, D0, W0, W1, W2 or W3, and outputs the result to the flip flop FF3. The selector 2504 alternatively selects the signal D2, D1, D0, W0, W1 or W2, and outputs the result to the flip flop FF4. The feedback circuit 2522 is not used when the convolution encoder in FIG. 23 is realized, and is used when the scramblers in FIG. 19B, FIG. 20B and FIG. 21B are realized.

In FIG. 23, the value the data stored in the flip flop at a certain position at a certain time has after being shifted once is simply the value which the flip flop at the previous stage holds and outputs at present. When the number of shifts, which are performed, is larger than the number of flip flops, the data shifted in at the oldest time, which the flip flop at the final stage has at this time, disappears, and is replaced with newly inputted data. Then, since the data result which the flip flop is supposed to have at each time is obtained, an EOR computation, namely, a convolution encode is performed thereafter in accordance with the placement of the EOR circuit in the tap position where the data exists.

Five selectors 2511 to 2515 are set to select the input signals IN[0] to IN[4], respectively in the case of the convolution encoder in FIG. 23. Seeing the relationship between each shift timing and the bit shifted in and shifted out in this timing, in the case of convolution coding rate of 1/M at the initial shift, by arranging M pieces of convolution computing elements 2401 and 2402 in FIG. 24, the convolution encode corresponding to the input signal IN can be simultaneously outputted by N bits at one shift-in. The input signal IN of N=6 bits is constituted of IN[0] to IN[5], and is simultaneously coded and outputted with the convolution encoder.

The presence or absence of the E circuit 2521 is determined by the constitution of the convolution operation that is desired to be realized. When the constitution in which the EOR circuits exist between all the flip flops included in the convolution encoder desired to be realized is taken, all the E circuits 2521 perform EOR computation.

In this case, the constitution with N=6 is adopted. When six bits are simultaneously outputted, the four selectors 2501 to 2504 select the sixth input from the top. Namely, they select W5, W4, W3 and W2 from the left. Input is performed for IN[0] to IN[5] with six bits as one set. By setting the selectors 2501 to 2504, the simultaneous output of 6 bits or less is possible. The outputs corresponding to the inputs of IN[0] to IN[5] are OUT[0] to OUT[5] respectively.

In order to realize the scrambler in FIG. 19B, the selectors 2511 to 2515 select and output the middle signal. In order to realize the scrambler in FIG. 20B, the selectors 2511 to 2515 select and output the right signal. In order to realize the scrambler in FIG. 21B, the selectors 2511 to 2515 select and output the left signal.

The conventional scrambler and convolution encoder perform serial processing of outputting one bit when receiving one bit. According to the semi-fixed circuit of this embodiment, a plurality of scramble processings and convolution encoder processings can be performed by providing the circuits for previously performing a plurality of shift processings instead of repeating one bit shift. The semi-fixed circuit of this embodiment can constitute a scrambler of an optional constitution for performing simultaneous processing of inputting a plurality of bits, and a convolution encoder of an optional constitution.

Eighth Embodiment

Figure 26:
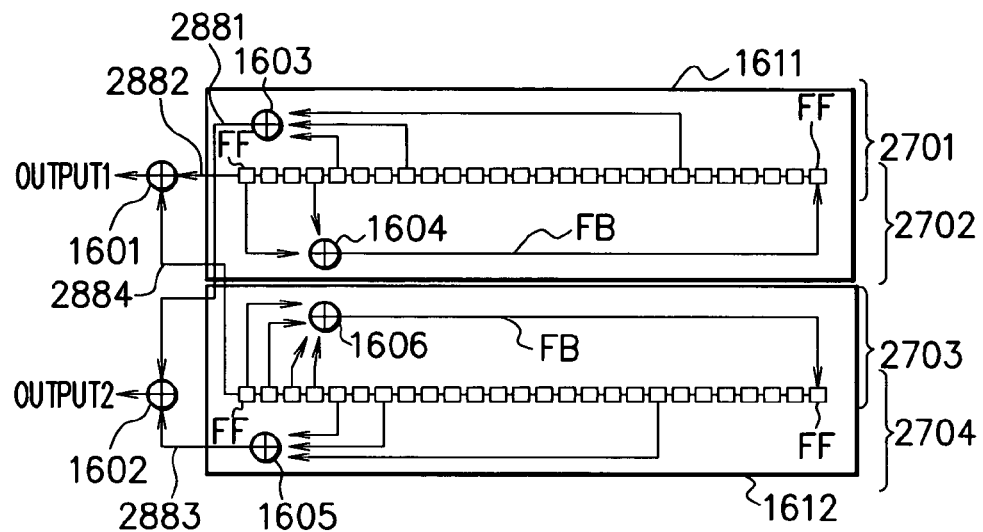
FIG. 26 is a diagram showing the linear feedback shift register (LFSR) of the W-CDMA standard in FIG. 16 divided into four computing elements.

FIG. 26 is a diagram showing that the linear feedback shift register (LFSR) of the W-CDMA standard in FIG. 16 is divided into four computing elements 2701 to 2704. The first circuit 1611 is divided into the computing elements 2701 and 2702. The computing element 2701 includes a plurality of flip flops FF and the EOR circuit 1603. The computing element 2702 includes a plurality of flip flops FF and the EOR circuit 1604. The second circuit 1612 is divided into the computing elements 2703 and 2704. The computing element 2703 includes a plurality of flip flops FF and the EOR circuit 1606. The computing element 2704 includes a plurality of flip flops FF and the EOR circuit 1605. The number of flip flops is, for example, 25. After the internal states of the flip flops are initially set, bit lines uniquely corresponding to the setting of the initial values are outputted in series.

Figure 27:
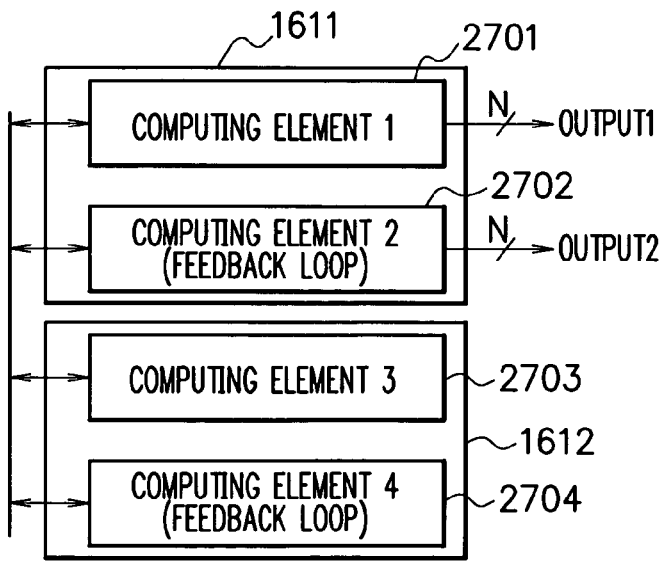
FIG. 27 is a diagram showing a constitution example of a LFSR capable of simultaneous batch processing of N bits.

FIG. 27 is a constitution example of an LFSR capable of simultaneous batch processing of N bits of the LFSR in FIG. 26. The first circuit 1611 has the first computing element 2701 and the second computing element 2702. The second circuit 1612 has he third computing element 2703 and the fourth computing element 2704. The first computing element 2701 and the third computing element 2703 perform the EOR computation of the internal states of the flip flops. The second computing element 2702 and the fourth computing element 2704 constitute a feedback loop to update the internal states of the flip flops. The first to the fourth computing elements 2701 to 2704 can input and output signals to each other. The first computing element 2701 outputs the output signal OUTPUT1 of N bits. The second computing element 2702 outputs the output signal OUTPUT2 of N bits. The first to the fourth computing elements 2701 to 2704 have the same constitutions.

Figure 28A:
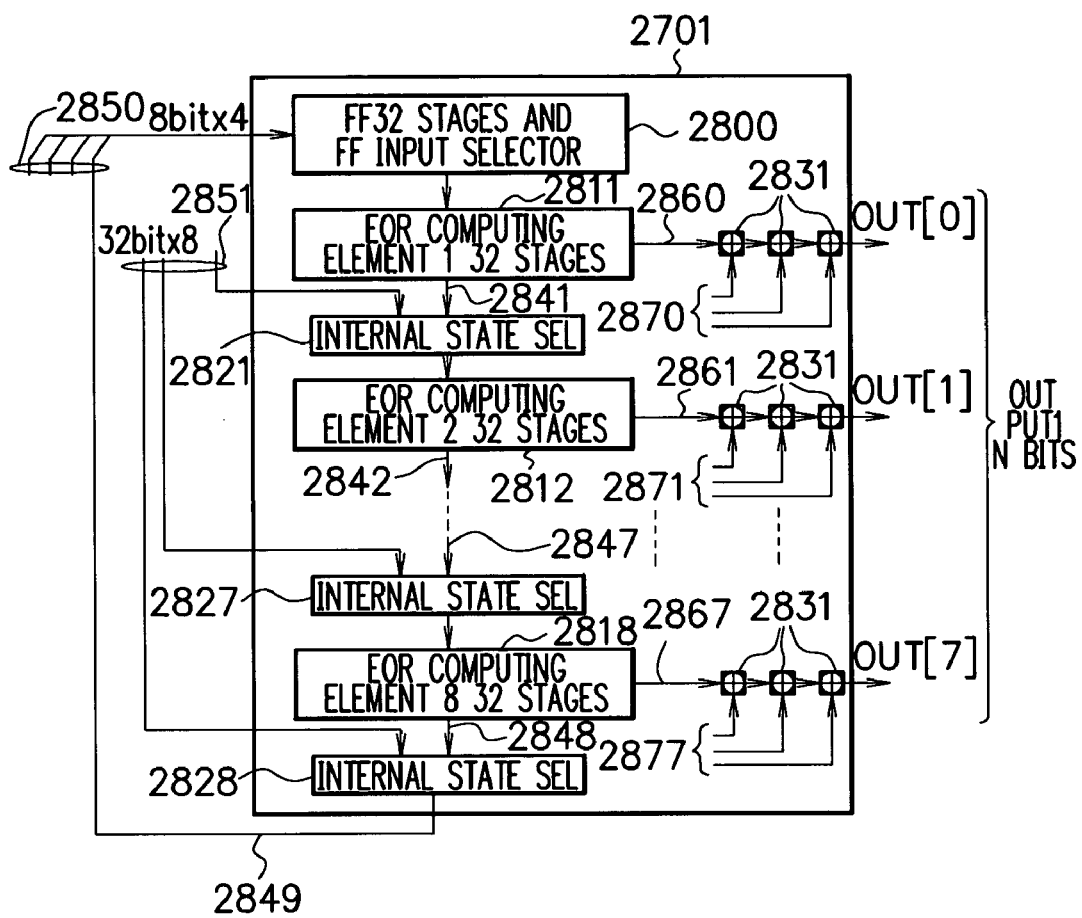
FIGS. 28A and 28B are diagrams showing constitution examples of a first computing element in FIG. 27.

FIG. 28A shows a constitution example of the first computing element 2701 in FIG. 27. A circuit 2800 includes 32 stages of flip flops and their input selectors (see FIG. 29), and receives a signal 2850. The signal 2850 includes a signal 2849, and is an 8×4-bit signal of the update values of the flip flops of the first to fourth computing elements. The signal 2849 is a signal of the update value of the flip flops of the first computing element 2701 outputted from an internal state selector 2828.

Figure 29:
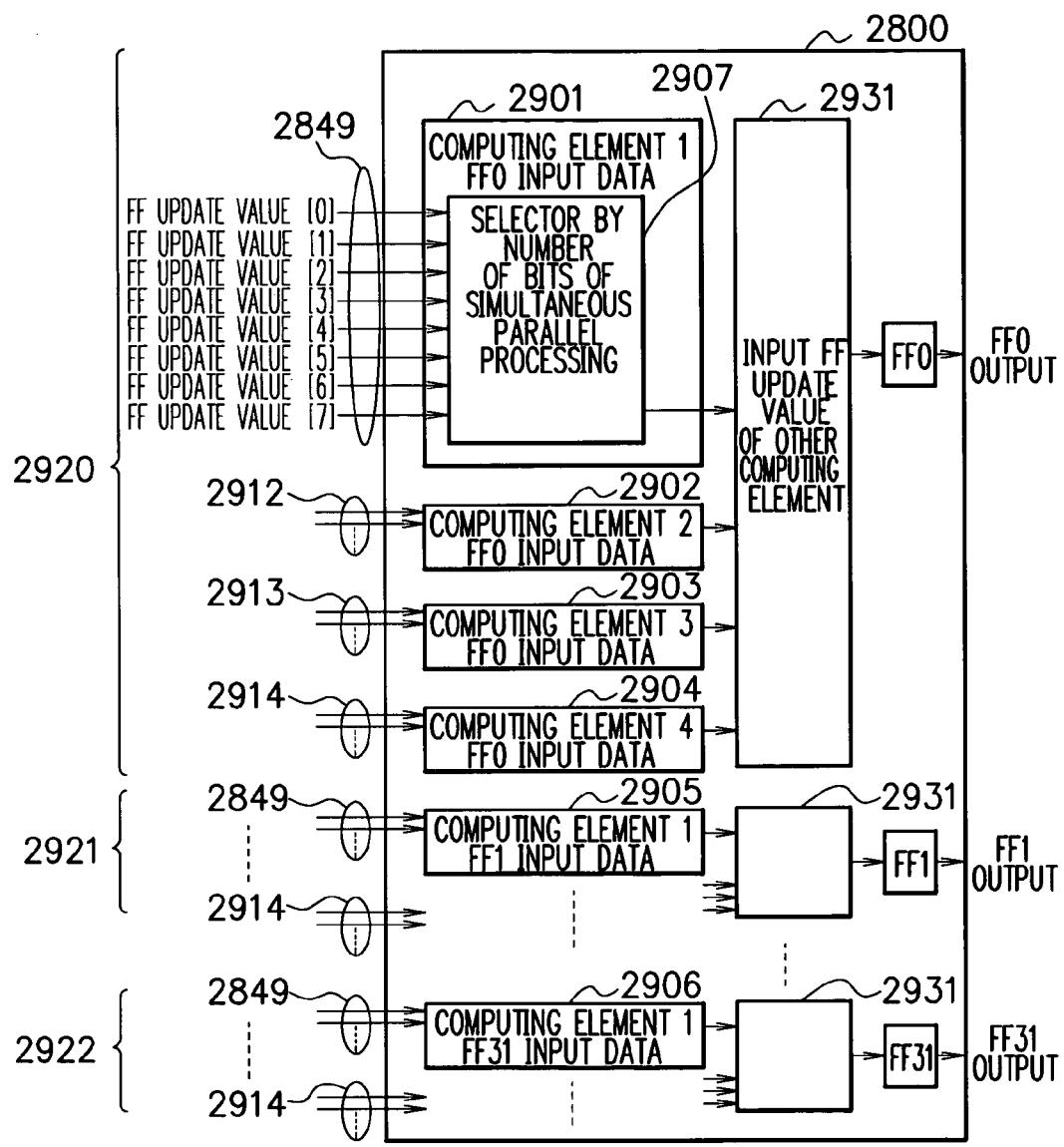
FIG. 29 is a diagram showing a constitution example of a circuit including 32 stages of flip flops and an input selector.

FIG. 29 shows a constitution example of the circuit 2800. A signal 2920 is an input signal to a selector relating to the flip flop FF0, and includes the signal 2849 from the first computing element, a signal 2912 from the second computing element, a signal 2913 from the third computing element and a signal 2914 from the fourth computing element. For example, the signal 2849 from the first computing element is a signal of eight bits indicating the update values of the flip flops. A circuit 2901 includes a selector 2907, and selects input data for the flip flop FF0 of the first computing element. The selector 2907 is an update value selector for the flip flop FF0, and performs selection by the number of bits of simultaneous parallel processing.

Similarly to the circuit 2901 for the first computing element, a circuit 2902 is a circuit for selecting input data for the flip flop FF0 of the second computing element, a circuit 2903 is a circuit for selecting input data for the flip flop FF0 of the third computing element, and a circuit 2904 is a circuit for selecting input data for the flip flop FF0 of the fourth computing element. The signals 2912 to 2914 are inputted into the circuits 2902 to 2904, respectively. A selector 2931 alternatively selects the output signals of the circuit 2901 to 2904, and outputs the signal to the flip flop FF0. The flip flop FF0 holds the signal and outputs it.

Similarly to the signal 2920, a signal 2921 is an input signal to a selector relating to the flip flop FF1, and a signal 2922 is an input signal to a selector relating to the flip flop FF31. Similarly to the circuit 2901, a circuit 2905 is a circuit for selecting input data for the flip flop FF1 of the first computing element, and a circuit 2906 is a circuit for selecting input data for the flip flop FF31 of the first computing element. The input data are also alternatively selected and inputted into the flip flops FF1 to FF31.

For eight-bit batch processing, in the circuit 2901, it is necessary to set the data of the eighth bit for the flip flop FF0 in the update value selector 2907 for the flip flop FF0, and therefore FF update value [7] is selected. For seven-bit batch processing, the upper FF update value [6] is selected, and in this way, the FF update value upper than the number of bits to be processed by batch is sequentially selected. It is necessary to set the initial values of the flip flops for the flip flops FF0 to FF31 separately before operation.

Figure 30:
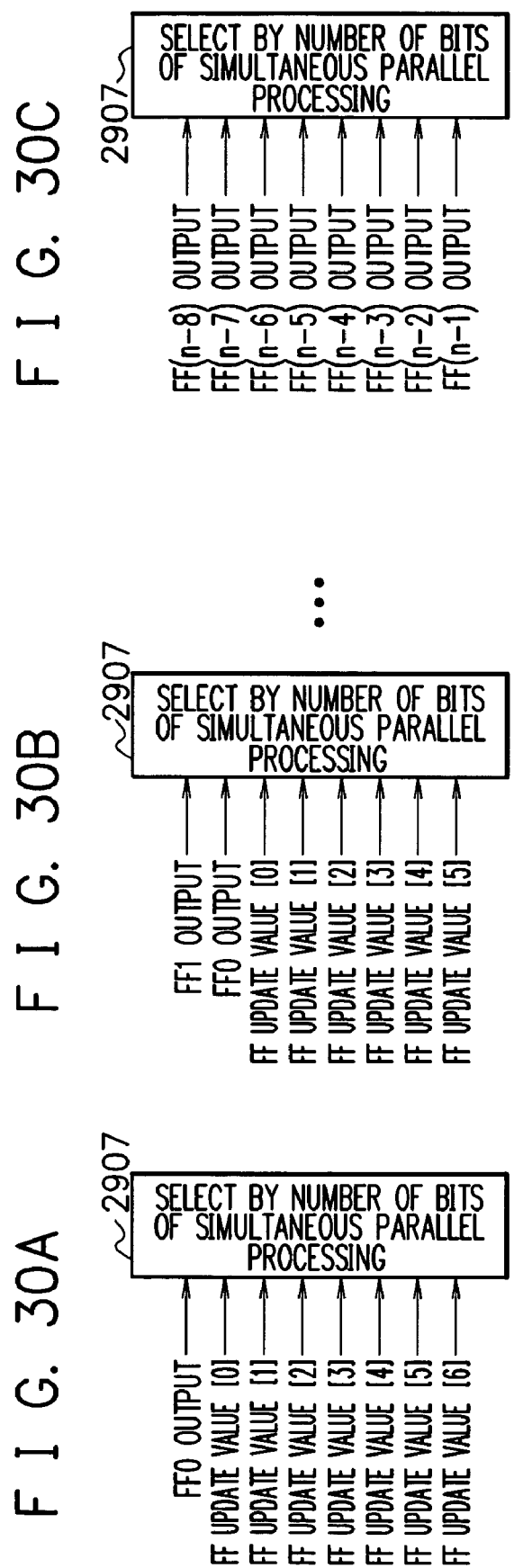
FIGS. 30A to 30C are diagrams showing constitution examples of the input selectors.

FIG. 30A shows the input selector 2907 for the flip flop FF1 in the circuit 2905. This selector makes selection from the output value of the flip flop FF0, and the FF update value [0] to FF update value [6] of seven bits.

FIG. 30B shows the input selector 2907 for the flip flop FF2. This selector makes selection from the output values of the flip flops FF1 and FF0, and the FF update value [0] to FF update value [5] of six bits.

FIG. 30C shows the input selector 2907 for the flip flop FFn. This selector makes selection from the output values of the flip flops FF (n-8)~FF (n-1).

Figure 28B:
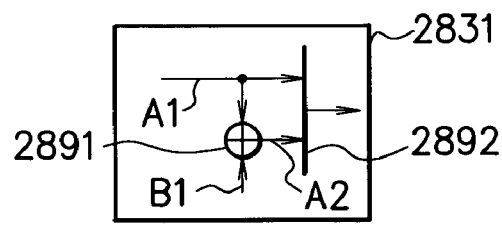
Figure 31:
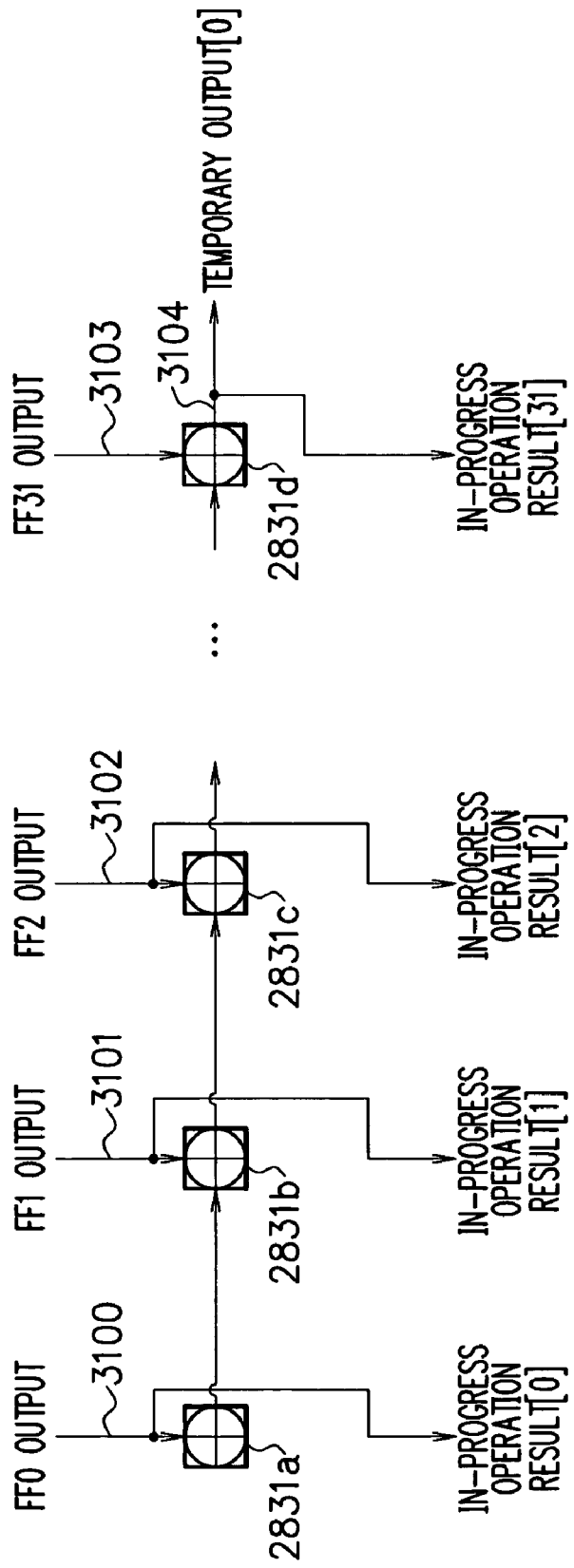
FIG. 31 is a diagram showing an internal constitution example of a first EOR computing element.

In FIG. 28A, a first EOR computing element 2811 has the selection EOR circuits 2831a to 2831d of 32 stages and the like as shown in FIG. 31. The selection EOR circuits 2831a to 2831d each have an EOR circuit 2891 and a selector 2892 as shown in FIG. 28B. The EOR circuit 2891 computes EOR of the input signals A1 and B1, and outputs the signal A2. The selector 2892 selects and outputs the signal A1 or the signal A2.

In FIG. 31, the selection EOR circuit 2831a receives an output signal 3100 of the flip flop FF0, and outputs it to a selection EOR circuit 2831b of the next stage. The signal 3100 is outputted to the internal state selector 2821 (FIG. 28A) as an in-progress operation result.

The selection EOR circuit 2831b receives an output signal 3101 of the flip flop FF1 and the output signal of the selection EOR circuit 2831a, and outputs the result to a selection EOR circuit 2831c of the next stage. The signal 3101 is outputted to the internal state selector 2821 (see FIG. 28A) as an in-progress operation result [1].

The selection EOR circuit 2831c receives an output signal 3102 of the flip flop FF2 and the output signal of the selection EOR circuit 2831b, and outputs the result to the selection EOR circuit of the next stage. The signal 3102 is outputted to the internal state selector 2821 (FIG. 28A) as an in-progress operation result [2].

The selection EOR circuit 2831d receives an output signal 3103 of the flip flop FF31 and an output signal of the selection EOR circuit of the previous stage, and outputs a signal 3104 as a temporary output [0]. The signal 3104 is outputted to the internal state selector 2821 (see FIG. 28A) as an in-progress operation result [31].

In the first EOR computing element 2811 (FIG. 28A), a signal 2860 of the temporary output [0] is valid. A signal 2841 of the in-progress operation results [0] to [31] is not valid. Instead, the signal 2841 of the in-progress operation results [0] to [31] of the second computing element 2702 in FIG. 27 becomes the input signal to a second EOR computing element 2812 of the next stage.

In FIG. 28A, the signal 2860 of the temporary output [0] of the first EOR computing element 2811 is outputted as the output signal OUT[0] via the three selection EOR circuits 2831. A signal 2870 of the temporary output [0] of the other computing element is inputted into the selection EOR circuit 2831.

The first EOR computing element 2811 outputs the in-progress operation result output signal 2841 of 32 bits to the internal state selector 2821. The internal state selector 2821 makes selection from the in-progress operation result output signals 2841 and 2851 of 32 bits, and outputs the result to the second EOR computing element 2812. The in-progress result output signal 2851 is an in-progress operation result output signal of the EOR computing element from the computing element set to have a feedback loop.

Figure 32:
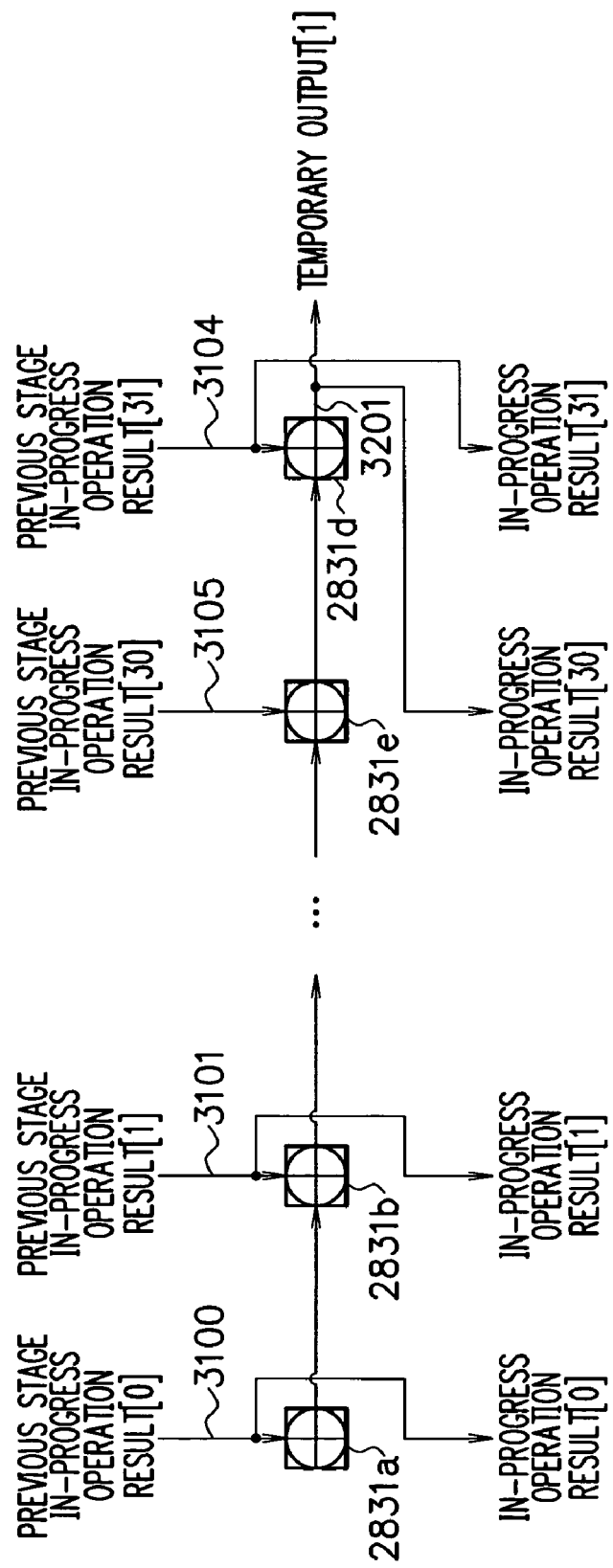
FIG. 32 is a diagram showing an internal constitution example of a second EOR computing element.

The second EOR computing element 2812 has a constitution shown in FIG. 32. The selection EOR circuit 2831a receives the signal 3100 of the in-progress operation result [0] of the previous stage, and outputs the signal to the selection EOR circuit 2831b of the next stage. The signal 3100 is outputted as the in-progress operation result [0].

The selection EOR circuit 2831b receives the signal 3101 of the in-progress result [1] of the previous stage and the output signal of the selection EOR circuit 2831a, and outputs to the selection EOR circuit of the next stage. The signal 3101 is outputted as the in-progress operation result [1].

The selection EOR circuit 2831e receives the signal 3105 of the in-progress operation result [30] of the previous stage and the output signal of the selection EOR circuit of the previous stage, and outputs to the selection EOR circuit 2831d of the next stage.

The selection EOR circuit 2831d receives the signal 3104 of the in-progress operation result [31] of the previous stage and the output signal of the selection EOR circuit 2831e of the previous stage, and outputs a signal 3201 as the temporary output [1]. The signal 3201 is outputted as an in-progress operation result [30], and the signal 3104 is outputted as an in-progress operation result [31]. Only one signal 3201 is put in the place of the in-progress operation result [31] when the number n of the nth EOR computing element is zero, only one signal 3201 is put in the place of the in-progress operation result [30] when the number n is 1, and only one signal 3201 is put in the place of the in-progress operation result [24] when the number n is 7.

In FIG. 28A, a signal 2861 of the temporary output [1] of the second EOR computing element 2812 is outputted as the output signal [1] via the three selection EOR circuits 2831. A signal 2871 of the temporary output [1] of the other computing element is inputted into the selection EOR circuits 2831. The second EOR computing element 2812 outputs an in-progress operation result signal 2842 of 32 bits.

Similarly, an internal state selector 2827 makes selection from the in-process operation result signals 2847 and 2851, and outputs to an eighth EOR computing element 2818. The eighth EOR computing element 2818 outputs a signal 2867 of a temporary output [7] and an in-progress operation result output signal 2848. The temporary output signal 2867 is outputted as an output signal OUT[7] via the three selection EOR circuits 2831. A signal 2877 of the temporary output [7] of the other computing element is also inputted into the selection EOR circuits 2831.

An internal state selector 2828 makes selection from the in-progress operation result output signals 2848 and 2851, and outputs the signal 2849 of the FF update value.

In this embodiment, the number of flip flops is 32, and N=8 bits. The output signal OUT[n] is an output of the n shift of the computing element. The first to the fourth computing elements can select the internal state signals of each other. Practically, it is suitable to transmit and receive the internal state signals between the first and the second computing elements, and between the third and the fourth computing elements.

Finally, the EOR of the outputs of the second and the forth computing elements is set as the output signal OUTPUT1. Accordingly, the EOR is taken inside the second computing element, and is set as the output signal OUTPUT1. Similarly, the EOR of the outputs of the first and the third computing elements is set as the output signal OUTPUT2. Accordingly, the EOR is taken inside the first computing element, and is set as the output signal OUTPUT2.

FIG. 33 shows a constitution example of a semi-fixed circuit according to this embodiment. This semi-fixed circuit can selectively realize the CRC circuit in FIG. 22, the convolution encoder in FIG. 25, the scramblers in FIG. 19B, FIG. 20B and FIG. 21B, and the LFSR in FIG. 27.

A first computing element 3301 receives the input signal IN of N bits, and outputs the output signal OUT1 of N bits. A second computing element 3302 receives the input signal IN of N bits, and outputs the output signal OUT2 of N bits. A third computing element 3303 receives the input signal IN of N bits, and outputs the output signal OUT3 of N bits. A fourth computing element 3304 receives the input signal IN of N bits, and outputs the output signal OUT4 of N bits. The first to the fourth computing elements 3301 to 3304 can receive and output the signals from and to each other. The first to the fourth computing elements 3301 to 3304 have the same constitutions.

Figure 34:
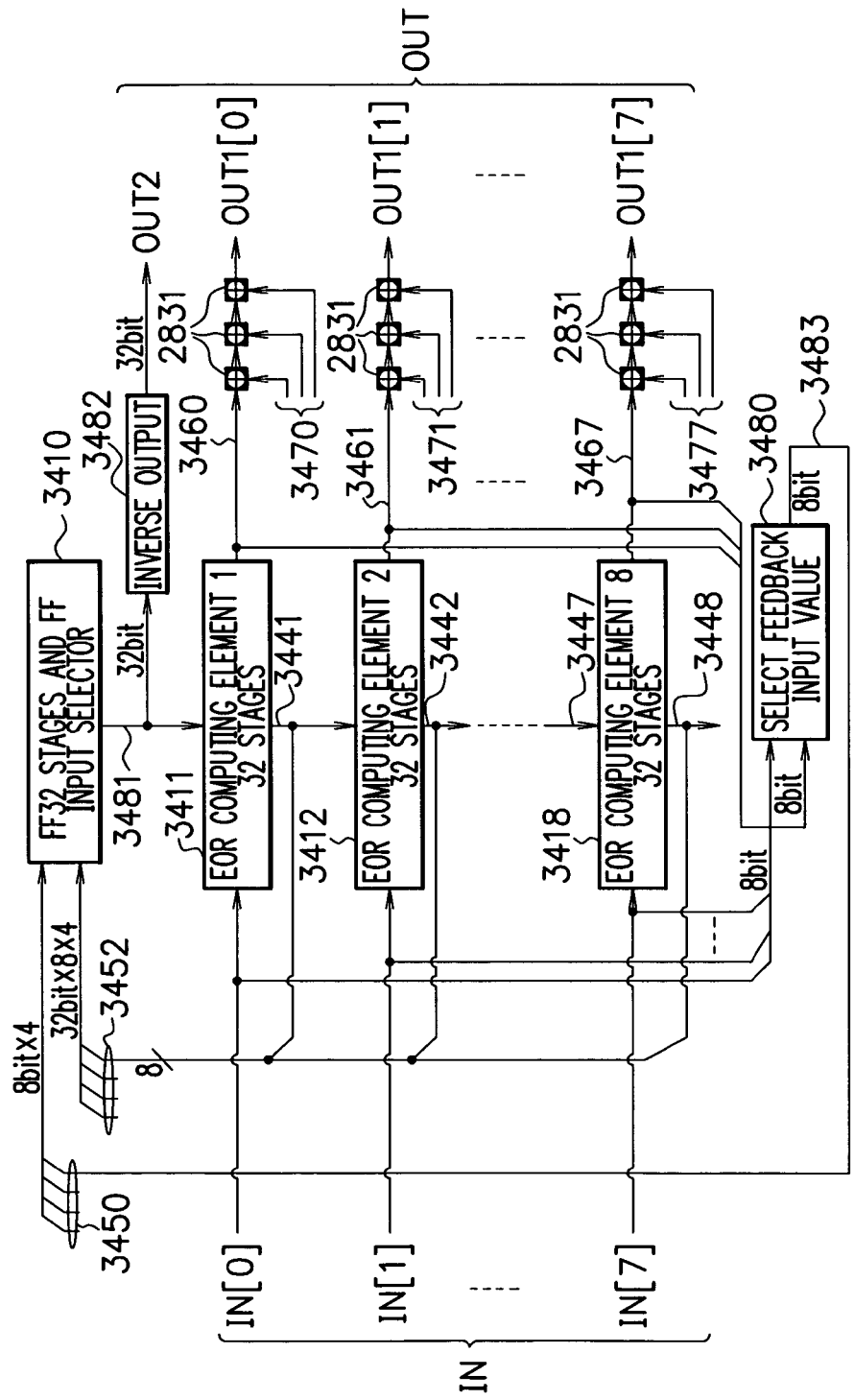
FIG. 34 is a diagram showing a constitution example of a first computing element in FIG. 33.

FIG. 34 shows a constitution example of the first computing element 3301 in FIG. 33. A circuit in FIG. 34 is basically the same as the circuit in FIG. 28A, and therefore the point in which it differs from the circuit in FIG. 28A will be explained. Though omitted in FIG. 34, the circuit in FIG. 34 is also provided with the signal 2851 in FIG. 28A, and the internal state selectors 2821 to 2828. A circuit 3410 corresponds to the circuit 2800 in FIG. 28A, and EOR computing elements 3411 to 3418 correspond to the EOR computing elements 2811 to 2818 in FIG. 28A.

The circuit 3410 receives signals 3450 and 3452, and outputs a signal 3481. The signal 3450 is a signal of 8×4 bits indicating the FF update values from the first to the fourth computing elements. The signal 3452 is an in-progress operation result output signal (32×8×4 bits) of the EOR computing elements from the first to the fourth computing elements. The signal 3481 is an output signal (32 bits) of the respective flip flops, and is inverted in an output inverting circuit 3482, and outputted as the output signal OUT2 of 32 bits.

The input signals IN[0] to IN[7] of eight bits are inputted. The first EOR computing element 3411 receives the signal 3481 and the input signal IN[0], and outputs a signal 3460 of the temporary output 1[0] and an in-progress operation result output signal (32 bits) 3441. The signal 3460 outputs the output signal OUT1[0] via the three selection EOR circuits 2831. A signal 3470 of the temporary output 1[0] of the other computing element is also inputted into the selection EOR circuits 2831.

The second EOR computing element 3412 receives the signal 3441 and the like and the input signal IN[1], and outputs a signal 3461 of the temporary output 1[1] and an in-progress operation result output signal (32 bits) 3442. The signal 3461 outputs the output signal OUT1[1] via the three selection EOR circuits 2831. A signal 3471 of the temporary output 1[1] of the other computing element is also inputted into the selection EOR circuits 2831.

The eighth EOR computing element 3418 receives a signal 3447 and the input signal IN[7], and outputs a signal 3467 of the temporary output 1[7] and an in-progress operation result output signal (32 bits) 3448. The signal 3467 outputs the output signal OUT1[7] via the three selection EOR circuits 2831. A signal 3477 of the temporary output 1[7] of the other computing element is also inputted into the selection EOR circuits 2831.

The in-progress operation result output signals 3441 to 3448 are fed back to the circuit 3410 as the signal 3452. A feedback input value selector 3480 receives the temporary output signals 3460 to 3467 of eight bits and the input signals IN[0] to IN[7] of eight bits, and outputs a signal 3483 indicating the FF update value of eight bits. The signal 3483 corresponds to the W0 to W5 in FIG. 25, and is fed back to the circuit 3410 as the as the signal 3450.

Figure 35:
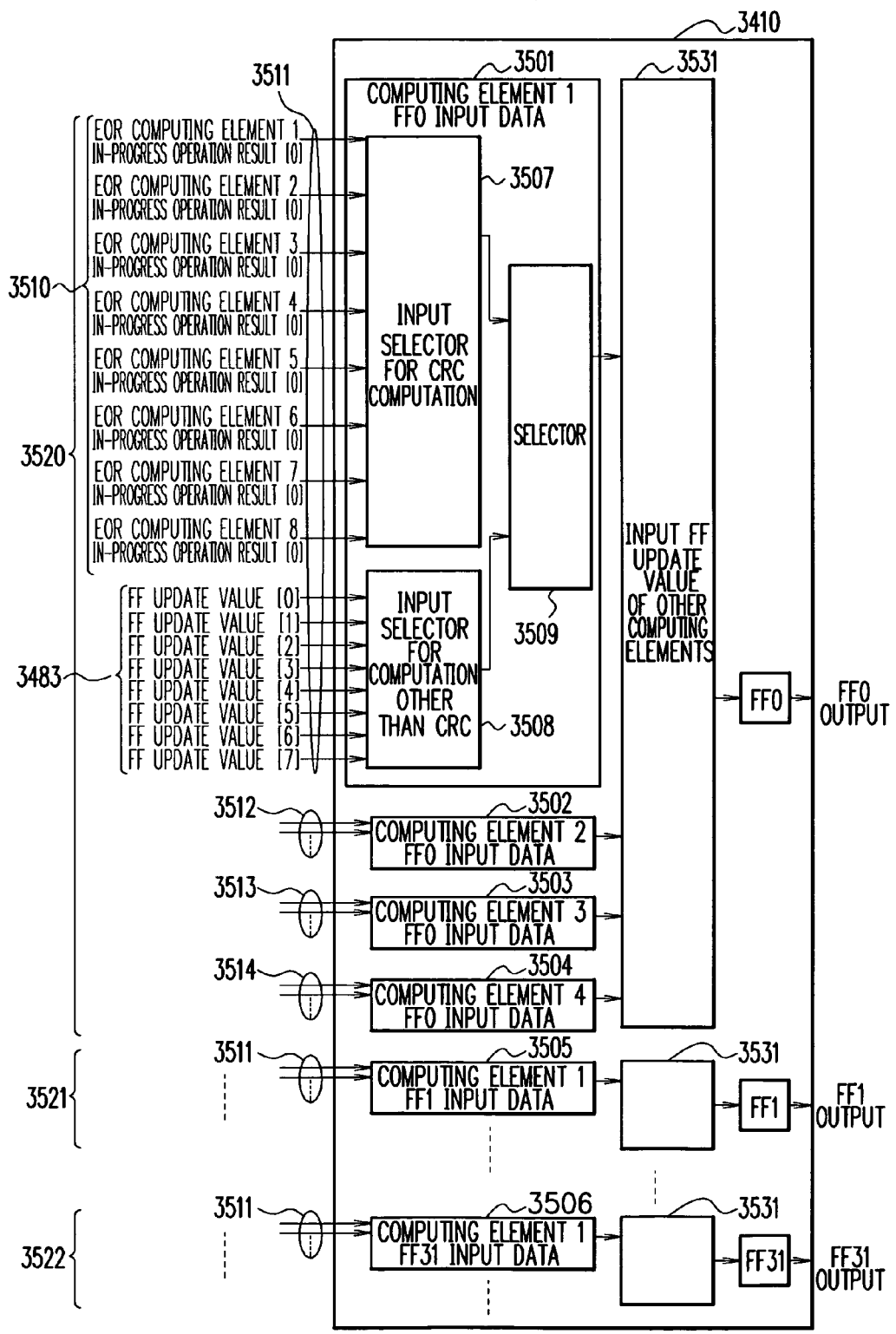
FIG. 35 is a diagram showing a constitution example of a circuit including 32 stages of flip flops and an input selector.

FIG. 35 shows a constitution example of the circuit 3410 in FIG. 34. Circuits 3501 to 3506 correspond to the circuits 2901 to 2906 in FIG. 29. A selector 3508 corresponds to the selector 2907 in FIG. 29, and a selector 3531 corresponds to the selector 2931 in FIG. 29.

A signal 3520 is an input signal to a selector relating to the flip flop FF0, and includes signals 3511 to 3514 of the first to the fourth computing elements. The signal 3511 of the first computing element includes signals 3510 and 3483. The signal 3510 is a signal of the in-progress operation results [0] of the first to the eighth EOR computing elements, and corresponds to the signal 3452 in FIG. 34. The signal 3483 is a signal indicating the FF update value [0] to the FF update value [7], and corresponds to the signal 3450 in FIG. 34.

A selector 3507 is an input selector for CRC computation, which makes selection from the signal 3510 and outputs the result. A selector 3508 is an input selector for computation other than CRC, which makes selection from the signal 3483 and outputs the result. A selector 3509 selects the output signal of the selector 3507 and outputs the result at the time of CRC processing, and selects the output signal of the selector 3508 and outputs the result at the time of the processing other than the CRC processing.

The circuit 3502 is a circuit for the input data of the flip flop Ff0 of the second computing element, and receives the signal 3512 of the second computing element. The circuit 3503 is a circuit for the input data of the flip flop FF0 of the third computing element, and receives the signal 3513 of the third computing element. The circuit 3504 is a circuit for the input data of the flip flop FF0 of the fourth computing element, and receives the signal 3514 of the fourth computing element. The selector 3531 selects the output signals of the circuits 3501 to 3504, and outputs the result to the flip flop 0. The operation of the LFSR is made possible by the function of this selector 3531.

A signal 3521 is an input signal to a selector relating to the flip flop FF1, and includes the signal 3511 of the first computing element. The circuit 3505 is a circuit for selecting the input data of the first computing element for the flip flop FF1, and receives the signal 3511.

A signal 3522 is an input signal to a selector relating to the flip flop FF31, and includes the signal 3511 of the first computing element. The circuit 3506 is a circuit for selecting the input data of the first computing element for the flip flop FF31, and receives the signal 3511.

The flip flops FF0 to FF31 hold the output signals of the selectors 3531 and output the signals.

FIG. 36A shows a constitution example of a CRC computation input selector 3507 for the flip flop FF1 in the circuit 3505 in FIG. 35. The selector 3507 makes selection from the in-progress operation results [1] of the first to the eighth EOR computing elements and outputs the result.

FIG. 36B shows a constitution example of a CRC computation input selector 3507 for the flip flop FF2 in FIG. 35. The selector 3507 makes selection from the in-progress operation results [2] of the first to the eighth EOR computing elements and outputs the result.

FIG. 36C shows a constitution example of a CRC computation input selector 3507 for the flip flop FFn in FIG. 35. The selector 3507 makes selection from the in-progress operation results [n] of the first to the eighth EOR computing elements and outputs the result.

FIG. 36D shows a constitution example of an input selector 3508 for computation other than CRC for the flip flop FF1 in the circuit 3505 in FIG. 35. The selector 3508 makes selection from the output value of the flip flop FF0, and the FF update value [0] to the FF update value [6], and outputs the result.

FIG. 36E shows a constitution example of the input selector 3508 for computation other than CRC for the flip flop FF2 in FIG. 35. The selector 3508 makes selection from the output values of the flip flops FF0 and FF1, and the FF update value [0] to the FF update value [5], and outputs the result.

FIG. 36F shows a constitution example of the input selector 3508 for computation other than CRC for the flip flop FFn in FIG. 35. The selector 3508 makes selection from the output values of the flip flops FF(n−8) to FF(n−1), and outputs the result.

When # in the parenthesis "FF(#) output" is negative, "FF (#) output" is replaced with the following signals.

In the case of "−1", FF update value [0]
In the case of "−2", FF update value [1]
In the case of "−3", FF update value [2]
In the case of "−4", FF update value [3]
In the case of "−5", FF update value [4]
In the case of "−6", FF update value [5]
In the case of "−7", FF update value [6]
In the case of "−8", FF update value [7]

Figure 37:
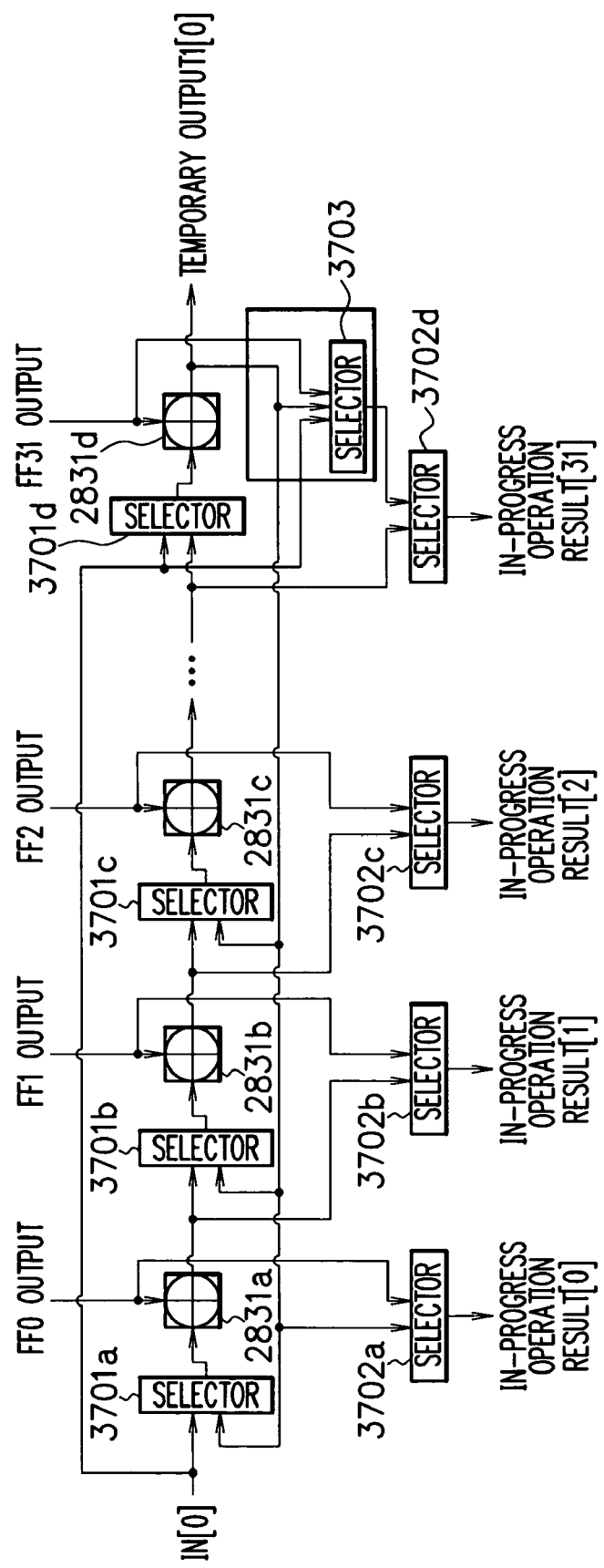
FIG. 37 is a diagram showing an internal constitution example of a first EOR computing element.

FIG. 37 shows a constitution example of the first EOR computing element 3411 in FIG. 34. The selection EOR circuits 2831a to 2831d each have the constitution shown in FIG. 28B. A selector 3701a receives the input signal IN[0] and the temporary output 1[0], and selectively output the result. The selection EOR circuit 2831a receives the output signal of the flip flop FF0 and the output signal of the selector 3701a, and outputs an output signal. A selector 3702a receives the temporary output 1[0] and the output signal of the flip flop FF0, and outputs the signal which it selects as an in-progress operation result [0].

A selector 3701*b* receives the output signal of the selection EOR circuit 2831*a* and the temporary output 1[0], makes selection, and outputs the result. The selection EOR circuit 2831*b* receives the output signal of the flip flop FF1 and the output signal of the selector 3701*b*, and outputs an output signal. A selector 3702*b* receives the output signal of the selection EOR circuit 2831*a* and the output signal of the flip flop FF1, and outputs the signal which it selects as an in-progress operation result [1].

A selector 3701*c* receives the output signal of the selection EOR circuit 2831*b* and the temporary output 1[0], makes selection, and outputs the result. The selection EOR circuit 2831*c* receives the output signal of the flip flop FF2 and the output signal of the selector 3701*c*, and outputs an output signal. A selector 3702*c* receives the output signal of the selection EOR circuit 2831*b* and the output signal of the flip flop FF2, and outputs the signal which it selects as an in-progress operation result [2].

A selector 3701*d* receives the input signal IN[0] and the output signal of the selection EOR circuit of the previous stage, makes selection and outputs the result. The selection EOR circuit 2831*d* receives the output signal of the flip flop FF31 and the output signal of the selector 3701*d*, and outputs the temporary output 1[0]. A selector 3703 receives the input signal IN[0], the temporary output 1[0] and the output signal of the flip flop FF31, makes selection, and outputs the result. A selector 3702*d* receives the output signal of the selection EOR circuit of the previous stage and the output signal of the selector 3703, and outputs the signal which it selects as an in-progress operation result [31].

Figure 38:
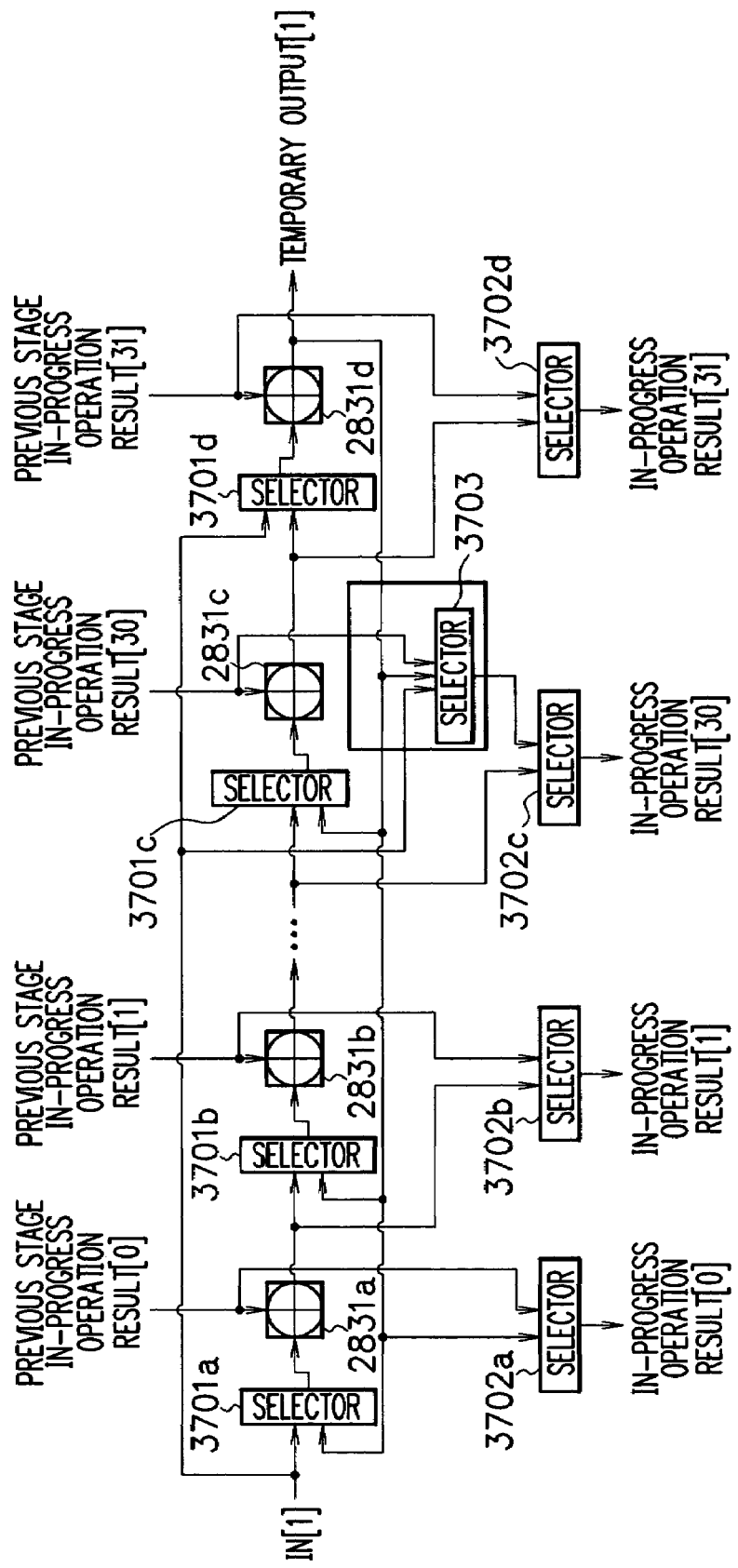
FIG. 38 is a diagram showing an internal constitution example of a second EOR computing element.

FIG. 38 shows a constitution example of the second EOR computing element 3412 in FIG. 34. The selection EOR circuits 2831*a* to 2831*d* each have the constitution shown in FIG. 28B. The selector 3701*a* receives the input signal IN[1] and the temporary output 1[1], makes selection, and outputs the result. The selection EOR circuit 2831*a* receives the in-progress operation result [0] of the previous stage and the output signal of the selector 3701*a*, and outputs an output signal. The selector 3702*a* receives the temporary output 1[1] and the in-progress operation result [0] of the previous stage, and outputs the signal which it selects as the in-progress operation result [0].

The selector 3701*b* receives the output signal of the selection EOR circuit 2831*a* and the temporary output 1[1], makes selection, and outputs the result. The selection EOR circuit 2831*b* receives the in-progress operation result [1] of the previous stage and the output signal of the selector 3701*b*, and outputs an output signal. The selector 3702*b* receives the output signal of the selection EOR circuit 2831*a* and the in-progress operation result [1] of the previous stage, and outputs the signal which it selects as the in-progress operation result [1].

The selector 3701*c* receives the output signal of the selection EOR circuit of the previous stage and the temporary output 1[1], makes selection, and outputs the result. The selection EOR circuit 2831*c* receives the in-progress operation result [30] of the previous stage and the output signal of the selector 3701*c*, and outputs an output signal. The selector 3703 receives the input signal IN[1], the temporary output 1[1], and the in-progress operation result [30] of the previous stage, makes selection, and outputs the result. The selector 3702*c* receives the output signal of the selection EOR circuit of the previous stage and the output signal of the selector 3703, and outputs a signal which it selects as the in-progress result [30].

The selector 3701*d* receives the input signal IN[1] and the output signal of the selection EOR circuit 2831*c*, makes selection, and outputs the result. The selection EOR circuit 2831*d* receives the in-progress operation result [31] of the previous stage and the output signal of the selector 3701*d*, and outputs the temporary output 1[1]. The selector 3702*d* receives the output signal of the selection EOR circuit 2831*c* and the in-progress operation result [31] of the previous stage, and outputs the signal which it selects as the in-progress operation result [31].

When the input signal of the EOR computing element is IN[0], only one selector 3703 is interposed in the place of the in-progress operation result [31], when the input signal of the EOR computing element is IN[1], it is interposed in the place of the in-progress operation result [30], and when the input signal of the EOR computing element is IN[7], it is interposed in the place of the in-progress operation result [24].

Summarizing the constitution up to here, the semi-fixed circuit in FIG. 33 is the circuit in which four of the circuits in FIG. 34 are arranged. In FIG. 34, the output signals OUT1[0] to [7] are the outputs of the scrambler, the CRC circuit, the convolution encoder and the LFSR. The output signal OUT2 is the bit inverting output of the CRC circuit. It is necessary to output a signal by inverting the output depending on the specification of the CRC circuit, and therefore it is made possible to handle such a case with the output inverting circuit 3482.

A valid output range will be explained. All the data is valid for the input in the scrambler, the convolution coder and the LFSR. However, in the CRC circuit, the output of all the memory is valid at the point of time of completion of input of a fixed bit string, which is the length of a generating polynomial expression. Conversely, the output is invalid until the previously determined bit string is inputted. For example, in the case of the CRC circuit of 16 bits, the output becomes valid at the point of time when the input of 16 bits is entered into 16 memories in 16 clocks.

The conventional linear feedback shift register and the like perform serial processing in which when one bit is inputted, one bit is outputted. According to this embodiment, the circuits which perform foresight processing of a plurality of shifts ahead instead of the shift computation for each bit are constituted to be one semi-fixed circuit, and the switching of the processing is performed by the selectors, whereby the scrambler, convolution encoder, CRC circuit, and LFSR can be realized.

Ninth Embodiment

Figure 39:
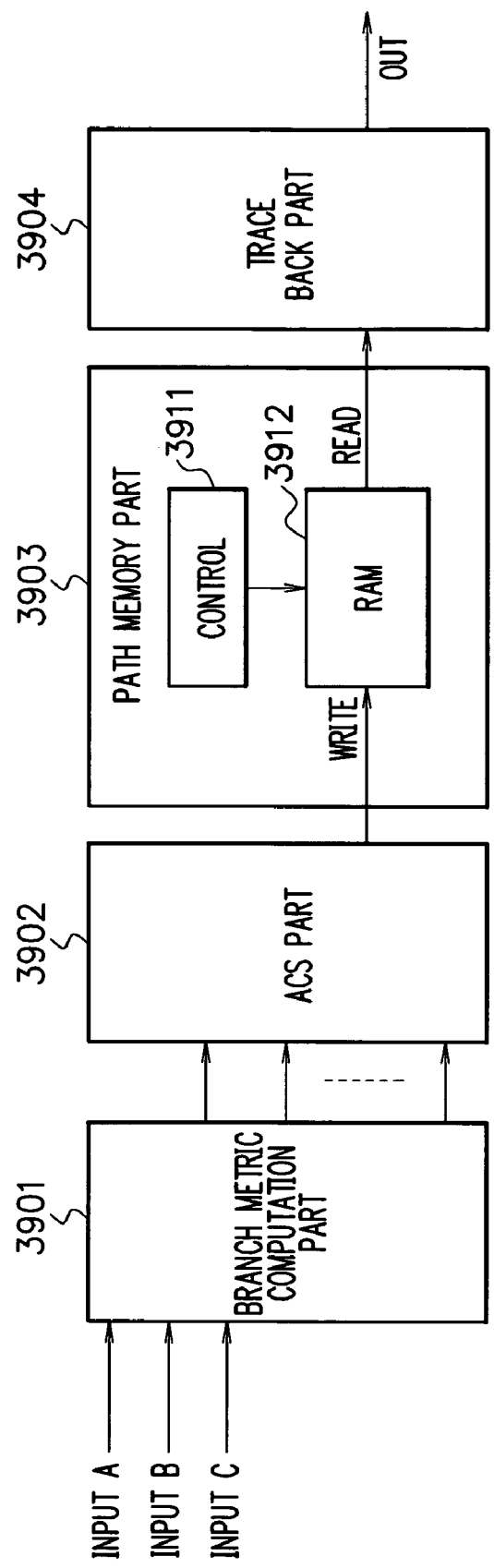
FIG. 39 is a diagram showing a constitution example of a semi-fixed circuit according to a ninth embodiment of the present invention.

FIG. 39 shows a constitution example of a semi-fixed circuit according to the ninth embodiment of the present invention. This semi-fixed circuit can realize a plurality of kinds of viterbi decoders 117 (FIG. 1B). Branch metric operation part 3901 receives input signals A to C, and calculates branch metrics (Hamming distance of a codeword) in a trellis diagram. An ACS part 3902 obtains a path metric for each step of the trellis diagram based on the branch metrics, and a survival path and its path metric value are written out to a path memory part 3903. The path memory part 3903 has a control part 3911 and a RAM 3912. The control part 3911 writes data inputted from the ACS part 3902 into the RAM 3912, and reads data in the RAM 3912 out to a trace back part 3904. The trace back part 3904 traces back to obtain a shortest path metric when the input signal is performed certain fixed times (or, when a dummy bit interposed for termination of coding is inputted). The path metric is expressed by connection of the branch metrics. The shortest path metric can be decoded as a signal of a right codeword.

The branch metric operation part 3901 and the ACS part 3902 will be explained specifically as the viterbi decoder corresponding to the coding rates of S/T=1/2, and 1/3 as an example. A denominator T corresponds to the number of signals for input, and a numerator S corresponds to the number of signals for output. IF the T desired to be used is three, three (A, B, C) signals are needed to be inputted.

FIG. 40 shows a constitution example of a branch metric operation part 3901 corresponding to the coding rates of 1/2 and 1/3. An adder 4001 adds the input signals A and B, and outputs a signal BM00. The signal BM00 indicates branch metric values (Hamming distances) of the input signals B and A, and a codeword "00". An adder 4002 adds an inverted value of the input signal A and the input signal B, and outputs a signal BM01. The signal BM01 indicates branch metric values of the input signals B and A, and a codeword "01". An adder 4003 adds the input signal A and an inverted value of the input signal B, and outputs a signal BM10. The signal BM10 indicates branch metric values of the input signals B and A, and a codeword "10". An adder 4004 adds the inverted value of the input signal A and the inverted value of the input signal B, and outputs a signal BM11. The signal BM11 indicates branch metric values of the input signals B and A, and a codeword "11". In the case of the coding rate of 1/2, selectors 4021 to 4024 select four branch metric signals BM00, BM01, BM10 and BM11, and output them as signals BM000, BM001, BM010 and BM011.

Next, the case with the coding rate of 1/3 will be explained. An adder 4011 adds the signal BM00 and the input signal C, and outputs the signal BM000 via the selector 4021. The signal BM000 indicates branch metric values of the input signals C, B and A, and a codeword "000". An adder 4012 adds the signal BM00 and the inverted value of the input signal C, and outputs a signal BM100. The signal BM100 indicates branch metric values of the input signals C, B and A, and a codeword "100".

An adder 4013 adds the signal BM01 and the input signal C, and outputs the signal BM001 via the selector 4022. The signal BM001 indicates branch metric values of the input signals C, B and A, and a codeword "001". An adder 4014 adds the signal BM01 and the inverted value of the input signal C, and outputs a signal BM101. The signal BM101 indicates branch metric values of the input signals C, B and A, and a codeword "101".

An adder 4015 adds the signal BM10 and the input signal C, and outputs the signal BM010 via the selector 4023. The signal BM010 indicates branch metric values of the input signals C, B and A, and a codeword "010". An adder 4016 adds the signal BM10 and the inverted value of the input signal C, and outputs a signal BM110. The signal BM110 indicates a branch metric values of the input signals C, B and A, and a codeword "110".

An adder 4017 adds the signal BM11 and the input signal C, and outputs the signal BM011 via the selector 4024. The signal BM011 indicates branch metric values of the input signals C, B and A, and a codeword "011". An adder 4018 adds the signal BM11 and the inverted value of the input signal C, and outputs a signal BM111. The signal BM111 indicates branch metric values of the input signals C, B and A, and a codeword "111".

The selectors 4021 to 4024 makes selective output in accordance with the selection signals of the coding rate. The number of all patterns of taking branch metrics is the $T^{th}$ power of 2. In the branch metric operation part 3901, all the branch metrics are previously calculated to correspond to the coding rate, and outputs them to the ACS part 3902. In FIG. 40, two coding rates of 1/2 and 1/3 are handled, and therefore many outputs are made. In order to prevent this, when T is 2, BM00, BM01, BM10 and BM11 are outputted as the BM000, BM001, BM010 and BM011.

Figure 41:
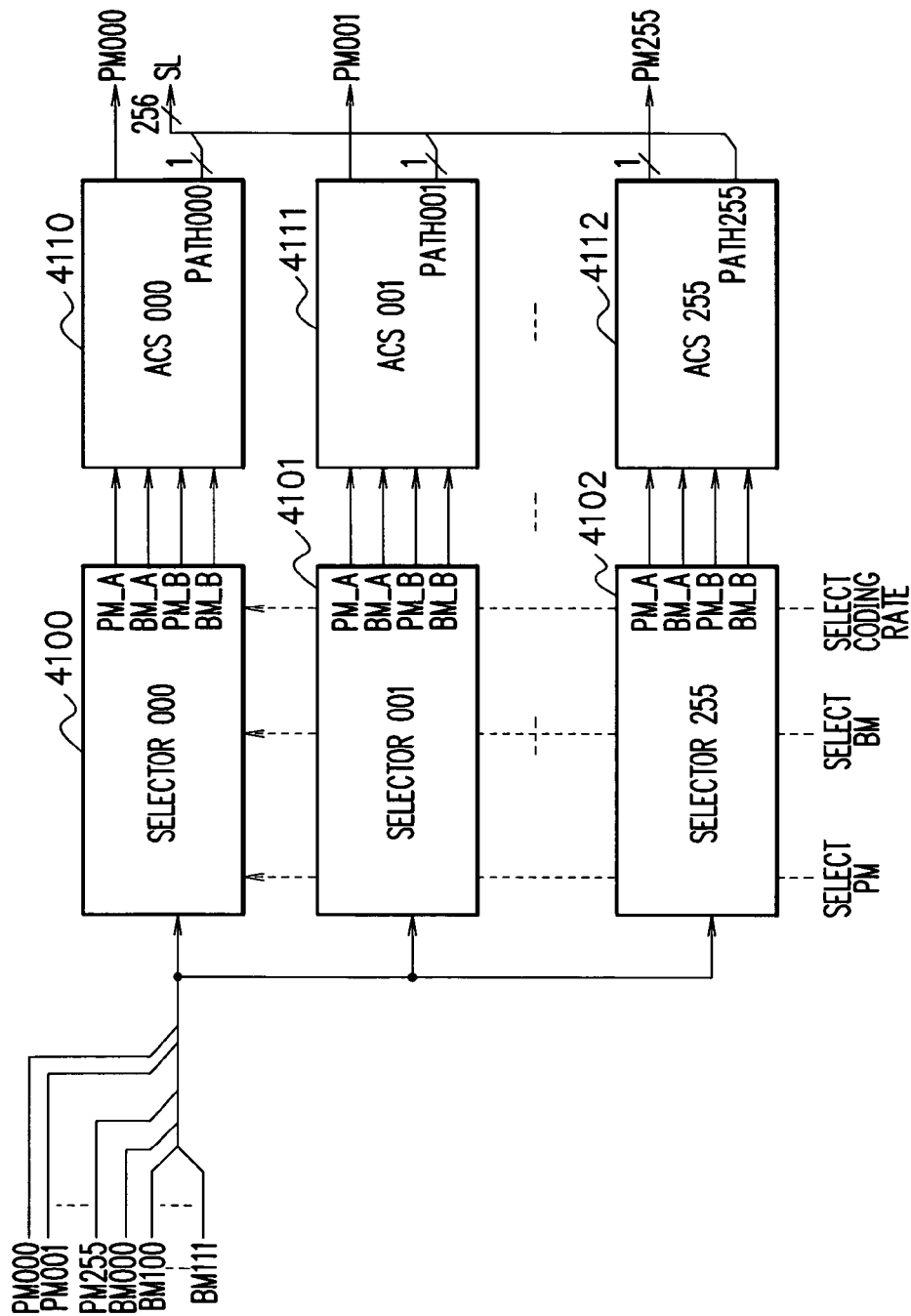
FIG. 41 is a diagram showing a constitution example of an ACS part.

FIG. 41 shows a constitution example of the ACS part 3902. The eight branch metric signals BM000 to BM111 and 256 path metric signals PM000 to PM255 are inputted into 256 selectors 4100 to 4102 and the like. The 256 selectors 4100 to 4102 make selection in accordance with the PM selection signal, the BM selection signal and the coding rate selection signal, and output path metric signals PM_A and PM_B and branch metric signals BM_A and BM_B. 256 ACSs 4110 to 4112 and the like receive the path metric signals PM_A and PM_B and branch metric signals BM_A and BM_B, then perform addition, comparison and selection, and output the path metric signals PM000 to PM255 and selected paths PATH000 to PATH255 as survival paths SL.

Figure 42:
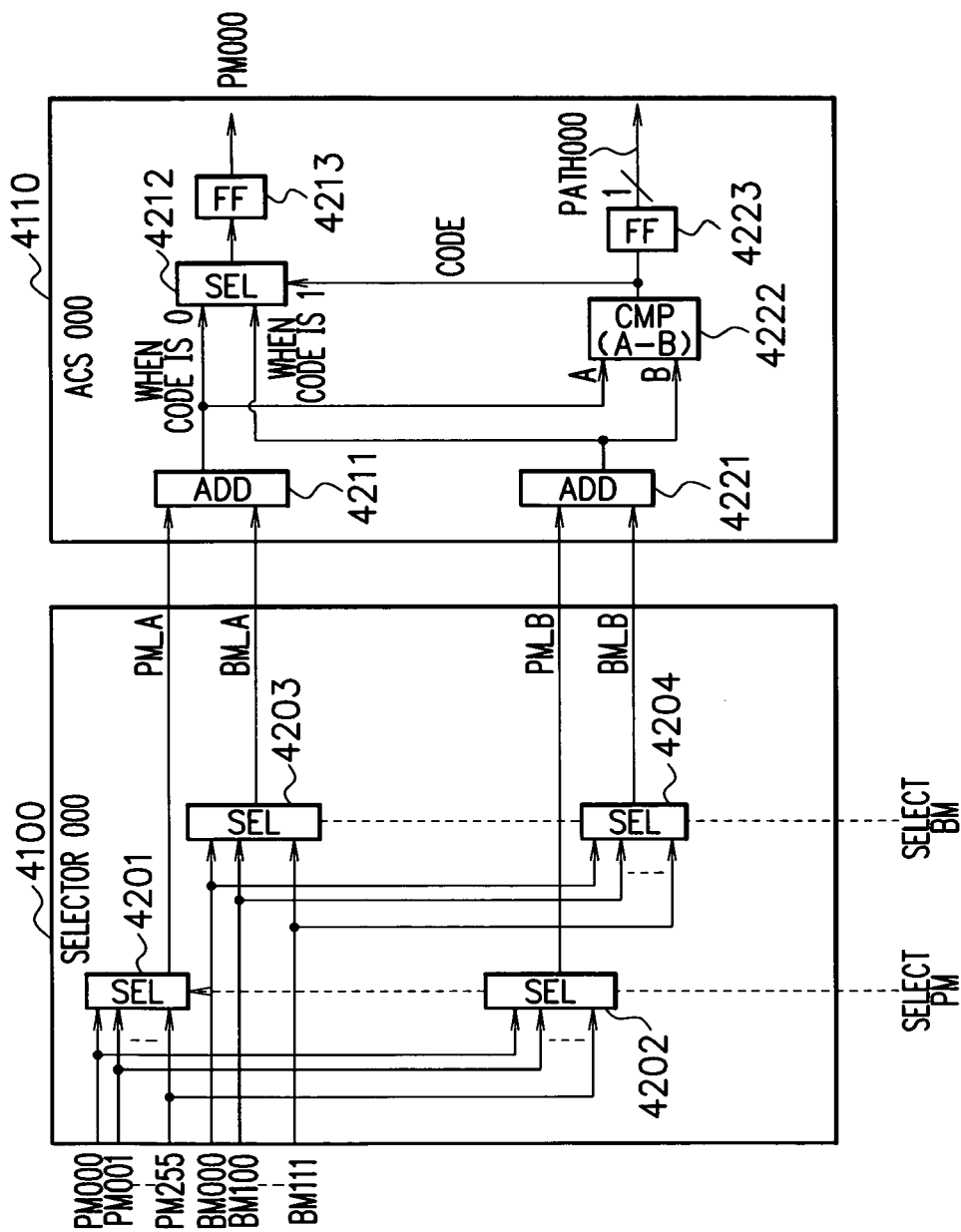
FIG. 42 is a diagram showing a constitution example of a selector and an ACS.

FIG. 42 shows a constitution example of the selector 4100 and the ACS 4110. First, the selector 4100 will be explained. A selector 4201 selects one of the path metric signals PM000 to PM255 in accordance with the PM selection signal and the coding rate selection signal, and outputs the signal as the signal PM_A. A selector 4202 also selects one of the path metric signals PM000 to PM255 in accordance with the PM selection signal and the coding rate selection signal, and outputs the signal as the signal PM_B. A selector 4203 selects one of the branch metric signals BM000 to BM111 in accordance with the BM selection signal and the coding rate selection signal, and outputs the signal as the signal BM_A. A selector 4204 also selects one of the branch metric signals BM000 to BM111 in accordance with the BM selection signal and the coding rate selection signal, and outputs the signal as the signal BM_B.

Next, an ACS 4110 will be explained. An adder 4211 adds the signals PM_A and BM_A, and outputs a path metric at the time when the code is 0. An adder 4221 adds the signals PM_B and BM_B, and outputs a path metric at the time when the code is 1. A comparator 4222 subtracts the output signal of the adder 4221 from the output signal of the adder 4211, and outputs the code to a selector 4212 and a flip flop 4223. The selector 4212 selects the output signal of the adder 4211 or 4221 in accordance with the code, and outputs it to a flip flop 4213. Namely, the selector 4212 selects a smaller path metric, and outputs it. The flip flop 4213 stores the path metric PM 000 and outputs it. The flip flop 4223 stores the code and outputs the selected path PATH000.

The ACS part can respond to the maximum number of states 256 (000 to 256). The 256 selectors 000 to 255 in the ACS part each select (the PM selection, the BM selection and the coding rate selection) what is needed for each state (000 to 255) from the output of the branch metric operation part 3901, and outputs it to the corresponding ACSs 000 to 255.

Three circuit settings (PM selection, BM selection and coding rate selection) are uniquely determined when the configuration of the convolution encoder 102 (FIG. 1A) for creating and outputting the coding data (the input signals A, B and C in FIG. 39). To calculate the path metric PM000 in the next step, which is the output, and the selected (surviving) path information PATH, two pairs of path metrics and branch metrics (two pairs of PM_A, BM_A, and PM_B, BM_B) are required when the numerator S of the coding rate=1. Generalizing this, it is suitable to prepare 2 raised to the $S^{th}$ power of pairs of path metrics and branch metrics for one ACS.

If two sets with the numbers of states being 64 and 256 with the coding rates to be used of S1/T1=1/2, and S2/T2=1/3 are considered, 256 of inputs of the selectors 4201, 4202, 4203 and 4204 are not needed. ((2 raised to the $S1^{th}$ power)+(2 raised to the $S2^{th}$ power))×2 sets=8 is sufficient. If two sets with the numbers of states being 64 and 256 with the coding rates to be used of S1/T1=1/2, S2/T2=1/3 and S3/T3=2/3 are considered, ((2 raised to the S1$^{th}$ power)+(2 raised to the S2$^{th}$ power)+(2 raised to the S3$^{th}$ power))×2 sets=16 is sufficient.

As described above, in the viterbi decoder dependent on the parameters such as the coding rate and the number of states, the number of states previously determined at the time of designing are prepared, then the way of taking (selection) of the path metrics and the branch metrics corresponding them is fixed, and thereafter the wiring information is determined to form the circuit. However, in the semi-fixed circuit in this embodiment, the selection of the path metrics and branch metrics can be given a degree of freedom by changing setting of the selectors (existing inside the branch metric operation part and the ACS part) previously prepared in hardware, and the convolution codes of all the coding rates and the numbers of states can be decoded with one viterbi decoder.

Tenth Embodiment

Figure 43A:
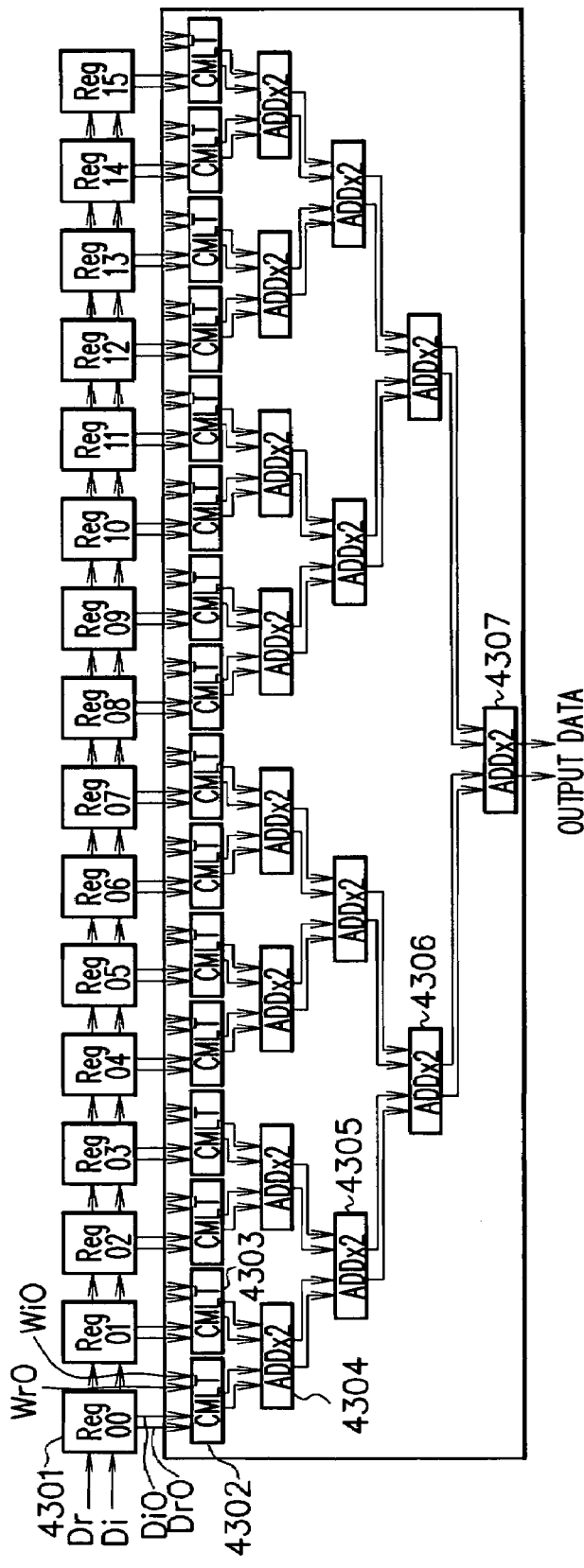
FIGS. 43A and 43B are diagrams showing constitution examples of a matched filter.

FIG. 43A shows a constitution example of the matched filter 113 in FIG. 1B. This matched filter has, for example, 16 taps, and 16 delay element resistors 4301. Real number component data Dr and imaginary number component data D1 are inputted into the 16 registers 4301 (Reg00 to Reg15) as input data. The register Reg00 outputs a real number component data Dr0 and an imaginary number component data Di0 to a complex multiplication circuit 4302. The complex multiplication circuit 4302 has a constitution in FIG. 43B, and receives the input data Dr0 and Di0 and coefficients Wr0 and Wi0 to perform complex multiplication. The coefficient Wr0 is a real number component, and the coefficient Wi0 is an imaginary number component.

Figure 43B:
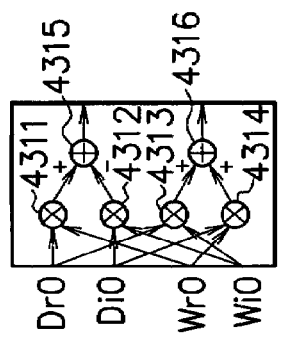

In FIG. 43B, the complex multiplication circuit 4302 has four multipliers 4311 to 4314 and two adders 4315 and 4316. The multiplier 4311 multiplies the real number component data Dr0 and the real number component coefficient Wr0, and outputs the result. The multiplier 4312 multiplies the imaginary number component data Di0 and the imaginary number component coefficient Wi0, and outputs the result. The multiplier 4313 multiplies the real number component data Dr0 and the imaginary number component coefficient Wi0, and outputs the result. The multiplier 4314 multiplies the imaginary number component data Di0 and the real number component coefficient Wr0, and outputs the result. The adder 4315 gives a plus sign to the output of the multiplier 4311, gives a minus sign to the output of the multiplier 4312, then adds both of them and outputs the result. The adder 4316 gives a plus sign to the output of the multiplier 4313, gives a plus sign to the output of the multiplier 4314, then adds both of them and outputs the result.

In FIG. 43A, a complex multiplication circuit 4303 also receives input data Dr1 and Di1 and coefficients Wr1 and Wi1, and performs complex multiplication. An adder group 4304 has two adders, and adds corresponding components of the outputs of two complex multiplication circuits 4302 and 4303 to output the result. An adder group 4305 has two adders, which add corresponding components of the outputs of the adjacent two adder groups 4304 and output the result. An adder group 4306 has two adders, which add corresponding components of the outputs of the two adjacent adder groups 4305 and output the result. An adder group 4307 has two adders, which add corresponding components of the outputs of the adjacent two adder groups 4306 and output the output data (including the real number component data and the imaginary number component data).

As described above, this matched filter performs filtering operation of 16 taps for the complex number input data Dr and Di, and performs complex number output. In the complex multiplication circuit 4302 and the like, complex multiplication is performed with the four multipliers and the two adders. Since the complex components are added separately, addition is made with the adder group 4304 as one addition unit, and the sum total of the complex multiplication results of 16 taps is outputted finally. Therefore, the resources used are 16 registers, 64 multipliers and 62 adders.

FIG. 45 shows a constitution example of the FFT 114 in FIG. 1B. As this FFT, the case of the FFT of the radix 2 with time thinning of 8 points is shown as an example. Input data a0, a1, . . . , a7 are complex data. Output data are A0, A1, . . . , A7. Wφ=exp((2π/N)×φ)) Here, N denotes the number of points, which is, for example, eight. Addition is executed at the points of intersection, and complex multiplication is performed at the points of Wφ. At the spots where the signs "−" exist, subtraction is executed.

At each of a first stage 4501, a second stage 4502 and a third stage 4503, four butterfly computations are performed. The butterfly computation is performed by a butterfly computing element shown in FIG. 44, and is the computation performed for two input data. For example, in the first butterfly computation at the first stage 4501, the operation (a0+a4)×1 and the operation (a0−a4)×1 are performed. The case without multiplication by the coefficient W is equivalent to the multiplication with the coefficient W=1. In the second butterfly computation at the first stage 4501, the operation (a2+a6)×W$^0$ and the operation (a2−a6)×W$^2$ are performed.

FIG. 44 shows a constitution example of a butterfly computing element 4400. As in FIG. 43A, a register 4401 outputs two input data D0 (=Dr0+jDi0) and D1 (=Dr1+jDi1) to the butterfly computing element 4400. The butterfly computing element 4400 receives a coefficient W (=Wr0+jWi0) other than the two input data D0 and D1, performs butterfly computation, and outputs output data D0_out and D1_out in the following expression. Here, (*) expresses complex conjugate.

$$D0\_out=D0+W(*)\times D1$$

$$D1\_out=D0-W(*)\times D1$$

Multipliers 4411 and 4415 multiply the real number component data Dr1 and the real number component coefficient Wr0, and output the result. Multipliers 4412 and 4416 multiply the imaginary number component data Di1 and the imaginary number component coefficient Wi0, and output the result. Multipliers 4413 and 4417 multiply the imaginary number component data Di1 and the real number component coefficient Wr0, and output the result. The multipliers 4414 and 4418 multiply the real number component data Dr1 and the imaginary number component coefficient Wi0, and output the result.

An adder 4421 gives a plus sign to the output of the multiplier 4411, gives a minus sign to the output of the multiplier 4412, adds both of them and outputs the result. An adder 4422 gives a plus sign to the output of the multiplier 4413, gives a plus sign to the output of the multiplier 4414, adds both of them and outputs the result. An adder 4423 gives a minus sign to the output of the multiplier 4415, gives a plus sign to the output of the multiplier 4416, adds both of them and outputs the result. An adder 4424 gives a plus sign to the output of the multiplier 4417, gives a plus sign to the output of the multiplier 4418, adds both of them and outputs the result.

An adder 4431 gives a plus sign to the real number component data Dr0, gives a plus sign to the output of the adder

4421, adds both of them, and outputs real number component data Dr0_out. An adder 4432 gives a plus sign to the imaginary number component data Di0, gives a plus sign to the output of the adder 4422, adds both of them, and outputs imaginary number component data Di0_out. An adder 4433 gives a plus sign to the real number component data Dr0, gives a plus sign to the output of the adder 4423, adds both of them, and outputs real number component data Dr1_out. An adder 4434 gives a plus sign to the imaginary number component data Di0, gives a minus sign to the output of the adder 4424, adds both of them, and outputs imaginary number component data Di1_out.

The first output data D0_out and the second output data D1_out are expressed by the following equations.

$$Do\_out = Dr0\_out + jDo0\_out$$
$$= Dr0 + Wr0 \times Dr1 + Wi0 \times Di1 + j \times (Di0 + Wr0 \times Di1 - Wi0 \times Dr1)$$
$$D1\_out = Dr1\_out + jDi1\_out$$
$$= Dr0 - Wr0 \times Dr1 - Wi0 \times Di1 + j \times (Di0 - Wr0 \times Di1 + Wi0 \times Dr1)$$

This butterfly computing element 4400 is constituted of eight multipliers and eight adders, and is capable of executing butterfly computation of the radix 2 once. The matched filter in FIG. 43 and the butterfly computing element in FIG. 44 are the same in the point that they use the elements such as registers, multipliers, and adders. The parameters differing between both of them are the coefficients used in multiplication, setting of the network information between the elements, and the codes at the time of addition. By providing such a structure on the circuit as makes it possible to reset these parameters, the matched filter computation and the butterfly computation can be performed in the same circuit. In this case, in consideration of using the resources used in the matched filter in FIG. 43 commonly with the butterfly computing element, two adders are added to the resources in FIG. 43, and thereby eight of the butterfly computing elements 4400 are constituted.

FIG. 46 shows a constitution example of a semi-fixed circuit capable of selectively realizing the matched filter and butterfly computation. As shown in FIG. 44, one butterfly computing element 4604 has eight multipliers and eight adders. Accordingly, eight butterfly computing elements 4604 have 64 multipliers and 64 adders. In contrast to this, as shown in FIG. 43, in the matched filter, 64 multipliers and 62 adders are used among them.

An input memory (register) 4601 receives 16 input data and output data of an output memory 4605 in accordance with a control of a memory control part 4611, and outputs to a selector 4602. The selector 4602 selects the input data in accordance with setting of a selector setting part 4612, and outputs the results to the butterfly computing elements 4604 in computing element part 4603. The computing element part 4603 has the eight butterfly computing elements 4604. A coefficient setting part 4613 inputs a coefficient W into the butterfly computing elements 4604 via the selector 4602 or directly. A sign setting part 4614 sets plus and minus signs to the butterfly computing elements 4604. The output memory 4605 also functions as a work memory, stores and outputs the operation results of the butterfly computing elements 4604.

In this embodiment, the case in which the complex component inputs are 64, namely, Fourier transform of 64 points is considered, and therefore 192 times of butterfly computation are needed, but when the computing element part 4603 having eight butterfly computing elements is used, they can be processed by loop of 192÷8=24 times. Matched filter can complete the processing by one time. It should be selected which processing is performed in advance, and the selection is reflected on the coefficient setting part 4613 for setting the coefficients, the selector setting part 4612 for setting wiring and the sign setting part 4614.

The amounts of resources of the butterfly computing element 4400 in FIG. 44 and the butterfly computing element 4604 in FIG. 46 are the same. Especially paying attention to the butterfly computing element 4604, the internal constitution thereof is shown in FIG. 47.

FIG. 47 shows a constitution example of the butterfly computing element 4604. The butterfly computing element 4604 is the circuit commonly used as the butterfly computing element and the matched filter. The butterfly computing element 4604 has complex multiplication circuits 4703 and 4704. The complex multiplication circuits 4703 and 4704 correspond to the complex multiplication circuits 4302 in FIGS. 43A and 4303 (FIG. 43B).

An input memory (register) 4702 and a memory control part 4701 correspond to the input memory 4601 and the memory control part 4611 in FIG. 46. The input memory 4702 outputs the input data Dr0, Di0, Dr1 and Di1 to the butterfly computing element 4604.

First, the complex multiplication circuit 4703 will be explained. A selector 4711 selects and outputs the real number component data Dr1 or Dr0. A selector 4712 selects and outputs the imaginary number component data Di1 or Di0. The multiplier 4311 multiplies the output of the selector 4711 and the coefficient Wr0 and outputs the result. The multiplier 4312 multiplies the output of the selector 4712 and the coefficient Wi0 and outputs the result. The multiplier 4313 multiplies the output of the selector 4711 and the coefficient Wi0 and outputs the result. The multiplier 4314 multiplies the output of the selector 4712 and the coefficient Wr0 and outputs the result.

A selector 4731 selects and outputs an output signal 4741 of the adder 4315 in the complex multiplication circuit 4704 or an output signal of the selector 4711. An adder 4721 gives a plus sign to the output of the selector 4731, gives a plus sign to the output of the adder 4315, adds both of them and outputs the result. A selector 4732 selects an output signal 4742 of the adder 4316 in the complex multiplication circuit 4704 or an output signal of the selector 4712 and output the result. An adder 4722 gives a plus sign to the output of the selector 4732, gives a plus sign to the output of the adder 4316, adds both of them and outputs the result.

Next, the complex multiplication circuit 4704 will be explained. A selector 4713 selects the real number component coefficient Wr0 or Wr1, and outputs the result. A selector 4714 selects the imaginary number component coefficient Wi0 or Wi1, and outputs the result. The multiplier 4311 multiplies the output of the selector 4713 and the real number component data Dr1, and outputs the result. The multiplier 4312 multiplies the output of the selector 4714 and the imaginary number component data Di1, and outputs the result. The multiplier 4313 multiplies the output of the selector 4714 and the real number component data Dr1, and outputs the result. The multiplier 4314 multiplies the output of the selector 4713 and the imaginary number component data Di1, and outputs the result.

A selector 4733 selects and outputs an output signal 4743 of the other adder group 4303 and the like in FIG. 43 or an output signal of the selector 4711. An adder 4723 gives a plus sign to an output of the selector 4733, gives a plus sign to the output of the adder 4315, adds both of them and outputs the result. A selector 4734 selects an output signal 4744 of the other adder group 4303 and the like in FIG. 43 or the output signal of the selector 4712, and outputs the result. An adder 4724 gives a plus sign to the output of the selector 4734, gives a plus sign to the output of the adder 4316, adds both of them, and outputs the result.

An output memory 4705 corresponds to the output memory 4605 in FIG. 46, and stores the output signals of the adders 4721 to 4724. At the time of butterfly computation, the signal of the output memory 4705 is fed back to the input memory 4702.

In the case of matched filter processing, the coefficients Wr0 and Wi0, and Wr1 and Wi1 are set first. The selectors 4731, 4732, 4733, 4734, 4711, 4712, 4713 and 4714 respectively select the signal 4741, the signal 4742, the signal 4743, the signal 4744, the data Dr0, the data Di0, the coefficient Wr1 and the coefficient Wi1. The sign setting part 4614 (FIG. 46) makes setting as shown in FIG. 47. After computation in the complex multiplication circuits 4703 and 4704, the complex outputs are only added by using the remaining adders 4721 to 4724 and the remaining butterfly computing element 4604 in the computing element part 4603 in FIG. 46. In the butterfly computing element 4604, four outputs of the complex multiplication circuits 4703 and 4704 are added by using the adders 4721 and 4722 (corresponding to the adder group 4304 in FIG. 43). The adders 4723 and 4724 are used for the other addition.

In the butterfly computation processing, each time the data is inputted into the input memory 4702, the coefficients Wr0 and Wi0 corresponding to the data are set in the coefficient setting. At the same time, the selectors 4731, 4732, 4733, 4734, 4711, 4712, 4713 and 4714 respectively select the output signal of the selector 4711, the output signal of the selector 4712, the output signal of the selector 4711, the output signal of the selector 47212, the data Dr1, the data Di1, the coefficient Wr0 and the coefficient Wi0. The sign setting part 4614 (FIG. 46) inverses the sign polarities of the two inputs to the adder 4315 in the complex multiplication circuit 4704 and the input signal 4742 of the adder 4724. Under the setting, the butterfly computation of the two complex number input data is performed in the butterfly computing element 4604, and writes the result to the output memory 4705. The above steps are repeated as necessary to perform loop processing.

The output signals of the adders 4721 and 4722 are outputted to the output memory 4705 at the time of butterfly computation, but at the time of matched filter operation, the output signals are not actually outputted to the output memory 4705, but are outputted to the adder group 4305 and the like (FIG. 43). At the time of the matched filter, the output signals are outputted to the adder group 4305 and the like, because the adders 4723 and 4724 to which the input data are not assigned can be assigned to the adder group 4305 and the like.

Further, as another embodiment, the present invention is applicable to complex multiplication (phase rotation) calculation which is a part of CCK (Complementary Code Keying) decode processing which the wireless LAN standard IEEE802.11b has by changing the sequence of the input data to the butterfly computing element 4604 by the memory control 4701.

Figure 48:
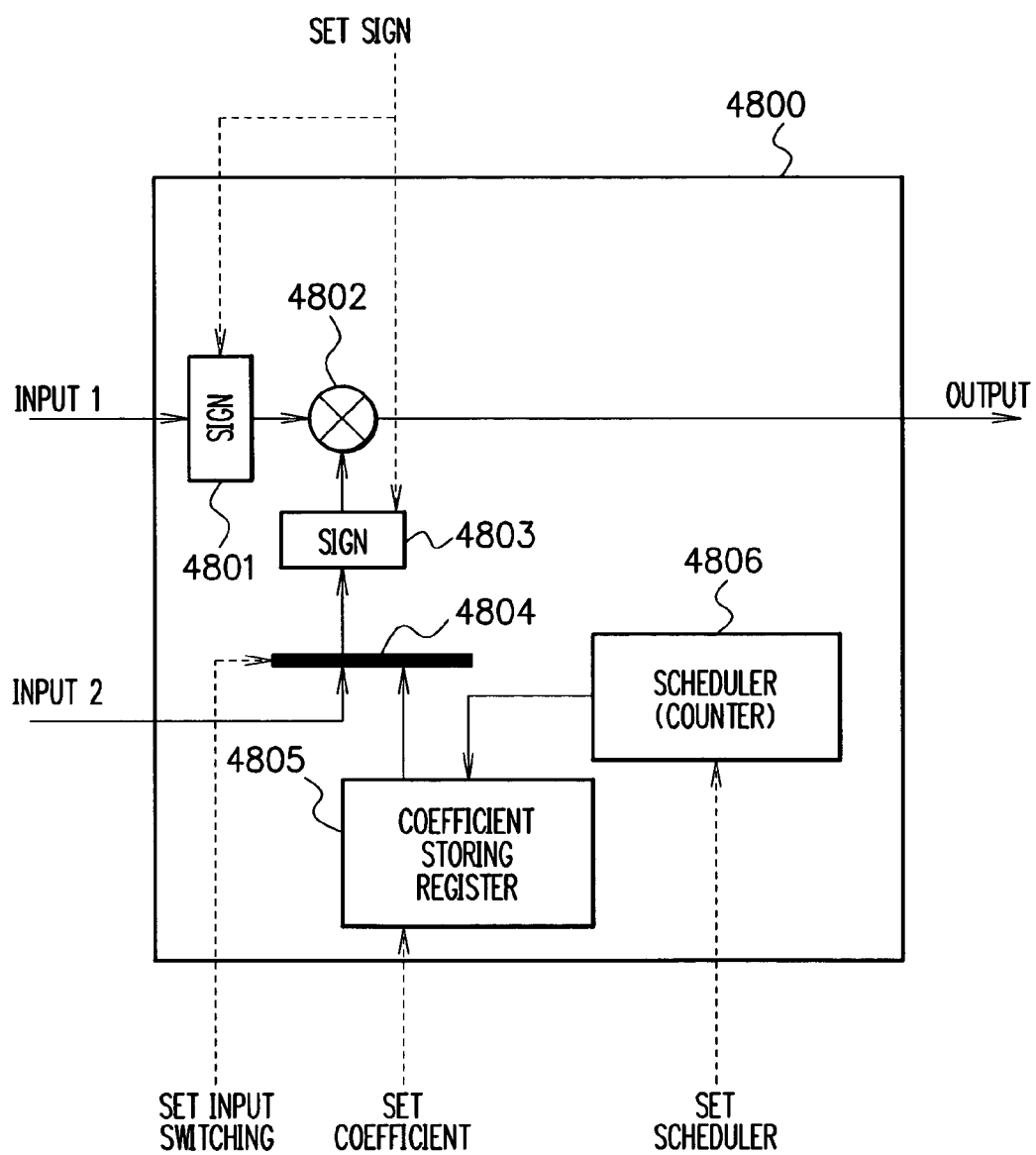
FIG. 48 is a diagram showing an internal constitution example of a multiplier in FIG. 47.

FIG. 48 is an example of an internal constitution of the adder in FIG. 47. This is characterized by newly adding an input switching selector 4804, a coefficient storing register 4805 and a scheduler (counter) 4806.

First, the coefficient setting part sets a constant at the coefficient storing register 4805 at the time of initial setting. The selector 4804 can select an input 2 from an outside or a register value in the coefficient storing register 4805 as an input, in accordance with the input switching setting signal. The scheduler 4806 is constituted of a counter, and supplies an address to the coefficient storing register 4805 in accordance with the scheduler setting signal. The address is a repeated output of the count with a fixed value or certain set number as the maximum. For example, if the number is set as 3, the address is as 0, 1, 2, 3, 0, 1, 2, . . . . This means that if the constant is set at the coefficient storing register 4805 first, the coefficient sets for 16 taps of the matched filter can be switched without exchanging the signal with the outside, and a plurality of matched filter computations are made possible at a high speed on the time axis. The coefficient storing register 4805 outputs the coefficient to the selector 4804 in accordance with the address.

In sign setting parts 4801 and 4803, a plus and minus signs are set corresponding to sign setting signals. A sign is set for an input 1 in the sign setting part 4801, and the input 1 is outputted to a multiplier 4802. A sign is set for the output signal of the selector 4804 in the sign setting part 4803, and the output signal is output to the multiplier 4802. The multiplier 4802 multiplies the output signals of the sign setting parts 4801 and 4803 and outputs the result. Without being limited to the case of the multiplier, adders may be controlled by the register 4805, the scheduler 4806 and the like.

As described above, the computing element resources such as the multipliers and adders are shared by the matched filter and the FFT, and therefore the scale of the circuit can be reduced as compared with the case having the resources separately.

Eleventh Embodiment

FIG. 49 shows an example of an entire constitution of an LSI including the semi-fixed circuits according to an eleventh embodiment of the present invention. The semi-fixed circuits are, for example, the semi-fixed circuits of the first to the tenth embodiments. An LSI 4900 has, for example, a CPU 4901, semi-fixed circuits 4904, fixed circuits 4906 and a RISC (DSP) 4908. Other than the CPU 4901, the semi-fixed circuits 4904 are connected via setting parts 4903, the fixed-circuits 4906 are connected via setting parts 4905, and the RISC 4908 is connected via a setting part 4907, to a setting bus 4902. The CPU 4901 can set or reset the setting parts 4903, 4905 and 4907.

The entire semi-fixed circuit 4904 is not constituted as the element of which function is fixed as the conventional hardware (fixed circuit) 4906, but the entire semi-fixed circuit is constituted by switching the function as necessary by rewriting the setting with software. Naturally, if the function is not necessary, the function is cut off from the entire circuit. For example, a plurality of functions may be used by time-division switching, or a plurality of functions may be set respectively in a plurality of semi-fixed circuits.

The CPU (for setting/resetting) 4901 receives a command from an outside corresponding to an upper layer, and transfers the circuit constitution setting information to LSI constitution element blocks such as the semi-fixed circuits 4904, the fixed circuits 4906 and the RISC 4908. The element blocks including the semi-fixed circuits 4904 each have a plurality of setting address spaces for one or more settings. Further, the element blocks perform setting/resetting of themselves referring to the circuit constitution setting information read out from the respective setting address spaces in accordance with the command from the CPU 4901.

As described above, according to the first to the eleventh embodiments, the different kinds of circuits with the same functions such as scramblers, descramblers or viterbi decoders can be realized with one semi-fixed circuit. The circuits with the different functions such as a matched filter and a butterfly circuit can be realized with one semi-fixed circuit. Simultaneous processing of a plurality of bits of a plurality of kinds of scramblers, descramblers, CRC circuits or the like can be realized with one semi-fixed circuit. As a result, the hardware resources can be commonly used, and therefore efficiency of use of the hardware resources can be enhanced. A plurality of circuits can be realized with one semi-fixed circuit.

The above-described embodiments are to be considered in all respects as illustrative and no restrictive, and all changes which come within the meaning and range of equivalency of the claims are therefore intended to be embraced therein. The invention may be embodied in other specific forms without departing from the spirit or essential characteristics thereof.

What is claimed is:

1. A semi-fixed circuit capable of operations of a matched filter and a butterfly computation circuit, comprising:
   a shift register;
   a plurality of multipliers performing multiplication;
   a plurality of adders performing addition; and
   a connection circuit controlling connection of said shift register, said plurality of multipliers and said plurality of adders;
   wherein the operations of the matched filter and the butterfly computation circuit are possible in accordance with the connection of said connection circuit.

2. The semi-fixed circuit according to claim 1,
   wherein operations of the matched filter and a fast Fourier transform circuit are possible in accordance with the connection of said connection circuit.

3. The semi-fixed circuit according to claim 1, further comprising:
   a memory storing data to be given as input for said multipliers or said adders; and
   a schedule circuit controlling sequence of inputting the data in said memory into said multipliers or said adders.

* * * * *